United States Patent [19]
Oku et al.

[11] Patent Number: 6,013,926
[45] Date of Patent: Jan. 11, 2000

[54] SEMICONDUCTOR DEVICE WITH REFRACTORY METAL ELEMENT

[75] Inventors: Tomoki Oku; Naohito Yoshida; Shinichi Miyakuni; Toshihiko Shiga, all of Tokyo, Japan

[73] Assignee: Mitsubishi Denki Kabushiki Kaisha, Tokyo, Japan

[21] Appl. No.: 08/837,458

[22] Filed: Apr. 18, 1997

[30] Foreign Application Priority Data

Nov. 20, 1996  [JP]  Japan .................................... 8-309168

[51] Int. Cl.[7] ...................... H01L 29/80; H01L 31/0328; H01L 31/112
[52] U.S. Cl. .......................... 257/284; 257/192; 257/280; 257/282; 257/283
[58] Field of Search ...................... 257/194, 192, 257/280, 282, 283, 284, 296, 309, 416, 277; 310/367, 371

[56] References Cited

U.S. PATENT DOCUMENTS

| | | | |
|---|---|---|---|
| 4,257,020 | 3/1981 | Besson | 310/371 |
| 5,141,891 | 8/1992 | Arima et al. | 437/44 |
| 5,341,007 | 8/1994 | Kuwata | 257/194 |
| 5,548,139 | 8/1996 | Ando | 257/284 |
| 5,742,082 | 4/1998 | Tehrani et al. | 257/280 |
| 5,786,610 | 7/1998 | Nakanishi | 257/283 |
| 5,888,859 | 3/1999 | Oku et al. | 438/174 |

FOREIGN PATENT DOCUMENTS 63-204650  8/1988  Japan .................................... 257/284

OTHER PUBLICATIONS

Sasaki et al., "Reliability of AlInAs/InGaAs/InP HEMT Ohmic Contacts", IPRM, 1995, pp. 745–748.

Nguyen et al., "50-nm Self-Aligned-Gate Pseudomorphic AlInAs/GaInAs High Electron Mobility Transistors", IEEE Transactions on Electron Devices, vol. 39, No. 9, 1992, pp. 2007–2014.

*Primary Examiner*—Steven H. Loke
*Attorney, Agent, or Firm*—Leydig, Voit & Mayer Ltd

[57] ABSTRACT

A semiconductor device includes a self-aligned refractory metal constituent in a recess in a semiconductor substrate and having the same plane pattern as a bottom surface of the recess. The width of the constituent is determined by the plane pattern of the recess and, accordingly, the pattern width of the constituent is easily controlled by the plane pattern of the recess.

5 Claims, 33 Drawing Sheets

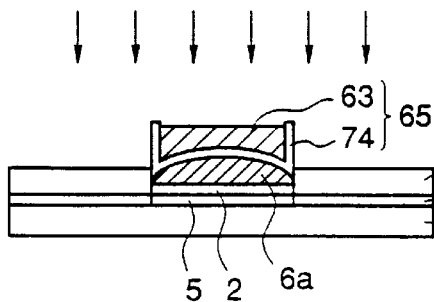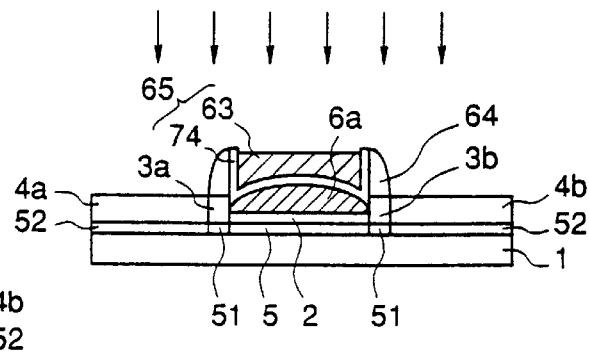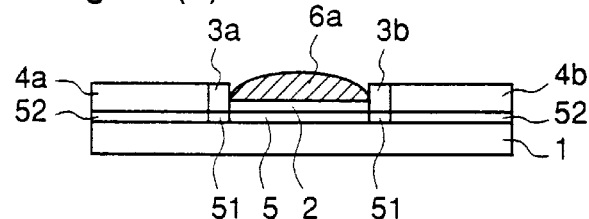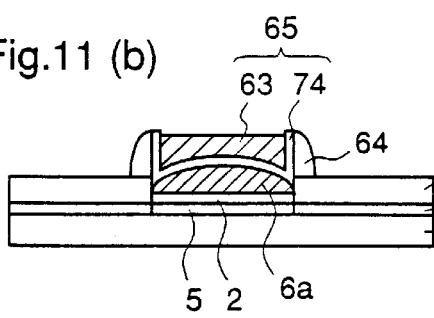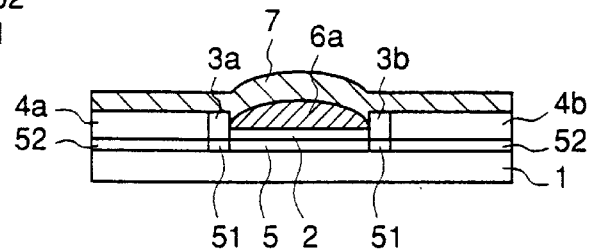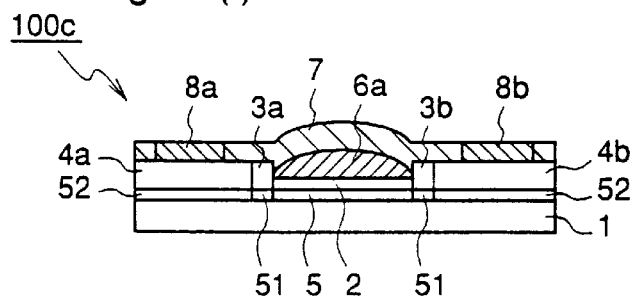

SEMICONDUCTOR DEVICE WITH REFRACTORY METAL ELEMENT

FIELD OF THE INVENTION

The present invention relates to a semiconductor device and a method of fabricating the device and, more particularly, to structures of a field effect transistor (FET), a high electron mobility transistor (HEMT), an MIM capacitor, and a film bulk acoustic wave resonator (FBAR) mounted in a compound semiconductor monolithic IC, and a method of fabricating these elements.

BACKGROUND OF THE INVENTION

Compound semiconductor monolithic ICs, such as GaAs MMICs (monolithic microwave integrated circuits), are devices made of a compound semiconductor material that has electron transport properties employed most effectively for realizing high speed FET elements mounted in the ICs. Thus, compound semiconductor MMICs are intended for integrated circuits used in satellites, mobile telephones, and milliwave integrated circuits or the like. Further, in recent years, compound semiconductor MMICs have been in high demand because of the development of mobile radios.

Since MMICs are applicable to high power amplifiers mobile radios or satellites, in addition to improvement of high frequency properties of transistors, they must endure heat generated by the transistor itself and prolonged use under severe circumstances. Therefore, extremely high reliability is generally demanded of the MMICs. Especially in gate, source, and drain electrodes which determine reliability of an FET, a Schottky, or an ohmic junction with the compound semiconductor is employed. Therefore, in order to improve reliability, a solid phase reaction between a metal and a semiconductor should be suppressed satisfactorily.

Generally, a refractory metal is employed for a gate electrode to improve a heat resistance. For example, a field effect transistor with a self-aligned refractory metal electrode has a planar element structure. The planar field effect transistor is unstable in operation and has a low breakdown voltage, and excess current flows in the vicinity of a GaAs surface when employed in a high power amplifier. Therefore, the planar field effect transistor is exclusively employed as a switching element or a low noise amplifier. However, both high power and low price are demanded of a transistor used in a portable telephone, so that such a transistor has the planar FET structure.

In order to obtain superior high power properties that the planar field effect transistor cannot achieve, an element structure in which a recess or a well is formed in a compound semiconductor substrate and in the center of which the refractory metal gate is disposed, is effective. In this element structure, no excess current flows in the vicinity of the substrate surface, so that a transistor with this element structure is employed as a circuit element of a high power amplifier.

However, an expensive substrate is required to realize this structure. The structure is not suitable for a transistor especially used in a portable telephone requiring a low price. Accordingly, in many cases, the structure applies to a high power amplifier in equipment for a satellite in which, generally, a low price is not demanded.

It is impossible to realize a high power device with improved high power properties usable in a microwave band and also in a milliwave band using GaAs series semiconductor elements. At present, companies and research institutes are keenly competing with each other. Of the possible semiconductor elements that can realize such a high frequency and high power device, an InP series HEMT that uses InGaAs, having an electron mobility twice as high as that of GaAs, is the most promising. An InP series HEMT is supposed to be realized shortly.

However, in InGaAs and AlInAs constituting an InP HEMT, a noticeable solid phase reaction between a metal material and the InP is observed and reliability is poor, so that a refractory metal must be used for the source and drain electrodes as well as the gate electrode. Accordingly, it is difficult to fabricate an HEMT with source and drain electrodes made of such a refractory metal, and such an HEMT has yet to be realized.

Further, low cost and high performance are demanded of other circuit elements as well as transistors. Therefore, its capacitors and filters must also be miniaturized.

A capacitor according to the present invention referred to as an MIM (metal-insulator-metal) has a dielectric thin film sandwiched between metal regions. The capacitor is used for an impedance matching circuit, a filter for RF blocking (high-pass filter) and DC blocking in the MMIC.

A filter according to the present invention referred to as a film bulk acoustic wave resonator has the same structure as the MIM capacitor and differs from the capacitor in that a piezoelectric film is employed between metal regions. The filter is located in a rear stage of a mixer in a circuit and prevents propagation of radio waves other than at a predetermined frequency. There is a need for reducing power loss in the filter to improve efficiency. In particular, since the film bulk acoustic wave resonator is used at a frequency of 2 GHz or more, it is an essential element in a portable telephone.

Under the circumstances, in order to realize a cheap high power amplifier, the inventors of the present invention have developed a semiconductor device wherein the refractory metal gate electrode is disposed self-alignedly in the center of the bottom portion of the recess and a self-aligning process, such as an ion implantation process, is employed for formation of source and drain regions (see Japanese Patent Application Nos. Hei. 6-154717 and Hei. 7-66094). A description of that semiconductor device and a method of fabricating it follows.

FIG. 29(e) is a cross-sectional view illustrating a semiconductor device disclosed in Japanese Patent Application No. Hei. 6-154717. In the figure, reference numeral 201 designates a self-aligned FET (hereinafter referred to as an SAGFET) having a conventional recess gate structure. The gate electrode 16a is formed self-alignedly in a recess 1a of a substrate surface. The recess 1a is formed in the surface of the compound semiconductor substrate 1 of the FET 201. In the center of the bottom portion of the recess 1a, a refractory metal gate electrode 16a made of a refractory metal is disposed as a Schottky electrode. Immediately under the gate electrode of the semiconductor substrate 1, an n diffusion region 2 is formed. At both sides of the n diffusion region 2 at the bottom of the recess 1a, low-concentration diffusion regions (n' diffusion regions) 3a, 3b are formed. Under the n diffusion region 2 and the n' diffusion regions 3a, 3b, of the semiconductor substrate 1, a p diffusion region 5 is formed.

At both sides of the recess 1a of the semiconductor substrate 1, $n^+$ diffusion regions 4a, 4b are formed as source and drain regions. An entire surface on the substrate is covered by an insulating film 17. On the $n^+$ diffusion regions 4a, 4b, of the insulating film 17, openings 17a, 17b are formed spaced apart from an edge of the recess 1a by a prescribed distance. In the openings of the insulating film, source and drain electrodes 8a, 8b are disposed as ohmic electrodes.

As described above, the refractory metal gate electrode 16a is located in the center of the recess 1a and has a planar surface. A distance between the gate electrode 16a and the n⁺ source diffusion region 4a is equal to a distance between the gate electrode 16a and the drain diffusion region 4b. The n diffusion region 2 is present only immediately under the refractory metal gate electrode 16a and serves as a channel region. The n⁺ diffusion regions 3a, 3b are present only at the bottom of the recess 1a except for the n diffusion region 2. The n⁺ diffusion regions 4a, 4b are present outside the recess 1a, and have a thickness larger than those of the n diffusion region 2, and the n' diffusion regions 3a, 3b. Bottoms of the n⁺ diffusion regions 4a, 4b are coplanar with a boundary between the n diffusion region 2 and the n' diffusion regions 3a, 3b, and the p diffusion region 5.

A description will be given of a fabrication method. FIGS. 27(a)–27(f), FIGS. 28(a)–(28e) and FIGS. 29(a)–29(e) illustrate a fabrication method of the SAGFET 201. As illustrated in FIG. 27(a), SiO₂ is deposited over the compound semiconductor substrate 1 to a thickness of about 3000 Å to form an insulating film 41. Thereafter, a resist 42 having a prescribed pattern opening 42a is formed.

As illustrated in FIG. 27(b), the insulating film 41 is selectively etched using the resist 42 as a mask to form an opening 41a. In this case, RIE (Reactive Ion Etching) is employed, which is easy of etching perpendicular to the substrate surface.

As illustrated in FIG. 27(c), after removal of the resist 42, dry etching of the compound semiconductor substrate 1 by Cl₂ is performed using the insulating film 41 as a mask, to form the recess 1a having about 500 Å thickness. Alternatively, the recess 1a may be formed by wet etching using an aqueous solution of tartaric acid and hydrogen peroxide mixed in a ratio of 50:1. As described above, after removal of the resist 42, the recess 1a is formed. Alternatively, the recess 1a may be formed before removal of the resist 42.

As illustrated in FIG. 27(d), an ion implantation using the insulating film 41 as a mask is performed to form the n diffusion region 2 at the bottom of the recess 1a and the p diffusion region 5 under the same. At this time, although ions are also implanted into the insulating film 41 used as a mask, the concentration is about $10^{17}$ cm$^{-3}$, so that the composition of the insulating film 41 is hardly changed. In this ion implantation, Si ions are employed for formation of the n diffusion region 2 and Mg ions are employed for formation of the p diffusion region 5. The Si ions are implanted at an accelerating energy of 60 KeV and a dose of about $7 \times 10^{12}$ cm$^{-2}$. The Mg ions are implanted at an accelerating energy of 300 KeV and a dose of about $5 \times 10^{12}$ cm$^{-2}$.

Since implanted depth of the ions is about 1000 Å in case of the Mg ions implanted at a high accelerating energy, the insulating film 41 comprising SiO₂ film 3000 Å thick sufficiently serves as a mask for the ion implantation.

As illustrated in FIG. 27(e), a refractory metal thin film 16 is deposited over the entire surface. At this time, it is important that no discontinuity of the refractory metal thin film 16 occurs in the upper portion of the opening of the recess 1a. As a material of the refractory metal thin film 16, WSi, WSiN, WN, TiW, or the like is employed. The thickness of the refractory metal thin film 16 and width of the coverage of the refractory metal thin film 16 on the step part at both sides of the recess 1a (dimension in gate length direction) determines widths of the n' diffusion region 3a, 3b and the gate length.

For example, when the width of the coverage is 0.25 μm and the opening width of the recess is 1.0 μm, the gate length becomes 0.5 μm. As a method of depositing the refractory metal thin film 16, sputter deposition or blanket CVD is employed. The sputter deposition provides an arched-top gate electrode. The blanket CVD provides a flat-top gate electrode.

As illustrated in FIG. 27(f), a second resist 45 is formed on the refractory metal thin film 16. The second resist 45 is applied to a thickness of 1 μm sufficient to make the recess 16b of the refractory metal thin film 16 corresponding to the recess 1a flat. A material resistant to RIE is used for the second resist 45.

Thereafter, as illustrated in FIG. 28(a), the second resist 45 is etched using an etching technique that provides a high uniformity across a wafer, such as O₂ ashing. The etching is stopped when the refractory metal thin film 16 is exposed. Since the ratio of the second resist 45 filling the recess 16b of the refractory metal thin film 16 to the entire surface of the wafer is small, light emission from CO is suddenly reduced when the refractory metal thin film 16 is exposed. Therefore, if the light emission from CO is monitored during the etching, the etching is stopped upon detection of sudden reduction of the light emission from CO when the refractory metal thin film 16 is exposed, leaving the resist 45a with high controllability.

As illustrated in FIG. 28(b), using the resist 45a as a mask, the refractory metal thin film 16 is etched. An etching technique that hardly damages or etches the n diffusion region 2, such as plasma etching or ECR etching, is employed. As an etching gas, SF₆ or CF₄+O₂ is employed. The etching is stopped after over-etching for about several tens of seconds (3000 Å in terms of film thickness) from the point (end point) when the insulating film 41 is exposed. The end point of the etching is easily detected by monitoring light emission from F radicals or light emission from SiF.

As illustrated in FIG. 28(c), after removal of the second resist 45a, Si ions are implanted to form n' diffusion regions 3a, 3b. The Si ions are implanted at an accelerating energy of 60 KeV as in the ion implantation for the n diffusion region 2 so that the bottom of the n' diffusion region 3 is coplanar with the bottom of the n diffusion region 2. The dose depends on the desired breakdown voltage and transconductance of elements.

As illustrated in FIG. 28(d), a third resist 47 is formed. The thickness of the third resist 47 is about 1 μm, sufficient to bury the recess opening and the refractory metal gate electrode 16a.

As illustrated in FIG. 28(e), the third resist 47 is etched by O₂ ashing, and the etching is stopped when the insulating film 41 is exposed. The principle and the method for detecting the end point of the etching are identical to those already described for the etching of the second resist 45. In order to avoid unwanted mixing of a resist masking a region of the substrate where the FET is not formed with the resist 47a left in the recess 1a in a subsequent ion implantation process for formation of the n⁺ diffusion regions 4a, 4b, the resist 47a must be reformed by deep UV curing.

Thereafter, as illustrated in FIG. 29(a), the insulating film 41 is removed. The removal of the insulating film 41 is performed with buffered hydrofluoric acid (HF:NH₄F= 30:1). It is important that the refractory metal gate electrode 16a, the third resist 47a and the compound semiconductor substrate 1 are not damaged and no residue is left.

As illustrated in FIG. 29(b), using the refractory metal gate 16a and the resist 47a as masks, Si ions are implanted to form $n^+$ diffusion regions 4a, 4b. A region on the substrate where the FET is not formed is masked with a resist (not shown). The energy of the ion implantation is set at 60–70 KeV so that the resist 47a can mask the Si ions and, preferably, the bottoms of the $n^+$ diffusion regions 4a, 4b are coplanar with the bottoms of the n diffusion region 2 and the n' diffusion regions 3a, 3b. The dose is about $5\times10^{13}$ cm$^{-2}$.

As illustrated in FIG. 29(c), after removal of the third resist 47a, ion-implanted regions are activated by annealing. The annealing is performed at about 800° C. for about 30 minutes in an ambient including As.

As illustrated in FIG. 29(d), an insulating 17 for passivation is deposited over the entire surface. Preferably, the insulating film 17 has a stress of $1\times10^9$ dyn/cm$^2$ or less between the substrate and the same to suppress the short channel effect. For example, an SiON film formed by plasma CVD is employed as the insulating film.

Finally, a resist (not shown) having openings corresponding to regions where source and drain electrodes are to be formed is formed on the insulating film 17. Using the resist as a mask, the insulating film 17 is etched to form openings 17a, 17b therein. Thereafter, ohmic metals, i.e., source and drain electrodes 8a, 8b are formed in the openings of the insulating film using the evaporation and lift-off technique, followed by sintering, whereby an FET 201 is completed.

The source and drain electrodes 8a, 8b have a structure in which an AuGe based alloy is laminated on an Ni region to reduce contact resistance.

As illustrated in FIG. 29(e), a top surface of the refractory metal gate 16a of the completed FET is smooth and flat.

In this FET 201, since the refractory metal gate electrode 16a is disposed in the center of the bottom portion of the recess, a high power transistor is obtained. Further, since the source and drain regions 4a, 4b are formed self-alignedly with respect to the gate electrode 16a, by ion implantation, inexpensive elements are obtained because fabrication process is simplified. However, channel current tends to be adversely affected by a trap produced at an interface between the n' diffusion regions 3a, 3b beside the gate electrode and the insulating film 17. In addition, it is difficult to control widths (dimension in gate length direction) of the n' diffusion regions 3a, 3b.

Further, the p diffusion region 5, the n diffusion region 2, and the n' diffusion regions 3a, 3b, which are different in concentration, are provided in common. Therefore, optimization of the p diffusion region 5, i.e., optimization of positioning boundaries between the n diffusion region 2 and the p diffusion region 5, and the n' diffusion regions 3a, 3b and the p diffusion region 5 cannot be achieved. As a result, improvement of high frequency properties does not coexist with suppression of the short channel effect.

The inventors have invented an improved FET that has overcome the problems described above. A description of the improved FET follows (see Japanese Patent application No. Hei 7-66094).

FIG. 33(d) is a cross-sectional view illustrating a semiconductor device described in Japanese Patent application No. 7-66094). In the figure, numeral 202 designates the improved FET having a conventional recess gate structure. In a surface of a compound semiconductor substrate 1, a recess 1a is formed and in the center of the recess 1a, a recess 1b is formed. In the recess 1b in the center of the bottom portion of the recess 1a, a refractory metal gate electrode 26a made of a refractory metal material and having a T-shaped cross section is disposed as a Schottky electrode. In the lower portion of the gate electrode of the semiconductor substrate 1, an n diffusion region 2 is formed as a channel region. At both sides of the recess 1b at the bottom of the recess 1a, n' diffusion regions 3a, 3b are formed as low-concentration source and drain regions.

As in the FET 201, at both sides of the recess 1a of the semiconductor substrate 1, $n^+$ diffusion regions 4a, 4b are formed as high-concentration source and drain regions. Surfaces of the diffusion regions 4a, 4b, an inner surface of the recess 1a and a surface of the gate electrode 26a are covered by an insulating film 27 for passivation.

On the $n^+$ diffusion regions 4a, 4b in the insulating film 27, spaced apart from an edge of the recess 1a by a prescribed distance, openings 27a, 27b are formed. In the openings of the insulating film, source and drain electrodes 8a, 8b are disposed as ohmic electrodes.

A distance between a source-side bottom of the refractory gate electrode 26a and the $n^+$ source diffusion region 4a is equal to a distance between a drain-side bottom of the gate electrode 26a and the $n^+$ drain diffusion region 4b. The n diffusion region 2 serving as a channel region is present only immediately under the refractory metal gate electrode 26a. The n' diffusion regions 3a, 3b are present only at the bottom of the recess 1a except for the n diffusion region 2. The $n^+$ diffusion regions 4a, 4b are present outside the recess. The thickness of the $n^+$ diffusion regions 4a, 4b is larger than those of the n diffusion region 2 and the n' diffusion regions 3a, 3b.

In the improved FET 202 having such a structure, the refractory metal gate electrode 26a is located in the center of the recess 1b which has one more step in the recess 1a, so that channel current is hardly affected by a depletion region present at an interface between the n' diffusion region 3a, 3b and the insulating film 27. Since a carrier trap is produced at the interface between the n' diffusion regions 3a, 3b and the insulating film 27, the fact that the channel current is hardly affected by the depletion region means that the charge and discharge time of carriers in the trap does not determine the response speed of the FET. That is, transconductance gm and an operation speed of the FET are not reduced.

A description will be given of a fabrication method of the improved FET 202. FIGS. 30(a)–30(b), FIGS. 31(a)–31(d), FIGS. 32(a)–32(d), and FIGS. 33(a)–33(d) are views illustrating a fabrication method of the SAGFET 202. As illustrated in FIG. 30(a), the insulating film 41 is deposited to a thickness of about 4000 Å on the compound semiconductor substrate 1 to form a resist 42 having a prescribed pattern opening 42a thereon.

As illustrated in FIG. 30(b), using the resist 42 as a mask, the insulating film 41 is etched to form the opening 41a therein. An SiO$_2$ film is employed as the insulating film 41. The insulating film 41 is etched by RIE which easily etches perpendicular to the substrate surface.

As illustrated in FIG. 30(c), after removal of the resist film 42, using the insulating film 41 as a mask, the compound semiconductor substrate 1 is etched to form the recess 1a about 500 Å deep in the substrate 1. At this time, the recess 1a may be formed before removal of the resist 42. For the recess etching in the compound semiconductor substrate 1, wet etching using an aqueous solution of tartaric acid and hydrogen peroxide mixed in a ratio of 50:1 or dry etching using Cl$_2$ is employed. FIG. 30(c) illustrates a recess 1a, which is formed by the etching perpendicular to a substrate surface using the dry etching.

As illustrated in FIG. 30(d), the insulating film 43 is deposited over the entire surface. At this time, it is important that no discontinuity of the insulating film 43 occurs in the opening of the recess 1a. SiN or the like is used as a material of the insulating film 43. The width of the coverage of the insulating film 43 on the step part in the recess opening end, and the thickness of the insulating film 43 determine the widths of the n' diffusion regions 3a, 3b and the gate length. For example, if the width of the coverage is 0.25 μm and the width of the recess opening (dimension in gate length direction) is 1.0 μm, the gate length becomes 0.5 μm. As a method of depositing the insulating film 43, plasma CVD or blanket CVD is employed. The former provides an arched-top recess of the insulating film 43. The latter provides a flat-top recess.

As illustrated in FIG. 30(e), a second resist 45 is deposited over the entire surface. At this time, application of the resist 45 is performed so that the film thickness thereof can make the recess 43b of the insulating film 43 sufficiently even. For example, the second resist 45 is resistant to RIE, and is applied to about 1 μm thickness.

Thereafter, as illustrated in FIG. 31(a), the second resist 45 is etched using an etching technique that provides a high uniformity across a wafer, such as $O_2$ ashing. The etching is stopped when the insulating film 43 is exposed. Since the ratio of the resist 45a filling the recess 43b of the insulating film 43 to the entire surface of the wafer is small, if light emission from CO is monitored during the etching, sudden reduction of the light emission from CO is detected when the insulating film 43 is exposed. Therefore, the etching is stopped by detecting reduction of the light emission from CO, whereby the resist 45a is left in the recess 43b of the insulating film 43 with high controllability.

As illustrated in FIG. 31(b), the insulating film 43 is etched using the second resist 45 as a mask. Preferably, an etching technique that hardly damages or etches a GaAs surface, such as plasma etching or ECR etching, is employed. The etching is stopped when the insulating film 43 is exposed. As a result, a dummy gate 43a is formed of the insulating film 43. The end point of the etching can be easily detected by monitoring the light emission from F radical or from SiF.

As illustrated in FIG. 31(c), after removal of the second resist 45a, Si ions are implanted to form n' diffusion regions 3a, 3b. The energy of ion implantation is set at 60 KeV so that the thickness of the n' diffusion regions 3a, 3b becomes about 1000 Å. The dose depends on the breakdown voltage and transconductance of the element.

As illustrated in FIG. 31(d), a third resist 47 is applied over the entire surface. The thickness of the resist 47 is about 1 μm, enough to bury the recess opening and the dummy gate 43a formed of the insulating film 43.

Then, as illustrated in FIG. 32(a), the third resist 47 is etched by $O_2$ ashing, and the etching is stopped when the insulating film 41 is exposed. The principle and the method for detecting the end point of the etching are identical to those already described for the etching of the second resist 45. In order to avoid unwanted mixing of a resist masking a region on the substrate where the FET is not fabricated with the third resist 47a buried at both sides of the dummy gate 43a formed of the insulating film, in a subsequent ion implantation process for making $n^+$ diffusion regions 4a, 4b, the resist 47a must be reformed by deep UV curing.

As illustrated in FIG. 32(b), the dummy gate 43a is removed. As an etching technique, plasma etching using an etching gas such as $SF_6$, $NF_3$ is employed. At this time, when using an SiO film as the insulating film 41 and an SiN film as the insulating film 43, the etching rates of the resist 47 and the SiO film are 100 Å/min. and the etching rate of the SiN film is 200 Å/min. so that only the dummy gate 43a comprising the SiN film is selectively etched. In addition, the substrate where the dummy gate is removed is etched.

As in formation of the recess 1a in the compound semiconductor substrate 1, for the etching in this case, wet etching using an aqueous solution of tartaric acid and hydrogen peroxide mixed in a ratio of 50:1 or dry etching using $Cl_2$ is employed. However, in order to keep the refractory metal gate electrode 26a from contacting the n' diffusion regions 3a, 3b, the former is more preferable. When using the dry etching using $Cl_2$, as long as it is an isotropic etching, the refractory metal gate electrode 26a is kept from contacting the n' diffusion regions, 3a, 3b. Keeping the refractory metal gate electrode 26a from contacting the n' diffusion regions 3a, 3b is effective in increasing the gate breakdown voltage of the FET.

As illustrated in FIG. 32(c), Si ions are implanted to form the n diffusion region 2. The energy of ion implantation is set at 60 KeV so that the thickness of the n diffusion regions becomes 1000 Å. The dose depends on the desired pinch-off voltage.

As illustrated in FIG. 32(d), the refractory metal thin film 26 is deposited over the entire surface. In this case, as a material of the refractory metal thin film 26, WSi, WSiN, WN, Ti, or the like is employed, and the refractory metal thin film 26 has some thickness so that no discontinuity occurs in the recess.

Thereafter, as illustrated in FIG. 33(a), a resist 48 which has a pattern corresponding to a gate pattern is formed. Using the resist 48 as a mask, the refractory metal thin film 26 is etched. As an etching technique, RIE is employed, which is easily etched perpendicular to the substrate surface, and $CF_4+O_2$ is employed as an etching gas. The etching is stopped after over etching about several tens of seconds (about 3000 Å in terms of film thickness), from the end point when the insulating film 41 is exposed. At this time, the end point can be detected with ease by monitoring light emission from SiF.

The insulating film 41 is letched with buffered hydrofluoric acid ($HF:NH_4F=30:1$). At this time, it is important that the refractory metal gate electrode 26a, the third resist 47a and the compound semiconductor substrate 1 are not damaged and no residue is left. In order to avoid unwanted mixing of the resist 48 with the resist 47 buried at both sides of the dummy gate and the resist masking a region on the substrate where the FET is not fabricated, in a subsequent ion implantation process for formation of the $n^+$ diffusion region, the resist 48 must be reformed by deep UV curing.

As illustrated in FIG. 33(b), using the refractory metal gate electrode 26a, the resist 47a and the resist 48 as masks, Si ions are implanted to form the $n^+$ diffusion regions 4a, 4b. A region on the substrate where the FET is not present is masked with a resist (not shown). The energy of the Si ion implantation is about 150 KeV, and it is desired that the bottoms of the $n^+$ diffusion regions 4a, 4b be coplanar with those of the n diffusion region 2 and the n' diffusion regions 3a, 3b. The dose is about $5 \times 10^{13}$ $cm^{-2}$.

As illustrated in FIG. 33(c), after removal of the third resist 47a and the resist 48, the ion-implanted regions are activated by annealing. The annealing of the substrate is performed at about 800° C. for about 30 minutes in an ambient including As, by heating.

As illustrated in FIG. 33(d), the insulating film 27 for passivation is deposited. The insulating film 27 must have a stress of $1 \times 10^9$ $dyn/cm^2$ or less between the substrate and the same to suppress the short channel effect due to a stress applied to the substrate. For example, SiON film or the like formed by plasma CVD is employed as the insulating film 27.

Finally, the insulating film 27 is etched using a resist film which has openings corresponding to regions where the source and drain electrodes are to be formed, as a mask, to form openings 27a, 27b of the insulating film. Thereafter, ohmic metals, i.e., source and drain electrodes 8a, 8b are formed using the evaporation and lift-off technique, followed by sintering, whereby an FET 202 is completed. The source and drain electrodes 8a, 8b have a structure in which an AuGe based alloy is laminated on an Ni region to reduce a contact resistance.

The FET 202 fabricated using the above-described method has the following advantages. First, since the dummy gate 43a is used, the thickness of the gate electrode 26a and the widths of the n' diffusion regions 3a, 3b are determined independently. In the method illustrated in FIGS. 27–29, in order to increase the widths of the n' diffusion regions 3a, 3b, the refractory metal thin film 16 must be thickened, so that the gate electrode 16a of the FET is made thicker. This means that the effect on the FET properties due to a stress applied to the substrate by the gate electrode 16a (gate stress) or process shape of the gate electrode is varied in accordance with the variations of the widths of the n' diffusion regions 3a, 3b, leading to unstable device properties.

In the FET 202 fabricated using the method illustrated in FIGS. 30–33, since the widths of the n' diffusion regions 3a, 3b are set by the dummy gate 43a, the film thickness of the gate electrode 26a and widths of the n' diffusion regions 3a, 3b are determined independently. This means that the effect on FET properties due to the gate stress and process shape is not varied depending on the widths of the n' diffusion regions 3a, 3b, whereby stable transistor properties are not adversely affected.

Secondly, since the implantation energy for formation of the n$^+$ diffusion regions 4a, 4b is increased, the bottoms of the n$^+$ diffusion regions 4a, 4b are coplanar with the bottoms of the n diffusion region 2 and n' diffusion regions 3a, 3b. In the method illustrated in FIGS. 27–29, the energy of the ion implantation is set at 60–70 KeV for masking of the implanted ions by the resist 47, so that the bottoms of the n$^+$ diffusion regions 4a, 4b are not coplanar with the bottoms of the n diffusion region 2 and the n' diffusion regions 3a, 3b. This causes an increase in a resistance between the gate and the channel and between the gate and the drain and a reduction of transconductance gm.

On the other hand, in the FET 202 fabricated using the method illustrated in FIGS. 30–33, the resist 47a, the resist 48 and the refractory metal thin film 26a can prevent implanted ions and the bottoms of the n$^+$ diffusion regions 4a, 4b are coplanar with the bottoms of the n diffusion regions 2 and the n' diffusion regions 3a, 3b at a high energy of 150 KeV. In this case, the resistances between the gate and the source, and the gate and drain can be reduced to the limit, so that the maximum transconductance gm can be obtained. The gate electrode is buried in the recess of the substrate surface as described above. This means that there is no current in excess in the substrate surface.

In this method, the ion implantation process for formation of the n diffusion region 2 as a channel region, the n' source and drain diffusion regions 3a, 3b is performed independently. The p type diffusion region can be optimized, since in the ion implantation process for formation of the n diffusion region ions are implanted for formation of the p diffusion region under the n diffusion region, and in the ion implantation process for formation of the n' diffusion regions 3a, 3b, ions are implanted for formation of the p' diffusion region 51 under the n' diffusion region 3a, 3b.

In Japanese Patent Application No. Hei. 7-66094, structures of recess type SAGFETs and a method of fabricating the SAGFETS are described, wherein the p diffusion region is present only under the n diffusion region 2 and the n' diffusion regions 3a, 3b, or the p' diffusion region is present only under the n' diffusion regions 3a, 3b, which will not be described herein.

A description is given of an InP series HEMT which can realize a high power device in the milliwave band as well as in the microwave band with improved high power properties.

The InP series HEMT has a structure described in Loi D. Nguyen et al., IEEE Transactions on Electron Devices, volume 39, 1992, pages 2007–2014, and is fabricated as a low noise amplifier in the milliwave band because of high operation frequency thereof.

However, the gate electrode has a Ti/Pt/Au structure (Pt and Au regions laminated on a Ti region) and the source and drain electrodes have a AuGe/Ni/Au structure (Ni and Au regions laminated on an AuGe region). Therefore, a noticeable solid phase reaction between these electrodes and InGaAs, AlInAs, i.e., a compound semiconductor constituting the InP series HEMT, is observed and reliability of the device is poor. As a result, refractory metals must be used for the source and drain electrodes as well as the gate electrode.

One of the attempts is a trial product of an InP-HEMT introduced in a reference (H. Sasaki et al., IPRM, 1995, pages 745–748), wherein a refractory metal WSi is used only for the source and drain electrodes for higher reliability.

However, in a structure described in the reference, Ti is used as the gate electrode material and a fluorine-containing gas is used for processing WSi for the material of the source and drain electrodes. Therefore, a noticeable solid phase reaction between the gate electrode and AlInAs is observed and fluorine diffuses into the AlInAs region, so that improved reliability of the high power device cannot be achieved.

Accordingly, a refractory metal material must be used for the gate electrode and a fluorine-containing gas must not be used in a formation process of the gate electrode. However, nothing is suitable as the process gas except for fluorine-containing gases, so that it is difficult to meet such a demand, which is not realized.

A description will be given of a structure and characteristics of an MIM capacitor for use in an existing compound semiconductor MMIC. A dielectric used in the MIM capacitor comprises an SiN film or SiON film formed by plasma CVD. This is because oxidation of the compound semiconductor, such as GaAs or InP cannot form an insulating film of good quality, so that a silicon thermal oxidation ($SiO_2$) film with a reliability of a silicon device cannot be employed as the insulating film.

As conventional, in the fabrication method of the compound MMIC capacitor, an MIM structure is employed. The MIM structure comprises a metal region formed using the evaporation and lift-off technique, an SiN film or an SiON film deposited thereon by plasma CVD and a metal region formed thereon using the evaporation and lift-off technique. In order to increase the capacitance of the capacitor, the thickness of the dielectric film must be reduced, or a dielectric constant of a dielectric material must be increased.

In the former method, for example, if the thickness of the SiN film as the dielectric film is reduced from 1000 Å to 500 Å, twice the capacitance is obtained. However, in this case, the insulating breakdown voltage is reduced from 100 V to 50 V, resulting in the compound MMIC capacitor with poor reliability. On the other hand, in the latter method, for example, when using a ferroelectric material having a dielectric constant of about 100, such as $SrTiO_3$ as a dielectric material, several times the capacitance is obtained without reducing the breakdown voltage. The film of the dielectric region must be thickened for ensuring the breakdown voltage, so that an MIM capacitor with 100 times capacitance is not obtained using a ferroelectric material having a dielectric constant about 100 times as high as a normal dielectric material.

However, since processing of ferroelectric material has several problems, application to the compound MMIC is limited. First, considerable stress is produced between the ferroelectric material and the metal film, and the film is thickened to ensure the insulating breakdown voltage, so that the dielectric region tends to peel. Secondly, wet etching in processing provides poor precision, a large pattern edge, and a side-etched structure, so that a large margin is required to prevent etching the dielectric region itself constituting the MIM capacitor. To increase a process precision, dry etching using HBr may be employed which has a high corrosivity and is difficult to handle.

Therefore, there is a need for an MIM capacitor which is easy to fabricate and provides high precision.

The film bulk acoustic wave resonator also has a structure which is similar to that of the MIM capacitor wherein the dielectric region is replaced by a piezoelectric region. As in the MIM capacitor, thickening the piezoelectric region for improved properties causes the same to peel, and a large margin of the etching pattern must be left when using wet etching in a fabrication process. To increase process precision, dry etching may be employed which uses a highly-corrosive etching gas and is difficult to handle.

A brief description will be given of problems of the prior art FET, HEMT, MIM capacitor, and a film bulk acoustic wave resonator. In the prior art FET 202 illustrated in FIG. 33(*d*), reduction of the effect of traps produced at the interface between the n' diffusion regions 3*a*, 3*b* and the insulating film 27, control of widths of the n' diffusion regions 3*a*, 3*b* and optimization of the p diffusion region 5 are realized, so that high frequency properties are improved and the short channel effect is suppressed. However, the gate length of the refractory metal gate electrode 26*a* formed by etching in the recess 1*a*, i.e., the dummy gate 43*a*, is determined by the time of over etching in the recess 1*a* and variation of the process, so that it is difficult to control the gate length.

Though the prior art InP series HEMT has sufficiently high frequency properties in the operation in the milliwave band, sufficient reliability of high power devices is not obtained.

In the prior art MIM capacitor and film bulk acoustic wave resonator, when using a thick ferroelectric region to increase breakdown voltage and capacitance, the ferroelectric region tends to peel, leading to a fragile device structure. Since an etching with high precision with respect to the ferroelectric material requires a highly-corrosive etching gas, desired processing is not compatible with precision.

SUMMARY OF THE INVENTION

It is an object of the present invention to provide a semiconductor device with reduced effects of traps produced at an interface between n' source and drain diffusion regions and an insulating film and optimization of a p diffused region formed under source and drain regions or a channel region and, simultaneously can simplify control of gate length, and a method of fabricating the device.

It is another object of the present invention to provide a semiconductor device wherein a refractory metal material is used for gate, source, and drain electrodes in an InP series HEMT mounted in an MMIC and a semiconductor region is not deteriorated by the fabrication process, whereby a high reliability high power device is obtained and a method of fabricating the device.

It is still another object of the present invention to provide a semiconductor device which has an MIM capacitor mounted in the MMIC and wherein constituents of a device can be fabricated easily and with high precision, and a method of fabricating the device.

Other objects and advantages of the invention will become apparent from the detailed description that follows. The detailed description and specific embodiments described are provided only for illustration since various additions and modifications within the spirit and scope of the invention will be apparent to those skilled in the art from the detailed description.

According to a first aspect of the present invention, a semiconductor device comprises a constituent of a device formed self-alignedly in a recess formed in a substrate by filling the recess with a refractory metal material, the constituent having the same plane pattern as the bottom surface of the recess. Therefore, a pattern width of the constituent is determined by the plane pattern of the recess, thereby facilitating control of the pattern width of the constituent. For example, when the constituent is a gate electrode, control of the gate length can be simplified by the plane pattern of the recess. Further, a spacing between the constituent in the recess and other constituents placed at both sides of the recess can be controlled with high precision.

According to a second aspect of the present invention, a fabrication method of a semiconductor device comprises preparing a substrate; forming a recess in a surface of the substrate; and depositing a refractory metal material over the surface of the substrate to form a refractory metal region only in the recess as a constituent, the constituent having the same plane pattern as the bottom surface of the recess. Therefore, the etching of the refractory metal with poor controllability is not employed to form the constituent. The constituent is formed with highly dimensional precision having the same plane pattern as the bottom surface of the recess and with ease.

According to a third aspect of the present invention, the semiconductor device according to the first aspect further comprises a semiconductor substrate having a recess in a surface thereof, a channel region formed at the bottom of the recess of the substrate, source and drain regions formed at both sides of the recess of the semiconductor substrate and a gate electrode formed self-alignedly in the recess by filling the recess with a refractory metal material, the gate electrode having the same plane pattern as the bottom surface of the recess. Therefore, the gate length of the gate electrode is determined by the plane pattern of the recess. As a result, the gate length can be controlled by the plane pattern of the recess with ease. Further, spacing between the gate electrode in the recess and diffusion regions comprising the source and drain regions disposed at both sides of the recess can be controlled with high precision and ease.

According to a fourth aspect of the present invention, the method of fabricating the semiconductor device according to the second aspect further comprises forming an insulating film on the semiconductor substrate as the substrate, forming an opening in the insulating film and a recess having the same plane pattern as the opening of the insulating film in a surface of the semiconductor substrate, forming a channel region at the bottom of the recess, depositing a refractory metal material to form a refractory metal region in such a manner that a discontinuity thereof occurs in the upper portion of the opening of the insulating film, selectively removing the refractory metal region so that only a portion of the refractory metal material positioned at the bottom of the recess of the semiconductor substrate is left, to form a gate electrode in the recess, forming source and drain regions at both sides of the recess of the semiconductor substrate after removal of the insulating film, and forming source and drain electrodes on the source and drain regions spaced apart from the gate electrode by a prescribed distance. Therefore, etching of the refractory metal region with poor controllability is not required to form the refractory metal gate electrode. As a result, the gate electrode having the same plane pattern as the recess is formed with high precision and with ease.

According to a fifth aspect of the present invention, the method of fabricating the transistor according to the fourth aspect further comprises, in the formation step of the source and drain regions, etching the insulating film to etch away an edge on the gate electrode side, subsequently to this, performing the first selective ion implantation using a mask region positioned self-alignedly with respect to the insulating film which has the etched-away edge, and after removal of the mask region, performing the second selective ion implantation using the gate electrode as a mask. Therefore, the insulating film is wet-etched on the semiconductor substrate using an SiO film as the insulating film and a resist as the mask region. In this case, high-concentration diffusion regions constituting the source and drain regions are not damaged unlike in using a dry etching, thereby preventing increase in a contact resistance between the source and drain regions, and an ohmic electrode.

According to a sixth aspect of the present invention, the method of fabricating the semiconductor device according to the fourth aspect further comprises, in the formation of the source and drain regions, forming a dummy gate positioned self-alignedly in the opening of the insulating film, after removal of the insulating film, performing a first selective ion implantation using the dummy gate as a mask, forming a side wall self-alignedly on a side wall of the dummy gate, and performing a second selective ion implantation using the dummy gate and the sidewall as masks. Therefore, a distance between a region where the gate electrode is to be disposed and the high-concentration diffusion regions constituting the source and drain regions is set with controllability and, simultaneously variations of a source resistance and a drain breakdown voltage are suppressed.

According to a seventh aspect of the present invention, the method of fabricating the semiconductor device according to the fourth aspect further comprises, in the formation step of the source and drain regions, forming the dummy gate by applying a material for film making having an etching selectiveness with respect to the insulating film and etching the material, after removal of the insulating film by a selective etching using the dummy gate as a mask, performing a first selective ion implantation using the dummy gate as a mask, forming a side wall self-alignedly on the side wall of the dummy gate, and performing the second selective ion implantation using the dummy gate and the side wall as masks. Therefore, as the dummy gate, a rectangular parallelepiped shape dummy gate whose side surface is perpendicular to the substrate surface is formed and a distance between the region where the gate electrode is to be disposed and the high-concentration diffusion regions constituting the source and drain regions is set by the side wall on the side surface thereof. As a result, controllability of the distance between the edge of the gate electrode and the high-concentration diffused regions is further increased.

According to an eighth aspect of the present invention, the semiconductor device according to the third aspect has a gate electrode with a side surface contacting the entire side surface of the recess, i.e., the gate electrode-side end surface of the source and drain region. Therefore, in addition to facilitating control of a gate length, when applying a gate voltage to the gate electrode, a depletion region extends to a portion contacting with the side surface of the gate electrode in the source and drain regions along the side surface of the gate electrode in an edge portion thereof, thereby a narrower channel and deterioration of the drain breakdown voltage due to a concentration of an electric field in the edge portion of the gate electrode are avoided.

According to a ninth aspect of the present invention, the method of fabricating the semiconductor device according to the second aspect further comprises forming an insulating film on the semiconductor substrate as the substrate, forming an opening in the insulating film and a recess having the same plane pattern as the opening of the insulating film in a surface of the semiconductor substrate, forming a channel region at the bottom of the recess of the semiconductor substrate, depositing a refractory metal material to form a refractory metal region in such a manner that no discontinuity thereof occurs in the upper portion of the opening of the insulating film, removing the refractory metal region in the opening of the insulating film as a gate electrode, after removal of the insulating film, forming source and drain regions at both sides of the recess of the semiconductor substrate, and forming source and drain electrodes on the source and drain regions spaced apart from the gate electrode by a prescribed distance. Therefore, etching of the refractory metal region with poor controllability is not required to form the refractory metal gate electrode. As a result, the gate electrode whose side surface contacting with the entire side surface of the recess, i.e., the gate electrode-side end surface, is formed with high precision having the same plane pattern as the recess and with ease.

According to a tenth aspect of the present invention, the semiconductor device according to the eighth aspect has a gate electrode with a rectangular parallelepiped shape and has a structure in which the lower portion of the side surface contacts the entire side surface of the recess, i.e., the gate electrode-side end surface. Therefore, the gate length is controlled with ease and, simultaneously a narrower channel and deterioration of a drain breakdown voltage due to a concentration of an electric field in an edge portion of the gate electrode are avoided. In addition, a low-resistance electrode is realized due to increase in a cross-section of the gate electrode. Further, since the gate electrode has a rectangular parallelepiped shape, the controllability of a width of the side wall formed against the side surface of the gate electrode is increased, whereby reproducibility of a width of low-concentration diffused regions constituting the source and drain regions is increased, so that variations of drain breakdown voltage are suppressed.

According to an eleventh aspect of the present invention, the method of fabricating the semiconductor device according to the second aspect further comprises forming an insulating film on the semiconductor substrate as the substrate, forming an opening in the insulating film and a recess having the same plane pattern as the opening of the insulating film in the semiconductor substrate surface, forming a channel region at the bottom of the recess of the semiconductor substrate, selectively forming a thin refractory metal only at the bottom of the recess in the semiconductor substrate, filling the opening of the insulating film with the refractory metal by selective CVD, after removal of the insulating film, forming source and drain regions at both sides of the recess of the semiconductor substrate, and forming source and drain electrodes on the source and drain regions spaced apart from the gate electrode by a prescribed distance. Therefore, etching of the refractory metal region with poor controllability is not required to form the gate electrode. As a result, the gate electrode whose side surface contacts the entire side surface of the recess, i.e., the gate electrode-side end surface, is formed with high precision, having the same plane pattern as the recess, and with ease.

According to a twelfth aspect of the present invention, the semiconductor device according to the first aspect further comprises a semiconductor substrate, a channel region formed on the semiconductor substrate, an electron supply region formed on the channel region, a gate electrode formed on the electron supply region, a contact region formed in a region at both sides of the gate electrode on the electron supply region, an insulating film formed on the contact region and having a prescribed opening, and source, drain and ohmic electrodes as the constituents disposed in the opening of the insulating film, the substrate comprising the semiconductor substrate, the channel region, the electron supply region, the contact region and the insulating film, the recess comprising a surface portion of the contact region exposed in a side portion of the opening and in the opening of the insulating film, the gate electrode having the same plane pattern as the electron supply region exposed in the opening of the insulating film, and the source and drain electrodes having the same plane pattern as the contact region exposed in the opening of the insulating film. Therefore, spacings between the gate electrode and the source and drain electrodes can be controlled with precision and with ease by positioning the openings of the insulating film on the electron supply and contact regions.

According to a thirteenth aspect of the present invention, the semiconductor device according to the twelfth aspect has the gate electrode, and the source and drain electrodes made of different refractory materials. Therefore, in addition to controlling the spacings between the gate electrode and the source and drain regions with high precision and with ease, optimal refractory metal materials can be selected for a Schottky gate electrode and ohmic source and drain electrodes, respectively.

According to a fourteenth aspect of the present invention, the method of fabricating the semiconductor device according to the second aspect further comprises successively forming a channel region, an electron supply region, a contact region and an insulating film on the semiconductor substrate to form the substrate; forming first and second openings corresponding to source and drain electrodes in the insulating film; after formation of the first and second openings of the insulating film, depositing a first refractory metal material to form a refractory metal region in such a manner that a discontinuity thereof occurs in the upper portions of the first and second openings of the insulating film; selectively removing the refractory metal region so that only a portion thereof positioned on the contact region in the first and second openings of the insulating film is left, to form source and drain electrodes; selectively etching a portion between the source and drain electrodes of the insulating film and the contact region until the electron supply region is exposed to form a third opening of the insulating film corresponding to a gate electrode; subsequently to this, after formation of the third insulating film, depositing a second refractory metal material different from the first refractory metal material to form a refractory metal region in such a manner that a discontinuity thereof occurs in the upper portion of the third opening of the insulating film, and selectively removing the second refractory metal region so that only a portion on the electron supply region in the third opening of the insulating film is left, to form the gate electrode. Therefore, when using the refractory metal regions in which a solid phase reaction between a compound semiconductor region and the same is hardly observed, as source, drain and gate electrodes, a patterning is performed by the discontinuity of the refractory metal region. In the patterning, the etching of the refractory metal region is not required, so that fluorine included in a fluorine based gas, i.e., a process gas of the refractory metal region, does not diffuse into the semiconductor region. As a result, reliability of a high power device is obtained.

According to a fifteenth aspect of the present invention, the semiconductor device according to the twelfth aspect has the gate electrode, and the source and drain electrodes made of the same refractory metal material. Therefore, the gate, source and drain electrodes are positioned by one patterning and spacings between them can be controlled with higher precision, so that formation step of these electrodes can be simplified.

According to a sixteenth aspect of the present invention, the method of fabricating a semiconductor device according to the second aspect further comprises successively forming a channel region, an electron supply region, a contact region and an insulating film on the semiconductor substrate to form the substrate; forming first and second openings corresponding to source and drain electrodes in the insulating film and a third opening corresponding to a gate electrode, selectively etching the contact region exposed in the third opening of the insulating film to expose the channel region therein, depositing a refractory metal material to form a refractory metal region in such a manner that a discontinuity thereof occurs in the upper portion of each opening of the insulating film, selectively removing the refractory metal region so that only a portion thereof positioned on the contact region in the first and second openings of the insulating film and only a portion thereof positioned on the electron supply region in the third opening of the insulating film are left, to form source and drain electrodes. Therefore, when using the refractory metal region in which a solid phase reaction between the compound semiconductor device and the same is hardly observed, as the source and drain electrodes, the patterning is performed by the discontinuity of the refractory metal region. The patterning does not require etching the refractory metal region. Fluorine included in a fluorine based gas for processing the refractory metal region does not diffuse into the semiconductor region. As a result, reliability of a high power device is obtained. Further, the gate, source and drain electrodes are positioned by one patterning and spacings between them can be controlled with higher precision, so that formation step of these electrodes can be simplified.

According to a seventeenth aspect of the present invention, the semiconductor device according to the fifteenth aspect has a distance between the gate and source electrodes different from a distance between the gate and drain electrodes. Therefore, spacings between them can be controlled with higher precision and the formation step of these electrodes can be simplified. Further, the gate electrode is placed spaced apart from the drain electrode and shifted to the source electrode, so that a drain breakdown voltage is increased.

According to an eighteenth aspect of the present invention, the method of fabricating the semiconductor device according to the sixteenth aspect comprises, in the formation of the openings of the insulating film, shifting the third opening to one side from a center of the first and second openings corresponding to the source and drain electrodes. Therefore, high reliability of high power device, increase in controllability of spacings between the gate, source and drain electrodes, and simplified formation steps of these electrodes are attained. In addition, elements with high drain breakdown voltage can be fabricated.

According to a nineteenth aspect of the present invention, a semiconductor device has a structure in which a dielectric region or a piezoelectric region is sandwiched between upper and lower electrodes, wherein a thickness of dielectric region or the piezoelectric region reduces gradually from a central to a peripheral portion. Therefore, the dielectric region or the piezoelectric region is hardly peeled, so that strong device structure is realized. In this case, the dielectric region may be thickened to increase an insulating breakdown voltage.

According to a twentieth aspect of the present invention, a method of fabricating a semiconductor device comprises preparing a substrate having an insulating surface region; forming a lower electrode on the substrate; forming a mask region having a prescribed opening, depositing a dielectric or piezoelectric material to form a dielectric or piezoelectric region in such a manner that a discontinuity thereof occurs in the upper portion of the opening of the mask region and a thickness thereof reduces gradually from central to peripheral portion; selectively removing the dielectric region or the piezoelectric region to form only a portion thereof positioned in the mask opening; and after removal of the mask region, forming an upper electrode on the remaining dielectric or piezoelectric region. Therefore, patterning of the dielectric or piezoelectric region is performed by the discontinuity in the opening of the mask. That is, in the patterning, a wet etching with poor process precision or a dry etching using a highly corrosive gas is not employed, so that the dielectric or piezoelectric region is fabricated with high precision and with ease. In addition, a thickness of the dielectric or piezoelectric region reduces gradually from the central to peripheral portion and hardly peeled. As a result, the MIM capacitor or the film bulk acoustic wave resonator comprising the dielectric or piezoelectric region as the constituent of a device can have a strong structure.

BRIEF DESCRIPTION OF THE DRAWINGS

FIG. 11(a) partially illustrates formation steps of n' source and drain diffusion regions, FIGS. 11(b) and 11(c) illustrate formation steps of $n^+$ source and drain diffusion regions and FIGS. 11(d)–11(f) illustrate formation steps of the source and drain electrodes for illustrating the fabrication method of the SAGFET according to the embodiment 3.

DETAILED EMBODIMENTS OF THE PRESENT INVENTION

Figure 1:
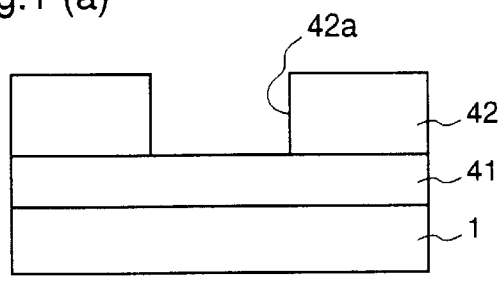
FIGS. 1(a)–1(h) are cross-sectional views of a gate electrode structure and a fabrication method thereof for illustrating a fundamental principle of the present invention.
Figure 1:
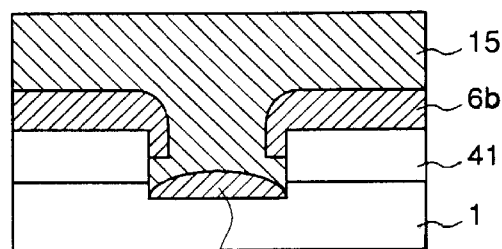
Figure 1:
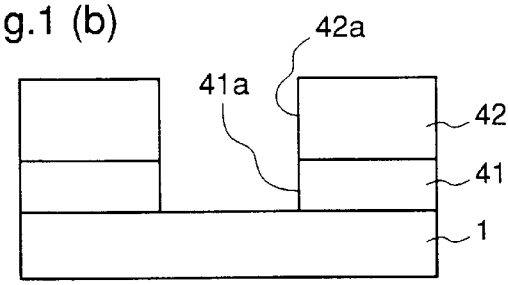
Figure 1:
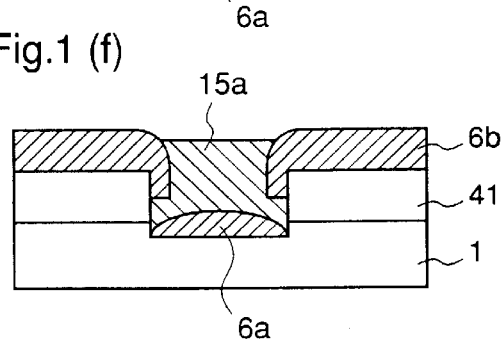
Figure 1:
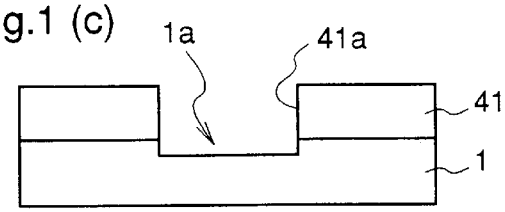
Figure 1:
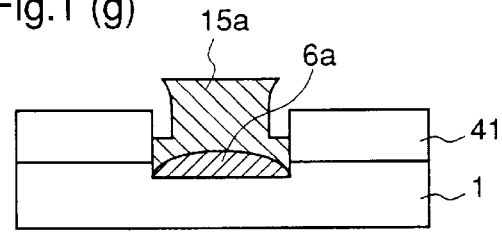
Figure 1:
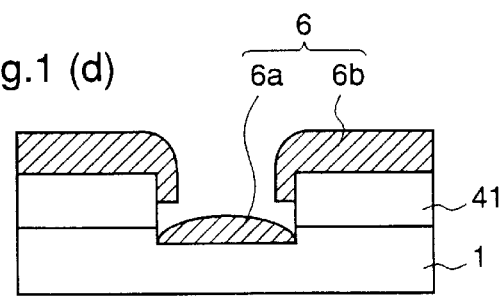
Figure 1:
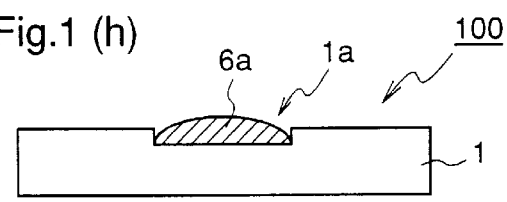

First, a description will be given of a fundamental principle of the present invention. FIGS. 1(a)–1(h) illustrate a fundamental structure of a gate electrode in a semiconductor device of the present invention and a fabrication method thereof. In FIG. 1(h), reference numeral 1 designates a compound semiconductor substrate. At a surface thereof, a recess 1a having a prescribed plane pattern is formed and a refractory metal gate electrode 6a is buried self-alignedly in the recess 1a. The refractory metal gate electrode 6a has the same plane pattern as a bottom surface of the recess 1a. The gate electrode 6a has a cross-section with a thickness thereof reduced gradually from central to peripheral portion. That is, the refractory metal gate electrode 6a has an arched-top surface and has a smoothly-thinned edge portion in the periphery.

In the figure, reference numerals 41, 42, and 15 designate an insulating film and first and second resists. The insulating film 41 has a prescribed pattern opening 41a and is employed as a mask region for a selective etching of the substrate surface and patterning of the gate electrode 6a. The resist 42 has an opening 42a for a selective etching of the insulating film 41. The resist 15 serves as a mask when a portion 15a filling the recess 1a, the insulating film 41, and the refractory metal region 6b are removed by etch-back.

In such a gate electrode structure, the plane pattern of the recess 1a determines a gate length of the gate electrode 6a and control of the gate length is facilitated by a plane pattern of the recess 1a. Further, a spacing between the gate electrode 6a in the recess 1a and diffusion regions constituting source and drain regions disposed at both sides of the recess can be controlled with high precision and with ease.

A description will be given of a formation step of the gate electrode. As illustrated in FIG. 1(a), the insulating film 41 is deposited over a compound semiconductor substrate 1 to a thickness of about 6000 Å and subsequently to this, the first resist 42 having a prescribed pattern opening 42a is formed.

As illustrated in FIG. 1(b), the insulating film 41 is etched using the resist 42 as a mask to form an opening 41a. The insulating film 41 is an $SiO_2$ film. As an etching technique, RIE is employed, which easily etches perpendicular to a substrate surface.

As illustrated in FIG. 1(c), after removal of the resist 42, using the insulating film 41 as a mask, the compound semiconductor substrate 1 is selectively etched to form the recess 1a about 500 Å deep. At this time, the recess may be formed before the removal of the resist 42. For formation of the recess 1a in the compound semiconductor substrate 1, wet etching using an aqueous solution of tartaric acid and hydrogen peroxide mixed in a ratio of 50:1 or dry etching using $Cl_2$ is employed. In the FIG. 1(c), the recess 1a having a vertical side wall formed by dry etching is illustrated.

As illustrated in FIG. 1(d), a refractory metal thin film 6 is deposited over the entire surface. At this time, a discontinuity of the refractory metal thin film 6 must occur in the upper portion of the recess 1a. W, WSi, WSiN, WN, TiW, or a laminated structure having a combination of these is employed for the refractory metal thin film 6. For example, when using WSi as a lower region metal, other metal materials are employed as an upper region metal. Alternatively, W or WSiN as the lower region metal, and materials other than WSi as the upper metal are used.

In this case, the refractory metal thin film 6 4000 Å or less thickness ensures that the discontinuity occurs. As a deposition method of the refractory metal thin film 6, sputter deposition is preferable. Sputter deposition provides an arched-top surface of a portion 6a in the recess 1a of the refractory metal thin film 6 where a gate electrode is to be formed. Specifically, as sputtering conditions for the discontinuity of the refractory metal thin film, an ambient pressure for deposition is 10 mTorr and distance between the substrate and a target is 5 μm.

As illustrated in FIG. 1(e), a second resist 15 is deposited to a thickness sufficient to make a portion corresponding to the recess 1a even. Specifically, a material resistant to RIE is used for the second resist 15 and it is deposited to a thickness about 1 μm.

As illustrated in FIG. 1(f), the second resist 15 is etched using an etching technique that provides a high uniformity across a wafer, such as $O_2$ ashing. The etching is stopped when the refractory metal thin film 6b on the insulating film 41 is exposed. Since the ratio of the resist 15a filling the recess 1a to the entire surface of the wafer is small, light emission from CO is suddenly reduced when the refractory metal thin film 6b is exposed during the etching. If light emission from CO is monitored during the etching and the etching is stopped upon detection of a sudden reduction of light emission from CO, the resist 15a is left only in the recess 1a with high controllability.

As illustrated in FIG. 1(g), using the resist 15a as a mask, the refractory metal thin film 6b is etched. An etching technique, such as plasma etching, ECR (electron cyclotron resonance) etching or RIE (reactive ion etching) is employed to perform a selective ion etching of the refractory metal thin film 6b with respect to the resist 15a. As an etching gas, $SF_6$ or $CF_4+O_2$ is employed. The etching is stopped after over-etching for about several tens of seconds (about 3000 Å in terms of a film thickness) from the end point when the insulating film 41 is exposed during the etching. The end point of the etching is easily detected by monitoring light emission from F radicals or light emission from SiF.

As illustrated in FIG. 1(h), after the insulating film 41 is etched, the resist 15a is removed. In the etching of the insulating film, hydrofluoric acid may be employed. As an etching technique, plasma etching, ECR etching or RIE may be employed. In RIE, as an etching gas, $CHF_3+O_2$ is employed, which can selectively etch the insulating film 41 with respect to the second resist 15a.

An electrode structure in which the refractory metal gate electrode is buried in the recess of the substrate surface, is employed as a wiring structure to increase a flat wiring portion. In this case, the metal thin film as a wiring region is disposed in the recess 1a formed in the insulating film.

A description will be given of embodiments.

[Embodiment 1]

Figure 2:
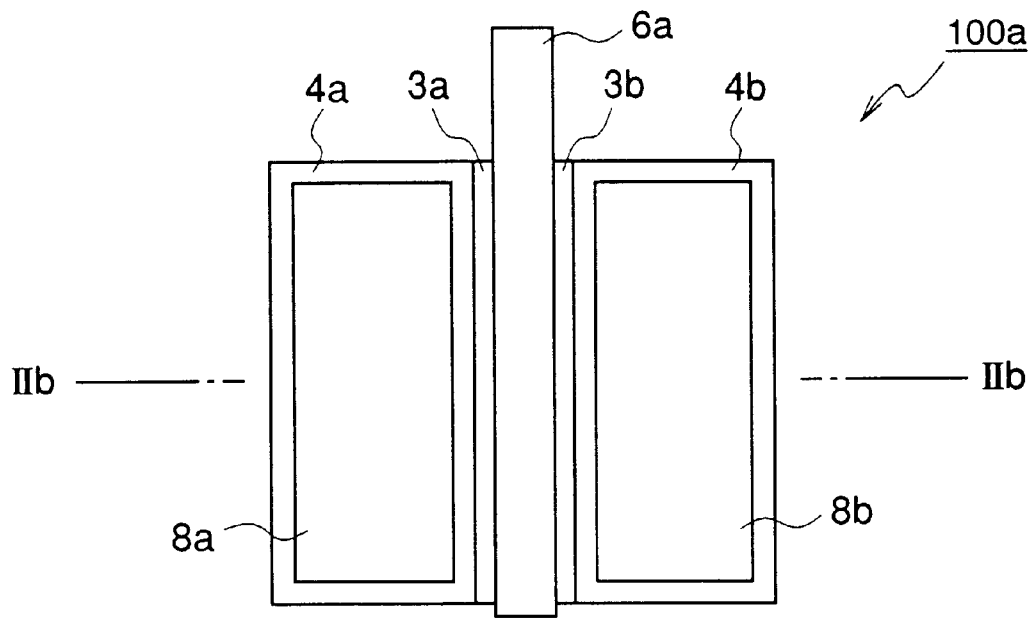
FIG. 2(a) is a plan view illustrating a structure of an SAGFET mounted in an MMIC for amplifying power and FIG. 2(b) is a cross-sectional view along the line IIb—IIb illustrating the structure of the SAGFET mounted in the MMIC for amplifying power for illustrating the semiconductor device according to an embodiment 1 of the present invention.
Figure 2:
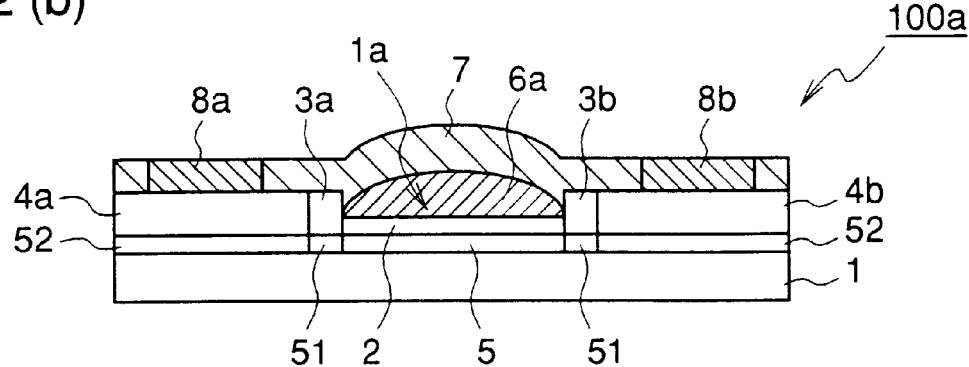

FIG. 2(a) is a plan view of a structure of an SAGFET mounted in an MMIC for amplifying power and FIG. 2(b) is a cross-sectional view illustrating a structure in cross-section along the line IIb—IIb.

In the figure, reference character 100a designates one of a plurality of FETs mounted in an MMIC for amplifying power. In a surface of a compound semiconductor substrate 1, a recess 1a is formed. In the recess 1a, a Schottky gate electrode 6a made of a refractory metal material is disposed and in a portion immediately under the gate electrode 6a, i.e., in a bottom portion of the recess 1a, an n diffusion region 2 constituting a channel region is formed. At both sides of the recess 1a, spaced apart from the gate electrode 6a by a prescribed distance, $n^+$ diffusion regions 4a, 4b (hereinafter referred to as an $n^+$ source diffusion region or an $n^+$ drain diffusion region) having a higher dopant concentration than that of the n diffusion region 2 and constituting source and drain regions are formed. Between the n diffusion region 2 and the $n^+$ diffusion regions 4a, 4b, n' diffusion regions 3a, 3b having a higher dopant concentration than that of the n diffusion region 2 and having a lower dopant concentration than that of the $n^+$ diffusion regions 4a, 4b are formed.

Immediately under the gate electrode 6a, i.e., only under the n diffusion region 2, a p diffusion region 5 is formed. Under the n' diffusion regions 3a, 3b, p' diffusion regions 51 having a concentration higher than that of the p diffusion region 5 is formed and under the $n^+$ diffusion regions 4a, 4b, p' diffusion regions 52 having a higher concentration than that of the p' diffusion regions 51 is formed.

Surfaces of the gate electrode 6a, the n' diffusion regions 3a, 3b and the n⁺ diffusion regions 4a, 4b are covered by an insulating film 7 for passivation. In openings 7a, 7b formed in prescribed positions on the n⁺ diffusion regions 4a, 4b of the insulating film 7, an ohmic metal region constituting source and drain electrodes 8a, 8b is formed.

In the embodiment 1, the refractory metal gate electrode 6a is located in the recess 1a and has the same plane pattern as the bottom surface of the recess 1a. A distance between the gate electrode 6a and the n³⁰ source diffusion region 4a is equal to a distance between the gate electrode 6a and the n⁺ drain diffusion region 4b. The gate electrode 6a has a smoothly arched-top surface, that is, has a cross-section thinned gradually from central to peripheral portion.

The n diffusion region 2 constituting the channel region and the p diffusion region 5 under the same are located only under the recess 1a. The n' diffusion regions 3a, 3b, the p' diffusion regions 51, the n⁺ diffusion regions 4a, 4b and the p" diffusion regions 52 are located outside the recess 1a. The bottom of the n diffusion region 2 is coplanar with the bottoms of the n' diffusion regions 3a, 3b and the n⁺ diffusion regions 4a, 4b.

In the SAGFET 100a having such a structure, the gate electrode 6a is buried in the recess 1a in the surface of the compound semiconductor substrate 1 and has the same plane pattern as the bottom surface of the recess. Therefore, the gate length of the gate electrode 6a is determined by the plane pattern of the recess 1a, so that control of the gate length can be facilitated by a plane pattern of the recess 1a. Further, spacings between the gate electrode 6a in the recess 1a, the n' diffusion regions 3a, 3b and n⁺ diffusion regions 4a, 4b constituting the source and drain regions can be controlled with high precision and with ease.

Since the bottom of the n diffusion region 2 is coplanar with the bottoms of the n' diffusion regions 3a, 3b, channel current flows at a location spaced apart from the compound semiconductor substrate surface in the n' diffusion regions 3a, 3b. In addition, since the bottoms of the n' diffusion regions 3a, 3b are coplanar with the bottom of the n⁺ diffusion region 4, channel current flows at a location spaced apart from the compound semiconductor substrate surface in the n⁺ diffusion regions 4a, 4b. That is, in the SAGFET 100a according to the embodiment 1, channel current is hardly affected by effects of the semiconductor substrate surface, i.e., effects of an interface energy level, an interface trap and a depletion region or the like, resulting in a fast pulse response, i.e., a fast response of source to drain current to a pulse voltage applied to the gate electrode.

The n' diffusion regions 3a, 3b and the n⁺ diffusion regions 4a, 4b are located at both sides of the recess 1a, so that these diffusion regions are made thicker as a function of a depth of the recess, thereby improving transconductance gm (or k value).

In this case, even if the n' diffusion regions 3a, 3b, are made thicker, the bottom position thereof is not as deep as that of the n diffusion region 2, so that a resistance Rs between the source and gate is reduced without the short channel effect when the n diffusion region 2 is made thinner to increase transconductance gm.

A description will be given of a fabrication method. FIGS. 3(a)–3(f), 4(a)–4(f) and 5(a)–5(d) illustrate a structure in cross section in the fabrication process, for illustrating a fabrication method of the SAGFET.

Figure 3:
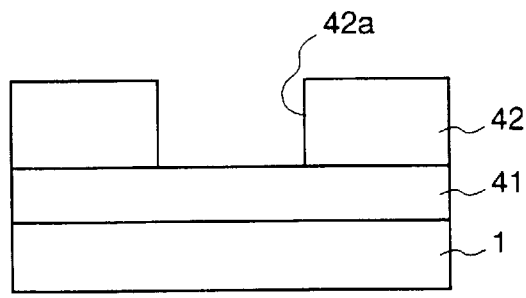
FIGS. 3(a)–3(d) partially illustrate formation steps of a channel region.
FIGS. 3(e) and 3(f) partially illustrate formation steps of a refractory metal gate electrode for illustrating the fabrication method of the SAGFET mounted in the MMIC for amplifying.
Figure 3:
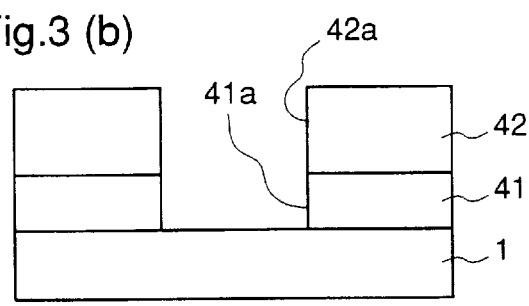
Figure 3:
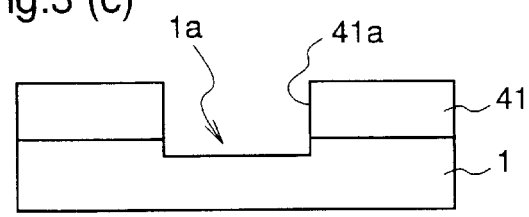
Figure 3:
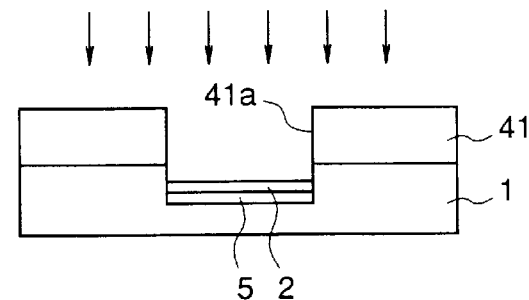
Figure 3:
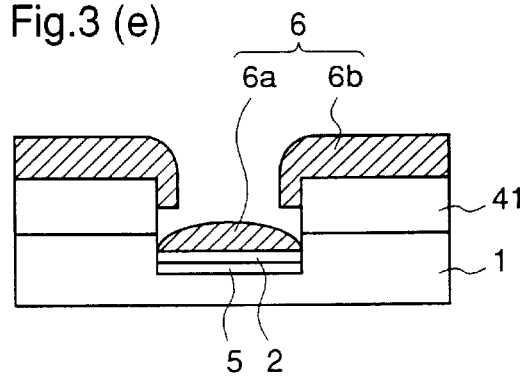
Figure 3:
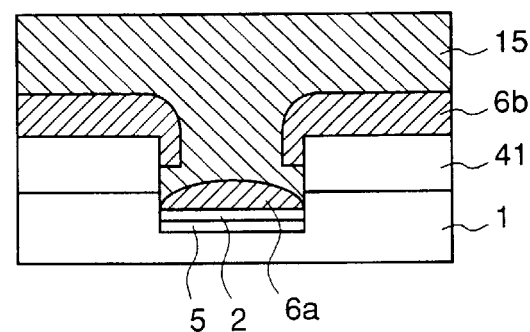

As illustrated in FIG. 3(a), the insulating film 41 is deposited over the compound semiconductor substrate 1 to a thickness of 6000 Å to form the first resist 42 having the opening 42a with a prescribed pattern. As illustrated in FIG. 3(b), the insulating film 41 is etched using the resist 42 as a mask to form the opening 41a of the insulating film 41a. In this case, the insulating film 41 is an $SiO_2$ film and as an etching technique, RIE is employed, which is etches perpendicular to the substrate surface.

As illustrated in FIG. 3(c), after removal of the resist 42, the compound substrate surface is etched to form the recess 1a having a thickness of about 500 Å. At this time, the recess 1a may be formed before the resist 42 is removed. In the etching to form the recess 1a in the surface of the compound semiconductor substrate 1, preferably dry etching using $Cl_2$ is employed. In FIG. 3(c), the recess 1a which is formed by dry etching perpendicular to the substrate surface is illustrated.

As illustrated in FIG. 3(d), ion implantation of n type impurities is performed into the substrate region exposed in the opening 41a of the insulating film 41 to form the n and p diffusion regions 2 and 5. Since the insulating film 41 serves as a mask for ion implantation, ions are implanted into the insulating film. However, ion concentration in the insulating film is about $10^{17}$ $cm^{-3}$, so that composition of the insulating film is hardly changed. Si ions are employed as implantation ions for formation of the n region and Mg ions are employed as implantation ions for formation of the p region. The Si ions are implanted at an accelerating energy of 60 KeV and a dose of about $7 \times 10^{12}$ $cm^{-2}$. The Mg ions are implanted at an accelerating energy of 300 KeV and a dose of about $5 \times 10^{12}$ $cm^{-2}$. In this case, since the Mg ions are implanted to about 1000 Å deep, the insulating film 41 comprising $SiO_2$ film 6000 Å thick fully serves as the mask for ion implantation.

As illustrated in FIG. 3(e), the refractory metal thin film 6 is deposited over the entire surface in such a manner that the discontinuity thereof occurs in the upper portion of the opening 41a of the insulating film. The refractory metal thin film 6 has a single region structure comprising W, WSi, WSiN, WN or TiW or a laminated structure having a combination of these materials. The combination of these metal materials is identical to that already described in the fundamental principle of the present invention. As a deposition method of the refractory metal film 6, sputter deposition is preferable. Sputter deposition makes an arched-top surface of the refractory metal region 6a deposited in the recess 1a, i.e., a gate electrode. Sputtering conditions are the same as those already described in the fundamental principle.

As illustrated in FIG. 3(f), a second resist 15 is deposited to a thickness of about 1 μm sufficient to make uneven refractory metal thin film 6 in the recess 1a flat. A material resistant to RIE is used for the second resist 15.

Figure 4:
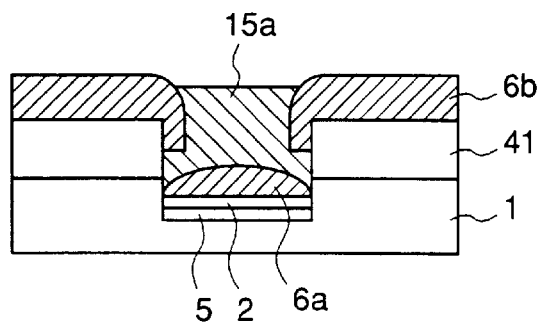
FIGS. 4(a)–4(c) partially illustrate formation steps of the refractory metal gate electrode and FIGS. 4(d)–4(f) partially illustrate formation steps of $n^+$ source and drain diffusion regions for illustrating the fabrication method of the SAGFET according to the embodiment 1.
Figure 4:
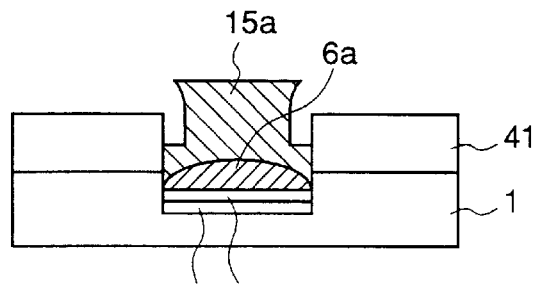
Figure 4:
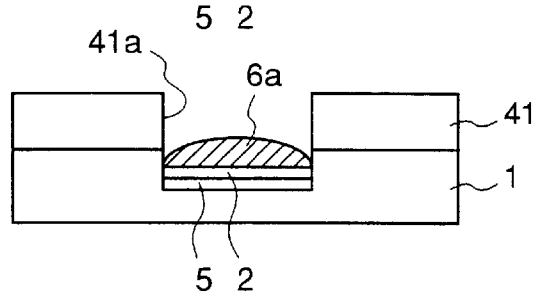
Figure 4:
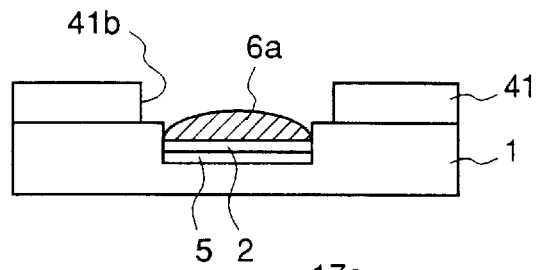
Figure 4:
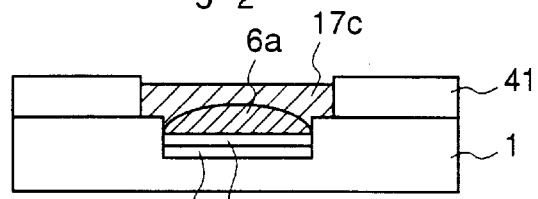
Figure 4:
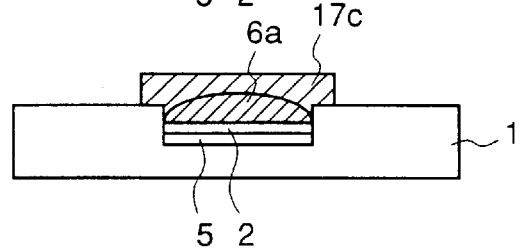

As illustrated in FIG. 4(a), the second resist 15 is etched using an etching technique that provides a high uniformity across a wafer, such as $O_2$ ashing. The etching is stopped when the refractory metal thin film 6b on the insulating film 41 is exposed. Since the ratio of the resist 15a filling the concavity of the refractory metal thin film 6 to the entire surface of the wafer is small, light emission from CO is suddenly reduced when the refractory metal thin film 6 is exposed. If light emission from CO is monitored during the etching and the etching is stopped upon detection of sudden reduction of light emission from CO, the resist 15a is left with controllability.

As illustrated in FIG. 4(b), the refractory metal thin film 6b is etched using the resist 15a as a mask. In the etching, plasma etching, ECR (electron cyclotron resonance) etching or RIE (reactive ion etching) is employed to selectively etch the refractory thin film 6b with respect to the resist 15a. As an etching gas, $SF_6$ or $CF_4+O_2$ is employed. The etching is stopped after over-etching for several tens of seconds (about 3000 Å in terms of film thickness) from the point (end point) when the insulating film 41 is exposed. The end point of the etching is easily detected by monitoring light emission from F radicals or light emission from SiF.

As illustrated in FIG. 4(c), the resist 15a is removed. As illustrated in FIG. 4(d), the insulating film 41 is etched to etch away an edge on the gate electrode side, forming a wide opening 41b. As illustrated in FIG. 4(e), a third resist 17c is deposited over the entire surface and etched using $O_2$ ashing until the insulating film 41 is exposed, to embed the third resist 17c in the opening 41b. The thickness of the third resist is about 1 μm, enough to fill the opening of the recess. The principle and the method of detecting the end point of the etching are identical to those already described for the etching of the second resist 15. In order to avoid unwanted mixing of a resist masking a region of the substrate where the FET is not fabricated with the third resist 17c formed on the refractory metal gate 6a in a subsequent ion implantation process for making $n^+$ regions, these resists must be reformed by deep UV curing.

As illustrated in FIG. 4(f), the insulating film 41 is removed with buffered hydrofluoric acid ($HF:NH_4F=30:1$). At this time, it is important that the refractory metal gate electrode 6a, the third resist 17c and the compound semiconductor substrate 1 are not damaged and no residue is left.

Figure 5:
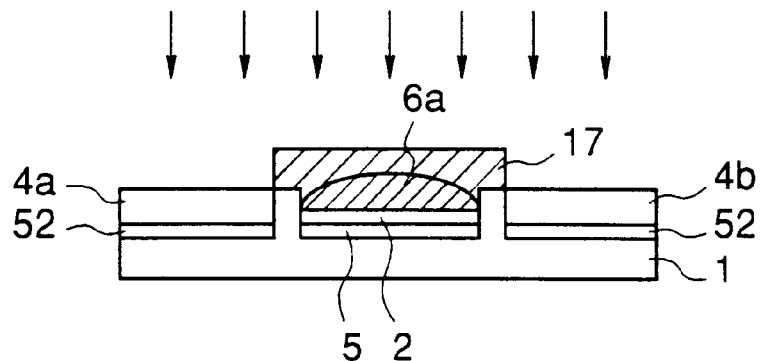
FIG. 5(a) partially illustrates formation steps of $n^+$ source and drain diffusion regions.
FIG. 5(b) illustrates formation steps of n' source and drain diffusion regions and FIGS. 5(c)–5(d) illustrate formation steps of source and drain electrodes.
Figure 5:
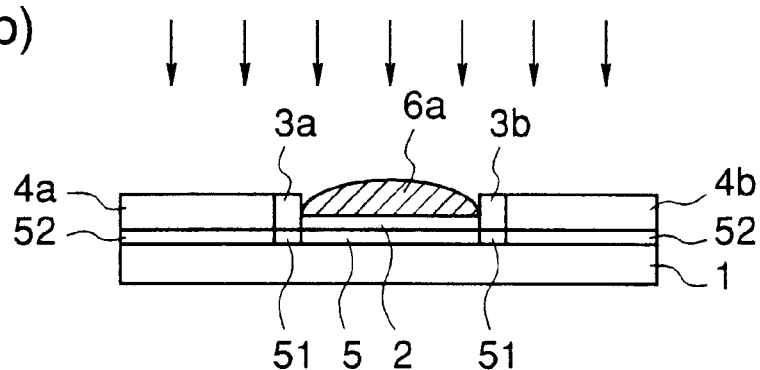
Figure 5:
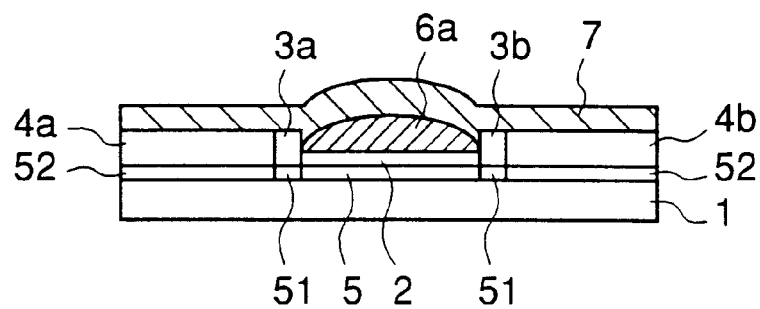
Figure 5:
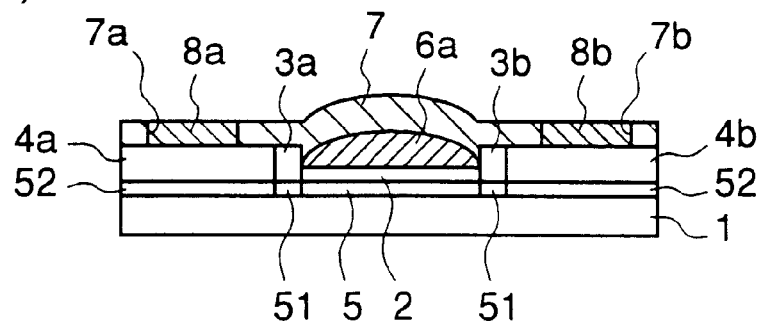

Thereafter, as illustrated in FIG. 5(a), using the resist 17c as a mask, Si ions are implanted to form $n^+$ diffusion regions 4a, 4b and Mg ions are implanted to form p" diffusion regions 52. A region of the substrate where the FET is not fabricated is masked with a resist (not shown). The energy of the Si ion implantation is set at 100 KeV so that the resist 17c can mask the Si ions, and it is desired that the bottoms of the $n^+$ diffusion regions 4a, 4b be coplanar with the bottom of the n diffusion regions 2. The dose of the Si ions is about $5\times10^{13}$ $cm^{-2}$. The Mg ions are implanted at an accelerating energy of 300 KeV and a dose of about $5\times10^{12}$ $cm^{-2}$.

As illustrated in FIG. 5(b), after removal of the third resist 17c, a resist mask (not shown) for ion implantation having an opening where the FET is to be fabricated, is formed and Si ions are implanted to form the n' diffusion regions 3a, 3b and Mg ions are implanted to form the p' diffusion region 51. The ions are implanted at an energy of 100 KeV as in formation of the $n^+$ diffusion regions 4a, 4b so that the bottoms of the n' diffusion regions 3a, 3b are coplanar with the bottoms of the n diffusion region 2 and the $n^+$ diffusion regions 4a, 4b. The dose depends on the desired breakdown voltage and transconductance of the elements. The Mg ions are implanted at an accelerating energy of 300 KeV as in formation of the p" diffusion regions 52. The dose is $5\times10^{12}$ $cm^{-2}$. Thereafter, after removal of the resist mask, annealing is performed to activate the ion-implanted region. The annealing of a wafer is carried out at a temperature of 800° C. for about 30 minutes in an ambient including As, by heating.

As illustrated in FIG. 5(c), an insulating film 7 for passivation is deposited. Preferably, the insulating film 7 has a stress of $1\times10^9$ $dyn/cm^2$ or less to suppress the short channel effect. For example, an SiON film formed by plasma CVD is employed.

Finally, using a resist film (not shown) having openings in the source and drain regions as a mask, the insulating film 7 is etched to form openings 7a, 7b in the insulating film 7. Thereafter, evaporation and lift-off of an ohmic metal, i.e., source and drain electrodes 8a, 8b is performed, followed by sintering, whereby an FET 100a is completed (FIG. 5(d)).

In this case, the source and drain electrodes 8a, 8b have a structure in which an AuGe based alloy is laminated on an Ni region, to reduce the contact resistance.

In the fabrication method of embodiment 1, after formation of the insulating film 41 having a prescribed pattern opening 41a in the compound semiconductor substrate 1, using the insulating film 41 as a mask, the substrate is etched to form the recess 1a in the surface thereof. Thereafter, the refractory metal material is deposited over the entire surface in such a manner that the discontinuity thereof occurs in the upper portion of the opening 41a to form the refractory metal region 6a, i.e., the gate electrode in the recess 1a. Therefore, a method of etching of the refractory metal region with poor controllability for formation of the refractory metal gate electrode 6a is not employed and the gate electrode 6a has the same plane pattern as the bottom surface of the recess 1a with high precision and with ease. In this case, the gate length is determined by the width of the recess 1a with high precision.

After etching away the opening end of the insulating film 41 by the etching, using the self-aligned resist 17c in the opening as a mask, ions are implanted to form the n diffusion regions 4a, 4b. In addition, after removal of the insulating film 41, ions are implanted to form the n' diffusion regions 3a, 3b. As a result, the widths of the n' diffusion regions 3a, 3b are set at required dimensions in accordance with the etched-away opening end of the insulating film 41 by the etching.

The p diffusion region 5 is formed in formation of the n diffusion region 2. The p' diffusion regions 51 are formed in formation of the n' diffusion regions 3a, 3b. The p diffusion regions 52 are formed in the formation of the $n^+$ diffusion regions 4a, 4b. Therefore, optimization of these p type diffusion regions, i.e., optimization of the position of the boundary between the n type diffusion region and the same can be achieved.

In the formation step of the n' diffusion regions 3a, 3b constituting the source and drain regions, the insulating film 41 is etched to etch away an edge on the gate electrode side of the opening 41a. Thereafter, using the resist 17C positioned self-alignedly with respect to the etched-away insulating film, selective ion implantation is performed, so that wet etching is employed using the resist 17c as a mask to remove the insulating film 41 on the semiconductor substrate 1. In this case, high-concentration diffusion regions constituting the source and drain regions are not damaged, unlike using the dry etching, to remove the insulating film 41, thereby preventing increase in a contact resistance between the source and drain regions and the ohmic electrode.

[Embodiment 2]

A description will be given of a fabrication method of the SAGFET according to an embodiment 2 different from that already described in the embodiment 1. FIGS. 6(a)–6(f), 7(a)–7(f) and 8(a)–8(c) illustrate a structure of the FET in cross-section in the fabrication process.

Figure 8:
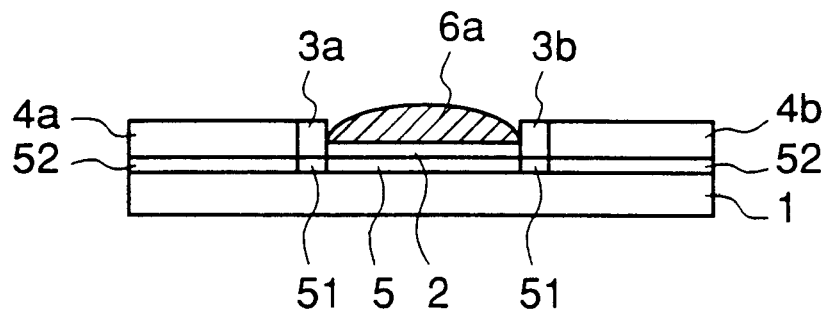
FIGS. 8(a)–8(c) illustrate formation steps of source and drain electrodes for illustrating the fabrication method of the SAGFET according to the embodiment 2.
Figure 8:
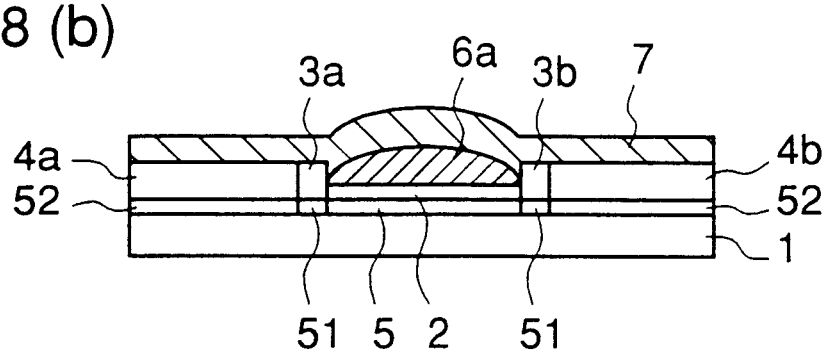
Figure 8:
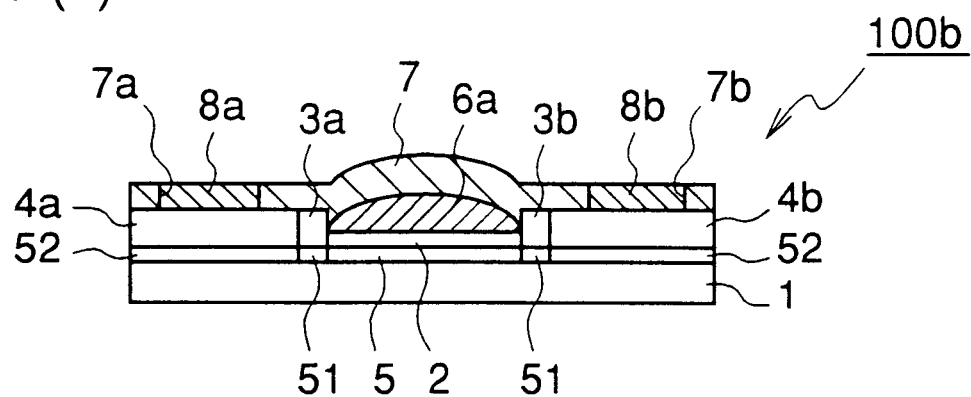

In FIG. 8(c), reference character 100b designates the SAGFET fabricated using the method according to the embodiment 2. The SAGFET has the same structure as the FET 100a according to embodiment 1.

Figure 6:
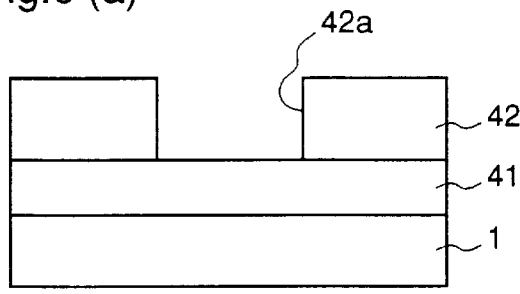
FIGS. 6(a)–6(d) illustrate formation steps of a channel region.
FIGS. 6(e)–6(f) partially illustrate formation steps of the refractory metal gate electrodes for illustrating a fabrication method according to an embodiment 2 of the present invention.
Figure 6:
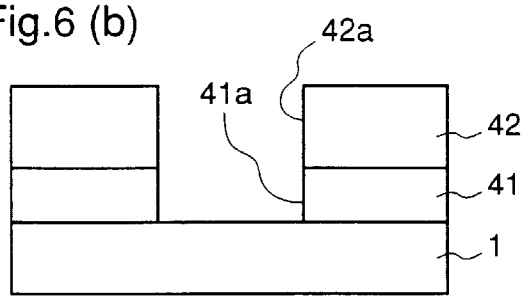
Figure 6:
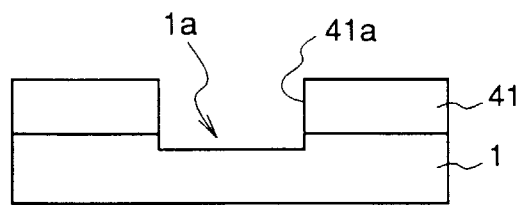
Figure 6:
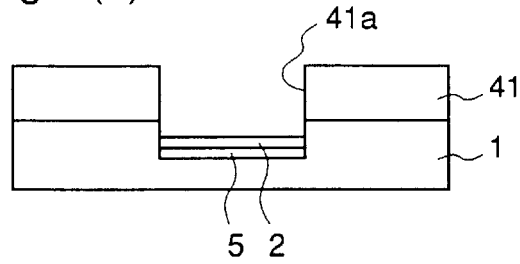
Figure 6:
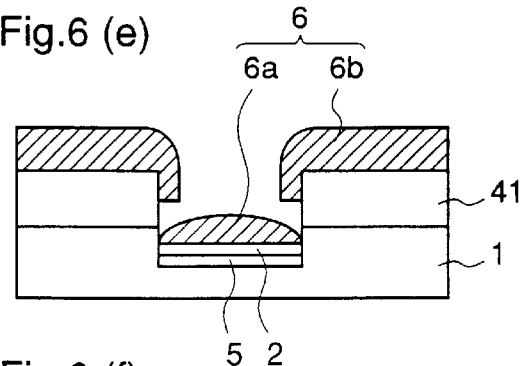
Figure 6:
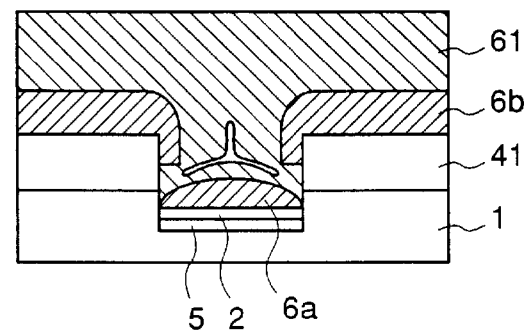

A description will be given of the fabrication method. As illustrated in FIG. 6(a), after formation of an insulating film 41 and a resist 42 on a compound semiconductor substrate 1 and formation of an opening pattern in the resist 42, as in the case of embodiment 1 illustrated in FIGS. 3(b)–3(e), a refractory metal material 6 is deposited over the entire surface in such a manner that the discontinuity thereof occurs in the upper portion of the opening 42a of the insulating film (FIGS. 6(b)–6(e)).

As illustrated in FIG. 6(f), an SiN film is deposited over the entire surface as an insulating film 61 by plasma CVD. The thickness of the insulating film 61 is about 1 μm, sufficient to make the opening 41a of the insulating film even. An SiN film resistant to hydrofluoric acid is employed as the insulating film 61. An SiN film highly-resistant to hydrofluoric acid is obtained by increasing the ratio of gas flow rate $SiH_4/NH_3$ by plasma CVD and making the film Si-rich when the film is formed.

Figure 7:
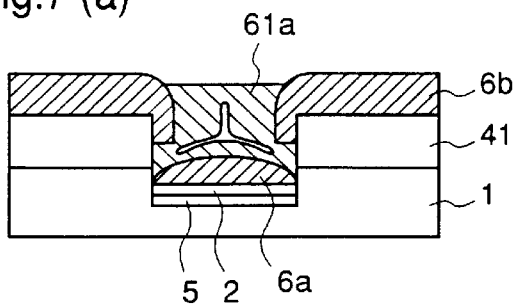
FIGS. 7(a) and 7(b) partially illustrate formation steps of the refractory metal gate electrode.
FIGS. 7(c)–7(d) illustrate formation steps of n' source and drain diffusion regions.
FIGS. 7(e)–7(f) illustrate $n^+$ source and drain diffusion regions for illustrating the fabrication method according to the embodiment 2.
Figure 7:
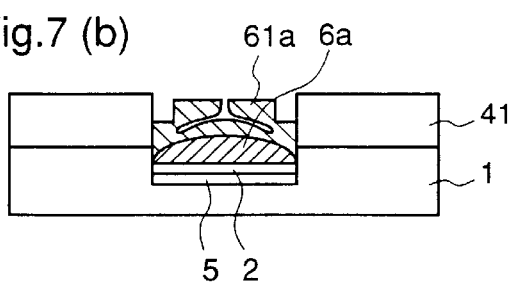
Figure 7:
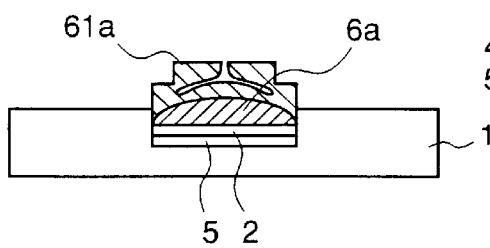
Figure 7:
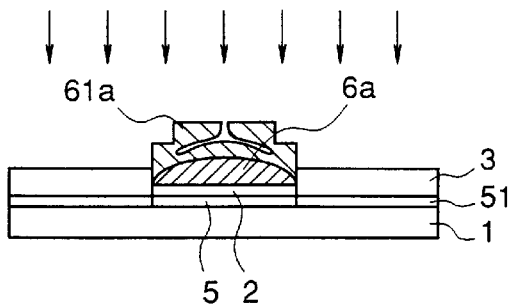
Figure 7:
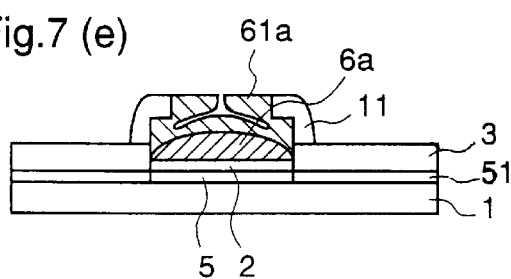
Figure 7:
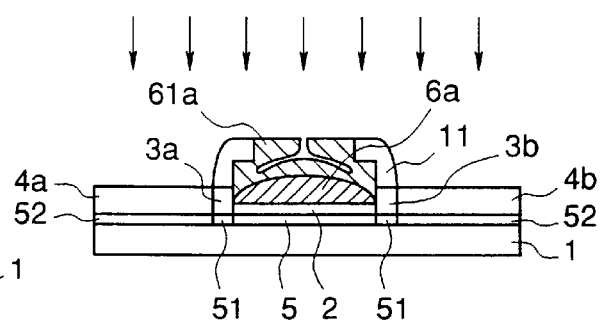

Thereafter, as illustrated in FIG. 7(a), the insulating film 61, i.e., the Si-rich SiN film is etched using an etching technique that provides a high uniformity across a wafer, such as RIE or ECR etching using $CHF_3+O_2$ and the etching is stopped when the refractory metal thin film 6b on the insulating film 41 is exposed. Since the ratio of the insulating film 61a filling the opening 41a of the insulating film to the entire surface of the wafer is small, light emission from CO during the etching is suddenly reduced when the refractory metal thin film 6b is exposed. If the light emission from CO is monitored during the etching and the etching is stopped upon detection of the sudden reduction of the light emission from CO, a portion 61a buried in the opening 41a of the insulating film 61, i.e., the Si-rich SiN film, is left controllably.

As illustrated in FIG. 7(b), the insulating film 61a, i.e., the Si-rich SiN film and the refractory metal thin film 6b, is etched. As the etching technique, plasma etching, ECR etching or RIE is employed. At this time, the insulating film 61a and the refractory metal thin film 6b are etched at the same speed. As an etching gas, $SF_6$ or $CF_4+O_2$ is employed. The etching is stopped after over-etching for several tens of seconds (about 3000 Å thick in terms of film thickness) from the point (end point) when the insulating film 41 is exposed. The end point of the etching is easily detected by monitoring light emission from F radicals or light emission from SiF.

As illustrated in FIG. 7(c), the insulating film 41 is selectively removed with respect to the insulating film 61a, comprising the Si-rich SiN film, with hydrofluoric acid. The selectivity is 20 or more, the insulating film 61a comprising the Si-rich SiN film is left as a dummy gate. As illustrated in FIG. 7(d), Si ions are implanted to form the n' diffusion regions 3a, 3b and Mg ions are implanted to form the p' diffusion region 51. The Si ions are implanted at a high energy of about 100 KeV in accordance with the depth of the recess 1a so that the bottoms of the n' diffusion regions 3a, 3b are coplanar with the bottom of the n diffusion region. The dose of the Si ions depends on the desired breakdown voltage and transconductance of the elements. The Mg ions are implanted at an accelerating energy of about 300 KeV and a dose of about $5\times10^{12}$ $cm^{-2}$ as in formation of the p diffusion region.

As illustrated in FIG. 7(e), after depositing an $SiO_2$ film over the entire surface as the insulating film in which a side wall is formed with ease, the $SiO_2$ film is etched using ECR or RIE, to leave the $SiO_2$ film as a side wall only in a side wall of the insulating film 61a. If the thickness of the insulating ($SiO_2$) film formed over the entire surface is 5000 Å, the width of the side wall 11 becomes 0.3 μm.

As illustrated in FIG. 7(f), Si ions are implanted to form the $n^+$ diffusion regions 4a, 4b and Mg ions are implanted to form the p" diffusion regions 52. The Si ions are implanted at a high energy of about 100 KeV, in accordance with the depth of the recess 1a so that the bottoms of the $n^+$ diffusion regions 4a, 4b are coplanar with the bottoms of the n diffusion region 2 and the n' diffusion regions 3a, 3b. The dose of the Si ions depends on the desired breakdown voltage and transconductance of the elements. The Mg ions are implanted at an accelerating energy of about 300 KeV and a dose of about $5\times10^{12}$ $cm^{-2}$ as in formation of the p diffusion region 5.

As illustrated in FIG. 8(a), the insulating film 61a and the side wall 11 are removed. The removal of these insulating film is performed with buffered hydrofluoric acid ($HF:NH_4F=30:1$). It is important that the refractory metal gate electrode 16a, the refractory metal gate electrode 6a and the compound semiconductor substrate 1 are not damaged and no residue is left. The etching rate of the Si-rich SiN film 61a is small, however. Since the refractory metal gate electrode 6a and the compound semiconductor substrate 1 are hardly etched with buffered hydrofluoric acid, only the insulating film 61a on the metal gate electrode 6a and the insulating film 11 as the side wall are removed.

As illustrated in FIG. 8(b), an insulating film 7 for passivation is deposited over the entire surface. Preferably, the insulating film 7 has a stress of $1\times10^9$ $dyn/cm^2$ or less between the substrate and the same. For example, the SiON film formed by plasma CVD is employed.

Finally, the insulating film 7 is etched using a resist (not shown) having openings corresponding to regions where source and drain electrodes are to be formed, as a mask, to form openings 7a, 7b of the insulating film. Thereafter, evaporation and lift-off of ohmic metals, i.e., source and drain electrodes 8a, 8b, are performed, followed by sintering, whereby an FET 100b is completed (FIG. 8(c)).

The fabrication method of embodiment 2 includes the fabrication process of the source and drain regions as follows. After formation of the dummy gate 61a positioned self-alignedly in the opening 41a of the insulating film and removal of the insulating film 41, using the dummy gate 61a, a first selective ion implantation is performed. Thereafter, the side wall 11 is formed self-alignedly against the side wall portion of the dummy gate 61a and using the dummy gate 61a and the side wall 11 as masks, a second selective ion implantation is performed. Therefore, in addition to improvement in controlling the gate length and optimization of the p-type diffusion region, a distance between the portion where the gate electrode is to be disposed, and the $n^+$ diffusion regions 4a, 4b constituting the source and drain regions is set with high controllability, whereby variations of the source resistance and the drain breakdown voltage are suppressed.

[Embodiment 3]

A description will be given of a fabrication method according to an embodiment 3 different from those already described in the embodiments 1 and 2. FIGS. 9(a)–9(f), 10(a)–10(f) and 11(a)–11(f) illustrate a structure of the FET in cross-section in the fabrication process for illustrating a fabrication method of an SAGFET according to the embodiment 3. In the FIG. 11(f), reference character 100c designates the SAGFET fabricated using the method according to the embodiment 3. The SAGFET has the same structure as the FETs 100a and 100b already described in the first and second embodiments.

Figure 9:
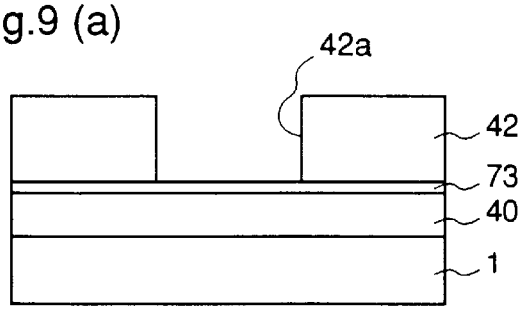
FIGS. 9(a)–9(d) illustrate formation steps of a channel region.
FIGS. 9(e)–9(f) illustrate formation steps of the refractory metal gate electrode for illustrating a fabrication method of the SAGFET according to the embodiment 3.
Figure 9:
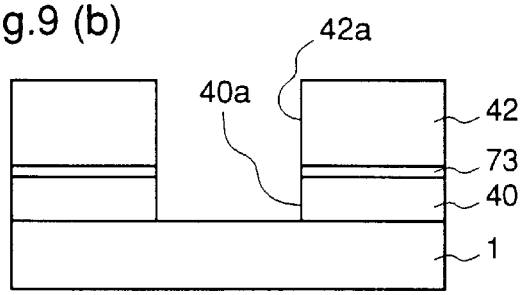
Figure 9:
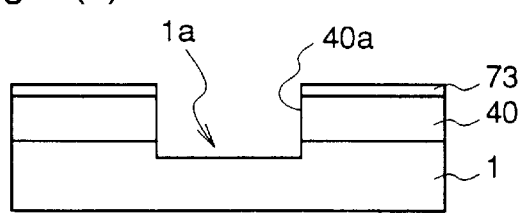
Figure 9:
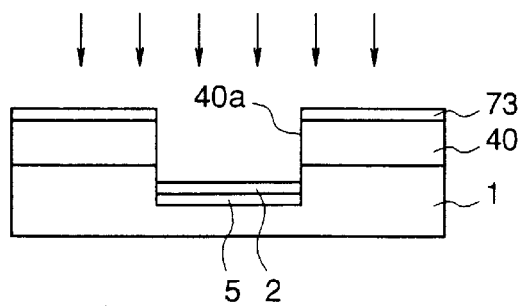
Figure 9:
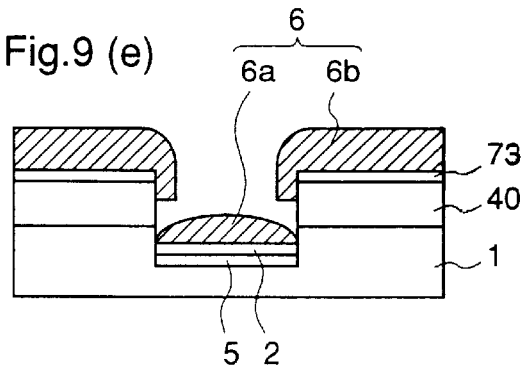
Figure 9:
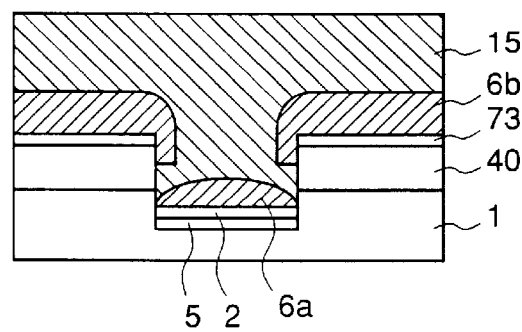

A description will be given of a fabrication method. As illustrated in FIG. 9(a), after an insulating film 40 is deposited over the compound semiconductor substrate 1 to a thickness of about 6000 Å, and an insulating film 73 is deposited to a thickness of about 500 Å, a first resist 42 having a prescribed pattern opening 42a is formed. An SiN film as the insulating film 40 and an SiO film as the insulating film 73, are employed.

As illustrated in FIG. 9(b), using the resist 42 as a mask, the insulating film 73 and the insulating film 40 are etched to form an opening 40a of the insulating film. As the etching technique, ECR etching using $CHF_3+O_2$ is employed, which is essential to etching perpendicular to the substrate surface.

As illustrated in FIG. 9(c), after removal of the resist 42, using the insulating films 73, 40 as masks, a surface of the compound semiconductor substrate 1 is selectively etched to form a recess 1a about 500 Å deep. The recess may be formed before the resist 42 is removed. Preferably, as an etching technique to form the recess in the compound semiconductor substrate 1, dry etching using $Cl_2$ is employed. FIG. 9(c) illustrates the recess 1a formed by dry etching perpendicular to the substrate surface.

Thereafter, as in the case of embodiment 1 illustrated in FIGS. 3(d)–3(f), FIGS. 4(a)–4(c), the refractory metal region 6a, i.e., a gate electrode, is formed in the recess 1a of a substrate surface (FIGS. 9(d)–9(f), FIGS. 10(a)–10(c)).

Figure 10:
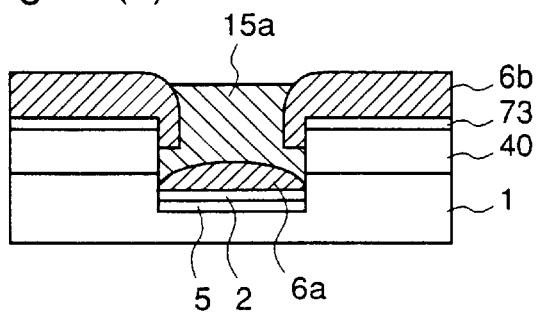
FIGS. 10(a) and 10(b) partially illustrate formation steps of the refractory metal gate electrode and FIGS. 10(c)–10(f) partially illustrate formation steps of n' source and drain diffusion regions for illustrating the fabrication method of the fabrication method of the SAGFET according to the embodiment 3.
Figure 10:
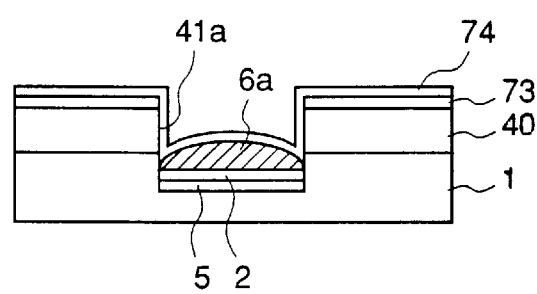
Figure 10:
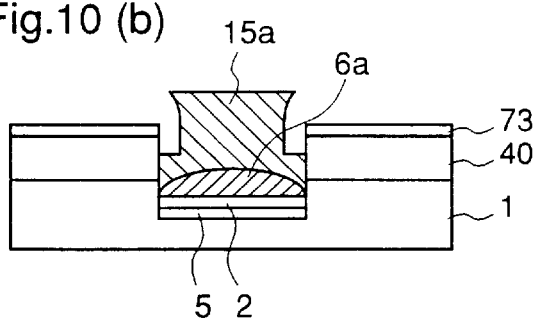
Figure 10:
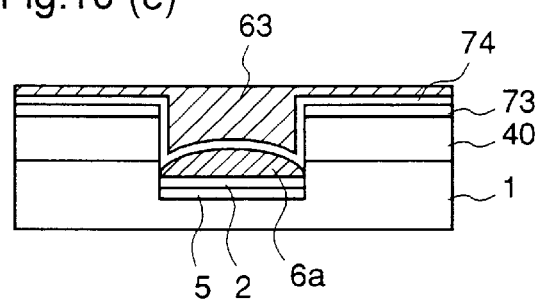
Figure 10:
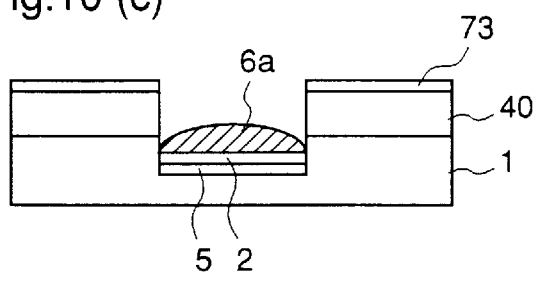
Figure 10:
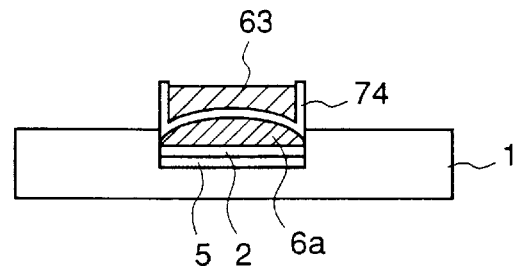

As illustrated in FIG. 10(d), an SiO film is deposited to a thickness of about 1000 Å by plasma CVD as an insulating film 74. The thickness of the insulating film 74 is sufficient to cover the upper surface of the refractory metal thin film 6a in the opening 40a of the insulating film.

As illustrated in FIG. 10(e), SOG as an insulating material for formation of a film is applied over the entire surface of the wafer to form the insulating film 63, followed by etching. An etching process which provides a high uniformity across the wafer, such as RIE using $CHF_3+O_2$, ECR or the like is employed until the insulating film 40 is exposed. Thereafter, $CHF_3+O_2$ is switched to $SF_6$. As a result, as illustrated in FIG. 10(f), the insulating film 40 and the insulating films 73, 74 thereon are removed, leaving the insulating films 74 and 63 only on the refractory metal thin film 6a as a dummy gate 65.

The etching gas is switched when the amount of light emission from CO during the etching changes. This is because the light emission from CO is suddenly reduced when the insulating film 40 is exposed. Also, since light emission from F is suddenly increased during the etching when the insulating film 40 is exposed, the etching gas is switched by monitoring the light emission from F during the etching. The etching selective ratio of the insulating film 74 comprising the SiO film formed by plasma CVD to the insulating film 63 comprising the SiO film is 20 or more, so the insulating films 74 and 63 are left on the gate electrode 6a as the dummy gate 65.

Thereafter, as illustrated in FIG. 11(a), Si ions are implanted to form n' diffusion regions 3a, 3b and Mg ions are implanted to form a p' diffusion region 51. The energy of the Si ion implantation is set at a high energy of 100 KeV, in accordance with the depth of the recess 1a so that the bottoms of the n' diffusion regions 3a, 3b are coplanar with the bottom of the n diffusion region 2. The dose depends on the desired breakdown voltage and transconductance of the elements. The Mg ions are implanted at an accelerating energy of 300 KeV and a dose of about $5\times10^{12}$ $cm^{-2}$ as in formation of the p diffusion region 5.

As illustrated in FIG. 11(b), after depositing the $SiO_2$ film in which a side wall is formed with ease over the entire surface, the $SiO_2$ film is etched using ECR etching or RIE, to leave the same only against a side wall of the dummy gate comprising the insulating films 74 and 63, as a side wall 64. If the thickness of the $SiO_2$ film is 5000 Å, the width of the sidewall 11 becomes 0.3 µm.

As illustrated in FIG. 11(c), Si ions are implanted to form the $n^+$ diffusion regions 4a, 4b and Mg ions are implanted to form the p" diffusion regions 52. The Si ions are implanted at a high energy of about 100 KeV in accordance with the depth of the recess 1a so that the bottoms of the $n^+$ diffusion regions 4a, 4b are coplanar with the bottoms of the n diffusion region 2 and the n' diffusion regions 3a, 3b. The dose of the Si ions depends on the desired breakdown voltage and transconductance of the elements. The Mg ions are implanted at an accelerating energy of 300 KeV and a dose of $5\times10^{12}$ $cm^{-2}$ as in formation of the p' diffusion region 5.

As illustrated in FIG. 11(d), the insulating films 63 and 74 on the gate electrode 6a and the side wall 64 are removed with buffered hydrofluoric acid ($HF:NH_4F=30:1$). It is important that the refractory metal gate electrode 6a and the compound semiconductor substrate 1 are not damaged and no residue is left. Since the insulating films 63, 74 constituting the dummy gate and the insulating film 64 constituting the side wall are $SiO_2$ films, the etching rate is as high as 1000 Å/min, so that only the insulating films 63, 64 and 74 are removed with the refractory gate electrode 6a and the compound semiconductor substrate 1 hardly etched.

As in the case of embodiment 1 illustrated in FIGS. 5(c), 5(d), an insulating film 7 for passivation and source and drain electrodes 8a, 8b are formed (FIGS. 11(e), 11(f)).

The fabrication method of the embodiment 3 includes the fabrication steps of the source and drain regions as follows. After formation and etching of the insulating films 63 and 74 having an etching selectivity with respect to the insulating film 41 to form the dummy gate 65 in the opening 41a of the insulating film 41 and selectively etching the insulating film 41 using the dummy gate 65 as a mask, a first selective ion implantation is performed using the dummy gate 65 as a mask. Thereafter, the side wall 64 is formed self-alignedly on the side wall portion of the dummy gate 65. Using the dummy gate 65 and the side wall 64 as masks, a second selective ion implantation is performed. As a result, a rectangular parallelepiped dummy gate whose side surface is perpendicular to the substrate surface is formed, and a distance between the portion where the gate electrode is to be disposed and the n diffusion regions 4a, 4b constituting the source and drain regions is set by the side wall 64. Since the dummy gate has the rectangular parallelepiped shape, controllability of the width of the sidewall 64 is improved, whereby higher controllability of a distance between an edge of the gate electrode 6a and the $n^+$ diffusion regions 4a, 4b is obtained as compared with the embodiment 2.

[Embodiment 4]

FIGS. 12(a)–12(f), FIGS. 13(a)–13(f) and FIGS. 14(a)–14(e) illustrate a structure of the FET in cross-section in a fabrication process for illustrating a semiconductor device FET according to an embodiment 4 of the present invention. In FIG. 14(e), reference character 100d designates an SAG-FET mounted in an MMIC for amplifying power of the embodiment 4. In the figure, the same reference numerals as in FIG. 2 designate the same or corresponding parts of the FET 100a of embodiment 1. In this FET 100d, a gate electrode 6d has a side wall $6d_1$ which has a top higher than surfaces of the $n^+$ diffusion regions 4a, 4b at both sides of the recess 1a. The outer surface of the side wall 6d1 contacts the entire side surface of the recess 1a. In other respects, the FET 100d has the same structure as the FET 100a according to embodiment 1.

In such a structure of the gate electrode 6d, in addition to improvement of controllability of the gate length and optimization of the p type diffusion region, the following effects are attained.

In the FET 100d according to the embodiment 4, since a side surface of the recess 1a contacts the gate electrode 6d, an electric field does not concentrate around the edge of the gate electrode unlike the FET 100a according to embodiment 1 wherein points of the gate electrode contact the side wall of the recess 1a when a gate voltage is applied. On application of the gate voltage, a depletion region extends to the side wall of the recess 1a of the n' diffusion regions 3a, 3b around the edge of the gate electrode, so that the channel is hardly made narrower and a channel breakdown voltage is hardly deteriorated as compared with the embodiment 1. In the FET 100a according to the embodiment 1, the contacting area of the gate electrode 6a and the n' diffusion regions 3a, 3b is small, so that capacitance between the gate and the source, and the gate and drain are small, whereby superior high frequency properties are obtained.

Figure 12:
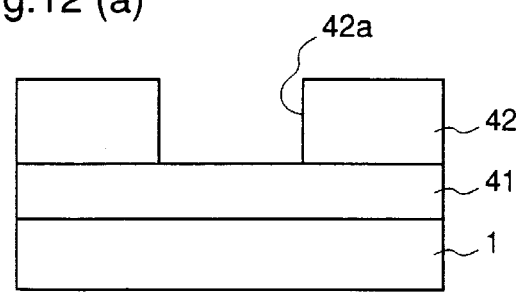
FIGS. 12(a)–12(d) illustrate formation steps of a channel region.
FIGS. 12(e)–12(f) partially illustrate formation steps of the refractory metal gate electrode for illustrating the SAGFET according to an embodiment 4.
Figure 12:
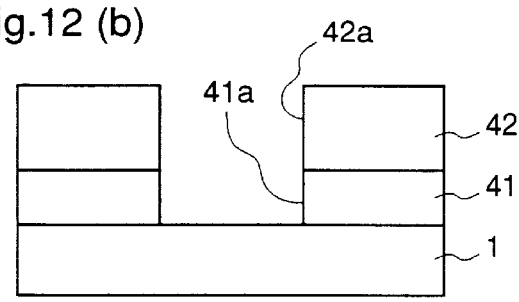
Figure 12:
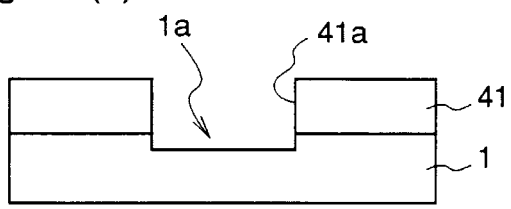
Figure 12:
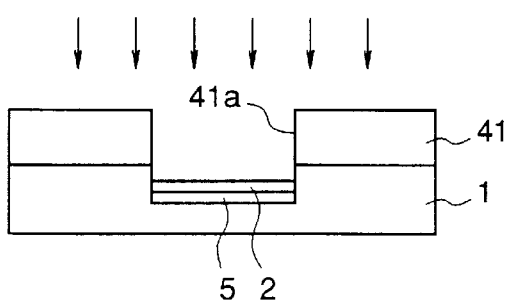
Figure 12:
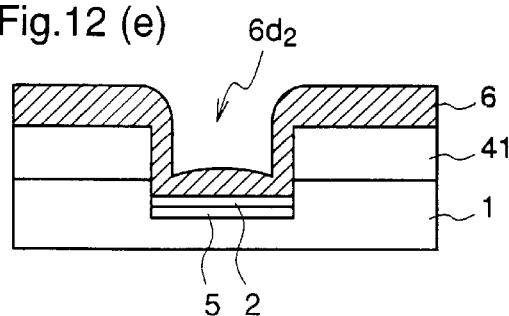
Figure 12:
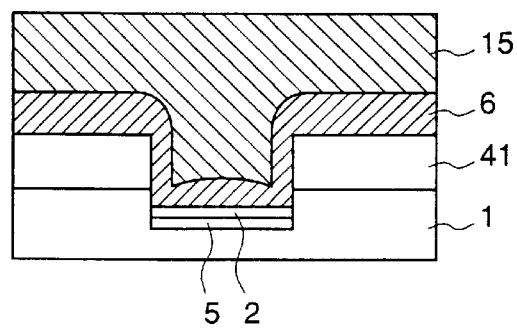

A description will be given of a fabrication method. As illustrated in FIG. 12(a), after an insulating film 41 is deposited over the compound semiconductor substrate 1 to a thickness of about 6000 Å, a resist 42 having a prescribed pattern opening 42a is formed on the insulating film 41. Next, as illustrated in FIG. 12(b), using the resist 42 as a mask, the insulating film 41 is etched to form an opening 41a. As the insulating film 41, an SiO film is employed. As an etching technique, ECR etching is employed, which is essential to vertical etching, using $CHF_3+O_2$.

Thereafter, as in the case of the embodiment 1 illustrated in FIGS. 3(c), 3(d), the recess 1a about 500 Å deep is formed in the compound semiconductor substrate 1 (FIG. 12(c)) and the n diffusion region 2 and the p diffusion region 5 are formed at the bottom of the recess 1a (FIG. 12(d)).

As illustrated in FIG. 12(e), the refractory metal thin film 6 is deposited over the entire surface in such a manner that no discontinuity thereof occurs in the upper portion of the opening 41a of the insulating film. The refractory metal thin film 6 has a single region structure comprising W, WSi, WSiN, WN or TiW, or a laminated structure having a combination of these materials. The combination of these materials in the laminated structure is identical to that already described in the fundamental principle of the present invention.

As a deposition method of the refractory metal thin film 6, preferably sputter deposition is employed. The pressure in sputter deposition is made lower than normal and the refractory metal thin film 6d is thickened to 5000 Å or more so that no discontinuity thereof occurs by depositing the same sufficiently over the side wall of the opening 41a. For example, the pressure is 1 mTorr and a distance to the gate is 20 cm. The refractory metal thin film 6d left in the recess 1a as the gate electrode provides an arched-top surface.

As illustrated in FIG. 12(f), a second resist 15 is applied to a thickness about 1 $\mu$m, sufficient to make the recess of the refractory metal thin film 6d corresponding to the recess 1a even.

Figure 13:
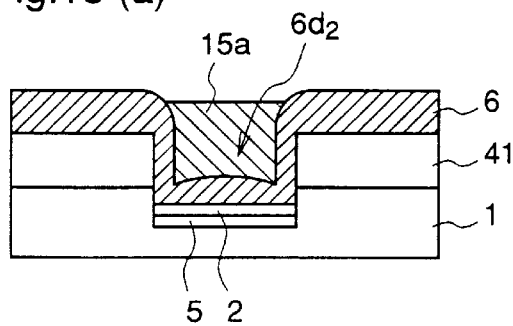
FIGS. 13(a) and 13(b) partially illustrate formation steps of the refractory metal gate electrode.
FIGS. 13(c)–13(e) illustrate formation steps of n' source and drain diffusion region and FIG. 13(f) partially illustrates formation steps of the $n^+$ source and drain diffusion regions for illustrating the fabrication method the SAGFET according to the embodiment 4.
Figure 13:
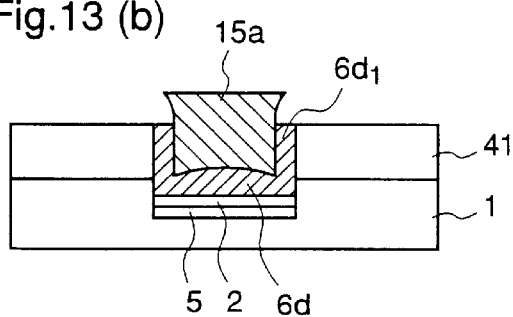
Figure 13:
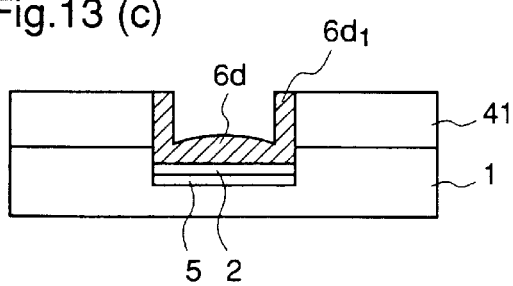
Figure 13:
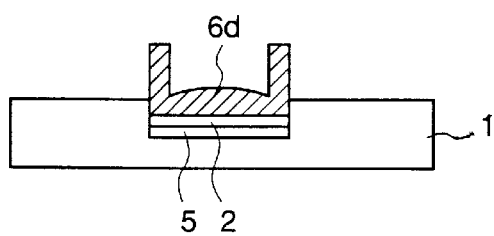
Figure 13:
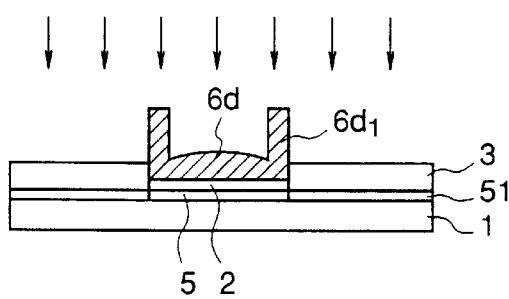
Figure 13:
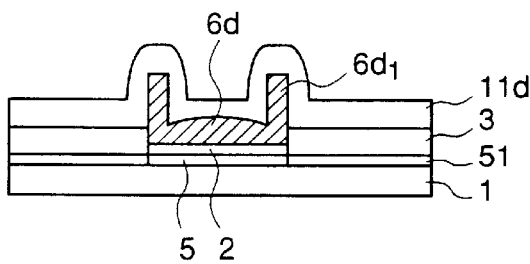
Figure 14:
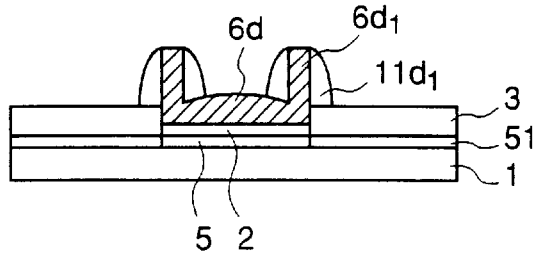
FIGS. 14(a) and 14(b) partially illustrate formation steps of $n^+$ source and drain diffusion regions and FIGS. 14(c)–14(e) illustrate formation steps for illustrating the fabrication method of the SAGFET according to the embodiment 4.
Figure 14:
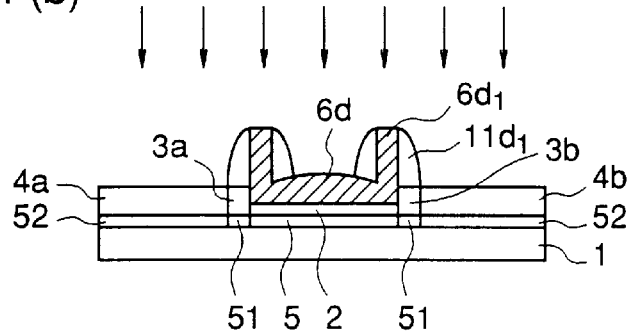
Figure 14:
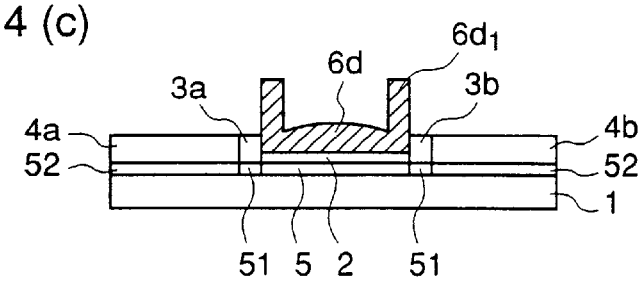
Figure 14:
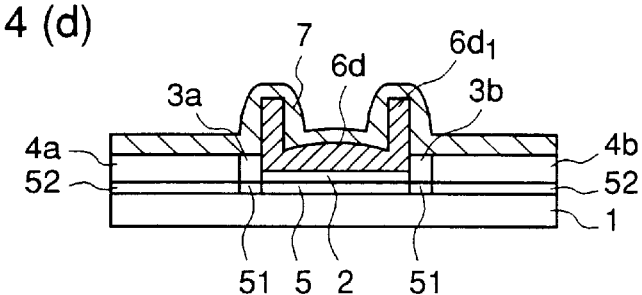
Figure 14:
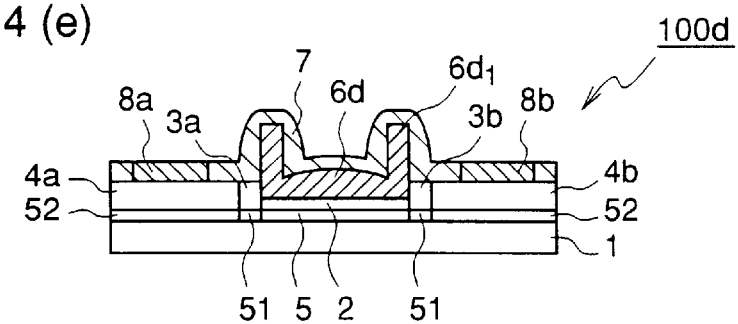
Figure 15:
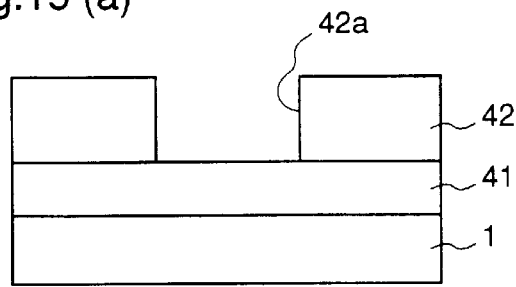
FIGS. 15(a)–15(d) illustrate formation steps of a channel region.
FIGS. 15(e)–15(f) partially illustrate formation steps of the refractory metal gate electrode for illustrating the fabrication method of the SAGFET according to an embodiment 5.
Figure 15:
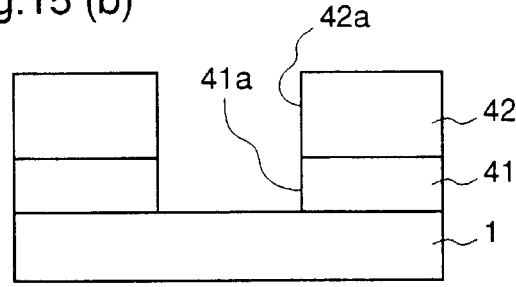
Figure 15:
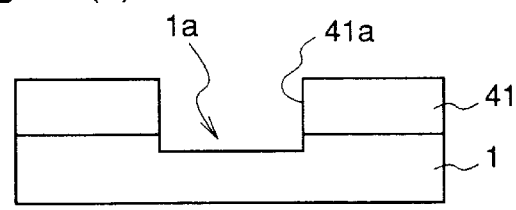
Figure 15:
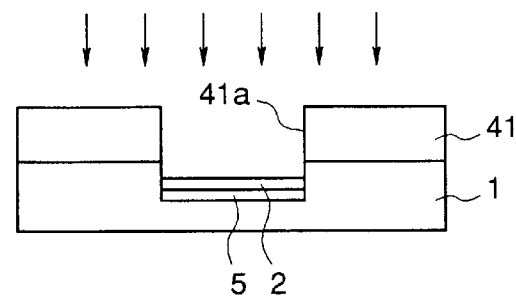
Figure 15:
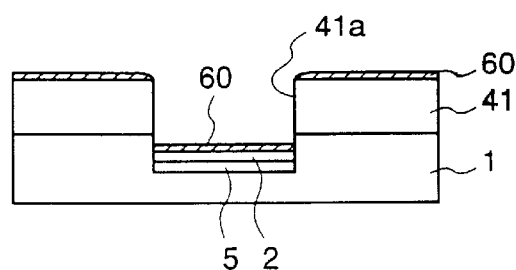
Figure 15:
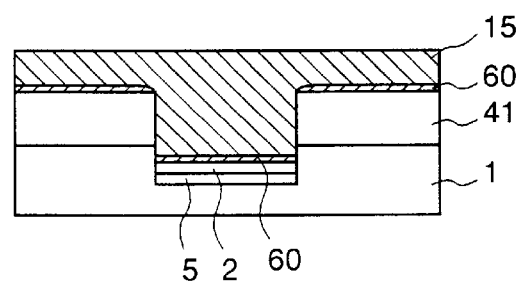
Figure 16:
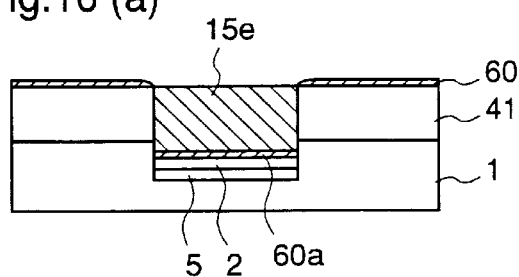
FIGS. 16(a)–16(d) partially illustrate formation steps of the refractory metal gate electrode and FIGS. 16(e)–16(f) illustrate formation steps of n' source and drain diffusion regions.
Figure 16:
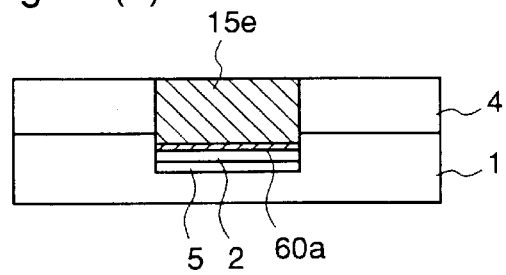
Figure 16:
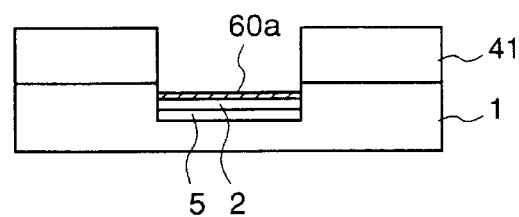
Figure 16:
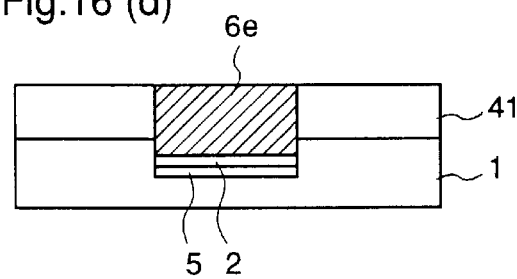
Figure 16:
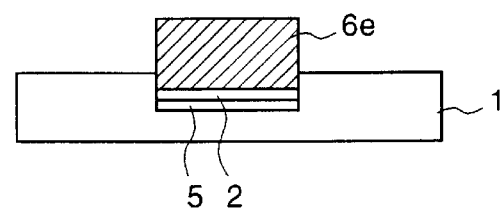
Figure 16:
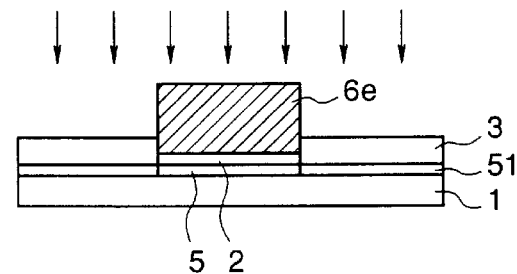

As illustrated in FIG. 13(a), the second resist 15 is etched using an etching technique that provides a high uniformity across a wafer, such as $O_2$ ashing. The etching is stopped when the refractory metal thin film 6 is exposed. Since the ratio of the resist 15a filling the recess $6d_2$ of the refractory metal thin film to the entire surface of the wafer is small, light emission from CO is suddenly reduced when the refractory metal thin film 6 is exposed, so that if the light emission from CO is monitored during the etching and the etching is stopped upon detection of sudden reduction of light emission from CO, the resist 15a is left in the recess 6 $d_2$ with high controllability.

As illustrated in FIG. 13(b), using the resist 15a as a mask, the refractory metal film 6 is etched. Plasma etching, ECR etching or RIE is employed to selectively etch the refractory metal thin film 6 with respect to the resist 15a. As an etching gas, $SF_6$ or $CF_4+O_2$ is employed. The etching is stopped when the insulating film 41 is exposed. The end point of the etching is easily detected by monitoring light emission from F radicals or light emission from SiF. In the etching of the refractory metal thin film 6, a portion thereof is left on the side surface of the opening 41a as the side wall $6d_1$ of the gate electrode.

As illustrated in FIG. 13(c), after removal of the second resist 15a, the insulating film 41 is selectively etched with buffered hydrofluoric acid (HF:$NH_4F$=30:1). It is important that the refractory metal gate electrode 6d and the compound semiconductor substrate 1 are not damaged and no residue is left.

As illustrated in 13(e), Si ions are implanted to form n' diffusion regions 3a, 3b and Mg ions are implanted to form p' diffusion regions 51. The energy of the Si ion implantation is set at a high energy of 100 KeV in accordance with the depth of the recess 1a so that the bottoms of the n' diffusion regions 3a, 3b are coplanar with the bottom of the n diffusion region 2. The dose depends on the desired breakdown voltage and transconductance of the elements. The Mg ions are implanted at an accelerating energy of 300 KeV and a dose of about $5\times10^{12}$ cm$^{-2}$.

As illustrated in FIG. 13(f), after depositing an $SiO_2$ film lid in which a side wall is formed easily over the entire surface, the $SiO_2$ film lid is etched using ECR etching or RIE. The etching is stopped after etching a prescribed amount of the film, to leave a portion on the side wall $6d_1$ of the refractory metal thin film 6d. If the thickness of the insulating film ($SiO_2$) formed over the entire surface is 5000 Å, the width of the sidewall 11 becomes about 0.3 $\mu$m.

As illustrated in FIG. 14(b), Si ions are implanted to form n$^+$ diffusion regions 4a, 4b and Mg ions are implanted to form p" diffusion regions 52. The energy of the Si ion implantation is set at a high energy of 100 KeV in accordance with the depth of the recess 1a so that the bottoms of the n$^+$ diffusion regions 4a, 4b are coplanar with the bottom of the n diffusion region 2. The dose depends on the desired breakdown voltage and transconductance of the elements. The Mg ions are implanted at an accelerating energy of 300 KeV and a dose of about $5\times10^{12}$ cm$^{-2}$.

As illustrated in FIG. 14(c), the sidewall $11d_1$, is removed with buffered hydrofluoric acid (HF:$NH_4$=30:1). At this time, it is important that the refractory metal gate electrode 6d and the compound semiconductor substrate 1 are not damaged and no residue is left. Since the side wall $11d_1$ comprises an $SiO_2$ film, the etching rate of the buffered hydrofluoric acid is as high as 100 Å/min, so that the refractory metal gate electrode 6d and the compound semiconductor substrate 1 are hardly etched.

As illustrated in FIG. 14(d), an insulating film 7 for passivation is deposited over the entire surface. Preferably, the insulating film 7 has a stress of $1\times10^9$ dyn/cm$^2$ or less between the substrate and the same. For example, an SiON film formed by plasma CVD is employed.

Finally, the insulating film 7 is etched using a resist (not shown) having openings corresponding to regions where source and drain electrodes are to be formed, as a mask, to form openings 7a, 7b of the insulating film. Thereafter, evaporation and lift-off of an ohmic metal is performed to form source and drain electrodes 8a, 8b in the openings 7a, 7b, followed by sintering, whereby an FET 100d is completed (FIG. 14(e)). The source and drain electrodes 8a, 8b have a structure in which an AuGe based alloy is laminated on an Ni region to reduce a contact resistance.

The fabrication method of the embodiment 4 includes forming the insulating film 41 having the opening 41a in the semiconductor substrate 1; forming the recess 1a which has the same plane pattern as the opening 41a; subsequently to this, depositing the refractory metal material to form the refractory metal region in such a manner that no discontinuity thereof occurs in the upper portion of the opening 41a; removing the refractory metal region on the insulating film 41 by etch-back to leave the refractory metal region in the opening 41a of as the gate electrode 6d; and after removal of the insulating film 41, forming the n' source and drain diffusion regions 3a, 3b at both sides of the recess 1a. Therefore, selective etching of the refractory metal region with poor controllability is not employed to form the refractory metal gate electrode 6d, whose side surface contacts the entire gate electrode-side end surface of the n' source and drain diffusion regions, having the same plane pattern as the recess 1a with high precision and with ease.

[Embodiment 5]

FIGS. 15(a)–15(f), FIGS. 16(a)–16(f) and FIGS. 17(a)–17(b) illustrate a structure of an FET in cross-section in fabrication process, for illustrating an FET according to an embodiment 5.

Figure 17:
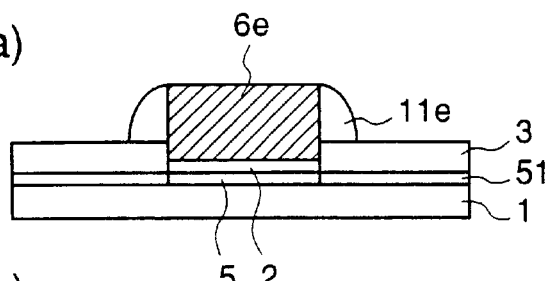
FIGS. 17(a) and 17(b) illustrate formation steps of the $n^+$ source and drain diffusion regions and FIGS. 17(c)–17(e) illustrate formation steps of source and drain regions, illustrating the SAGFET according to the embodiment 5.
Figure 17:
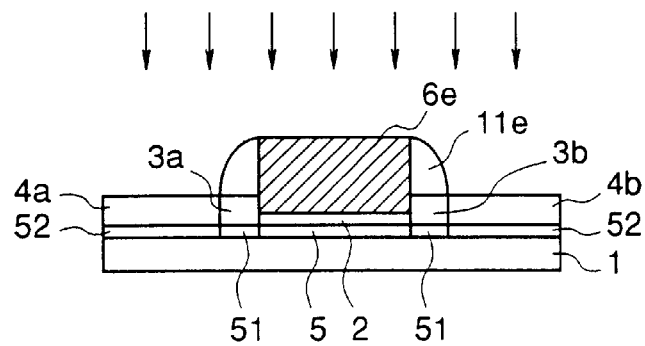
Figure 17:
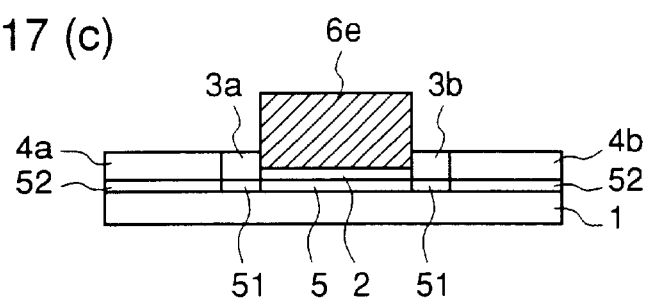
Figure 17:
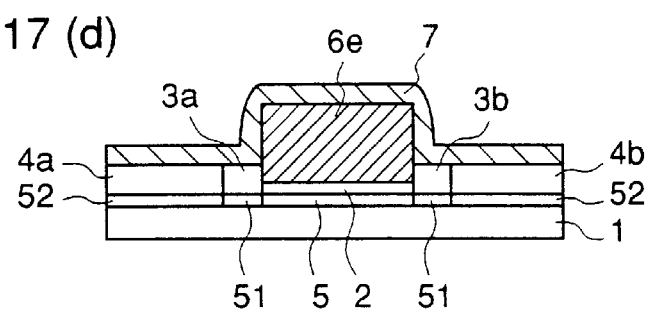
Figure 17:
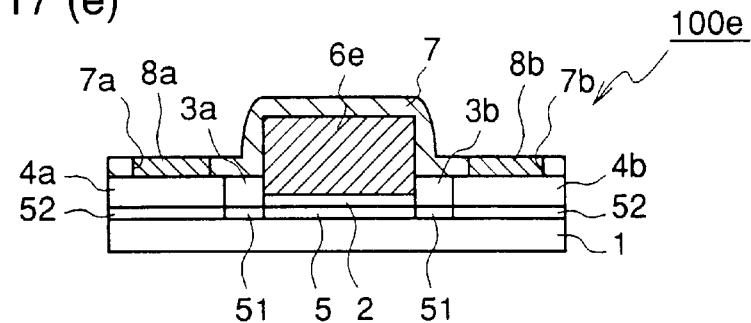

In FIG. 17(e), reference character 100e designates an SAGFET mounted in an MMIC for amplifying power according to the embodiment 5. In the figure, the same reference characters as in FIG. 2 designate the same or corresponding parts. The FET 100e differs from the FET 100a of embodiment 1 in that a gate electrode 6e has a rectangular parallelepiped shape, that is, a side wall of the recess 1a contacts with the gate electrode 6e.

In the FET 100e according to embodiment 5, since the gate electrode 6e has the rectangular parallelepiped shape, it has advantages as follows. In the FET 100e according to the embodiment 5, since a side wall of the recess 1a contacts the gate electrode 6e, an electric field does not concentrate around the edge of the gate electrode unlike the FET 100a according to embodiment 1 when a gate voltage is applied. On application of the gate voltage, a depletion region extends to the side wall of the recess 1a of the n' diffusion regions 3a, 3b around the edge of the gate electrode 6e, so that a channel is hardly made narrower and a channel breakdown voltage is hardly deteriorated. In the FET 100a according to embodiment 1, the contacting area of the gate electrode 6a and the side wall of the recess 1a is small, so that capacitances between the gate and source and between the gate and drain are small, and superior high frequency is obtained.

In the FET 100e according to embodiment 5, since the gate electrode 6e has a rectangular parallelepiped shape, the cross section of the gate electrode 6e is larger than that of the gate electrode of the FET according to embodiment 4 and a low-resistance gate electrode is obtained. Further, in the FET 100e, variations of the break down voltage of the FET are suppressed as compared with embodiment 4. This is because higher controllability of the width of the side wall lie formed self-alignedly on the side surface of the gate electrode 6e is obtained and reproducibility of the widths of the n' diffusion regions 3a, 3b is increased as compared with the a structure of the gate electrode 6e according to embodiment 4, by the fact that the gate electrode 6e has a rectangular parallelepiped shape.

A description will be given of a fabrication method. As illustrated in FIG. 15(a), after forming the insulating film 41 and the resist 42 on the compound semiconductor substrate 1, and forming the prescribed pattern opening 42a in the resist 42, as in the case of embodiment 1 illustrated in FIGS. 3(b)–3(d), the n diffusion region 2 and the p diffusion region 5 are formed at the bottom of the recess 1a (FIGS. 15(b)–15(d)).

As illustrated in FIG. 15(e), the refractory metal material is deposited over the entire surface to form the refractory metal thin film 60. The refractory metal material is deposited thinly so that it is hardly deposited in an inner wall of the opening 41a of the insulating film on the recess 1a. As the deposition method, preferably sputter deposition is employed. The thickness of the film is made 1000 Å or less.

The refractory metal thin film 60 has a single region structure comprising W, WSi, WSiN, WN or TiW, or a laminated structure having a combination of these materials. The combination of these materials in the laminated structure is identical to that of the refractory metal thin film 6 already described in the fundamental principle of the present invention.

As illustrated in FIG. 15(f), the second resist 15 is applied to a thickness of about 1 $\mu$m, enough to make the opening 41a of the insulating film even. The second resist 15 is resistant to RIE.

As illustrated in FIG. 16(a), the second resist 15 is etched using an etching technique that provides a high uniformity across a wafer, such as $O_2$ ashing. The etching is stopped when the refractory metal film 60 is exposed. Since the ratio of the resist 15e filling the opening 41a to the entire surface of the wafer is small, light emission from CO is suddenly reduced when the refractory metal thin film 60 is exposed. Therefore, if the light emission from CO is monitored during the etching and the etching is stopped upon detection of sudden reduction of the light emission from CO, the resist 15e is left with high controllability.

As illustrated in FIG. 16(b), using the resist 15e in the opening 41a as a mask, the refractory metal thin film 60 is etched. An etching technique such as plasma etching, ECR etching or RIE is employed to selectively etch the refractory metal thin film 60 with respect to the resist 15e. As an etching gas, $SF_6$ or $CF_4+O_2$ is employed. The etching is stopped when the insulating film 41 is exposed. The end point of the etching is easily detected by monitoring light emission from F radicals or light emission from SiF. The refractory metal thin film 60 is hardly deposited over the side wall of the opening of the insulating film on the recess 1a, so that just-etching is not necessarily required and a little over-etching is not problematic.

As illustrated in FIG. 16(c), after removal of the second resist 15e, a refractory metal thin film 60a is left thinly on the substrate in the opening 41a. As illustrated in FIG. 16(d), using a method such as a selective CVD of tungsten (hereinafter referred to as W-CVD), tungsten is selectively deposited on the refractory metal thin film 60a exposed in the opening 41a to fill the opening 41a. The refractory metal thin film 60a formed thinly on the substrate surface in the opening 41a is for selectively depositing tungsten only in the opening 41a using the W-CVD.

As illustrated in FIG. 16(e), the insulating film 41 is etched with buffered hydrofluoric acid ($HF:NH_4F=30:1$). It is important that the refractory metal film filling the opening of the insulating film, i.e., the refractory metal gate electrode 6e and the compound semiconductor substrate 1 are not damaged and no residue is left.

As illustrated in FIG. 16(f), Si ions are implanted to form the n' diffusion regions 3a, 3b and Mg ions are implanted to form the p' diffusion region 51. The implantation energy of Si ions is set at a high energy of 100 KeV in accordance with the depth of the recess 1a so that the bottoms of the n' diffusion regions 3 where Si ions are implanted are coplanar with the bottom of the n diffusion region 2. The dose of Si ions depends on the desired breakdown voltage and transconductance of the elements. The Mg ions are implanted at an accelerating energy of 30 KeV and a dose of about $5\times10^{12}$ cm$^{-2}$ as in formation of the p diffusion region 5.

As illustrated in FIG. 17(a), after depositing an SiO$_2$ film in which a side wall is formed with ease over the entire surface, the SiO$_2$ film is etched using ECR etching or RIE. The etching is stopped when the SiO$_2$ film is left over a side wall of the refractory metal film 6e as the gate electrode. If the thickness of the insulating film (SiO$_2$) formed over the entire surface is 5000 Å, the width of the sidewall 11 becomes 0.3 μm.

As illustrated in FIG. 17(b), Si ions are implanted to form the n$^+$ diffusion regions 4a, 4b and Mg ions are implanted to form the p" diffusion region 52. The Si ions are implanted at a high energy of about 100 KeV in accordance with the depth of the recess 1a so that the bottoms of the n$^+$ diffusion regions 4a, 4b are coplanar with the bottoms of the n diffusion region 2 and the n' diffusion region 3. The dose of the Si ions depends on the desired breakdown voltage and transconductance of the elements. The Mg ions are implanted at an accelerating energy of 300 KeV and a dose of $5\times10^{12}$ cm$^{-2}$ as in formation of the p' diffusion regions 51.

As illustrated in FIG. 17(c), the insulating film lie as the side wall is removed with buffered hydrofluoric acid (HF:NH$_4$=30:1). At this time, it is important that the refractory metal gate electrode 6e and the compound semiconductor substrate 1 are not damaged and no residue of the insulating film is left. Since the side wall lie comprises the SiO$_2$ film, the etching rate is as high as 1000 Å/min. so that the refractory metal gate electrode 6e and the compound semiconductor substrate 1 are hardly etched by the buffered hydrofluoric acid.

As illustrated in FIG. 17(d), the insulating film 7 for passivation is deposited over the entire surface. Preferably, the insulating film 7 has a stress of $1\times10^9$ dyn/cm$^2$ or less between the substrate and the same to suppress the short channel effect. An SiON film formed using plasma CVD is employed, for example.

Finally, using a resist (not shown) having openings corresponding to regions where source and drain electrodes are to be formed as a mask, the insulating film 7 is etched to form the openings 7a, 7b therein. Thereafter, the source and drain electrodes 8a, 8b are formed by the evaporation and lift-off technique of an ohmic metal, followed by sintering, whereby the FET 100e is completed. The source and drain electrodes 8a, 8b have a structure with an AuGe based alloy laminated on an Ni region to reduce a contact resistance.

The fabrication method of embodiment 5 includes forming the insulating film 41 having the prescribed pattern opening 41a on the semiconductor substrate 1; forming the recess 1a which has the same plane pattern as the opening 41a of the insulating film in the surface of the semiconductor substrate; subsequently to this, selectively forming the refractory metal thin film 60 only at the bottom of the recess 1a of the semiconductor substrate; and filling the opening 41a of the insulating film with the refractory metal material to form the gate electrode 6e using the selective CVD. Therefore, etching of the refractory metal region with poor controllability to form the refractory metal gate electrode 6e is not employed. In addition, the gate electrode 6e having a rectangular parallelepiped shape, whose side surface contacts the entire gate-electrode side end surface of the n' source and drain diffusion regions 3a, 3b is formed, having the same plane pattern as the recess 1a, with high precision and with ease.

Figure 18:
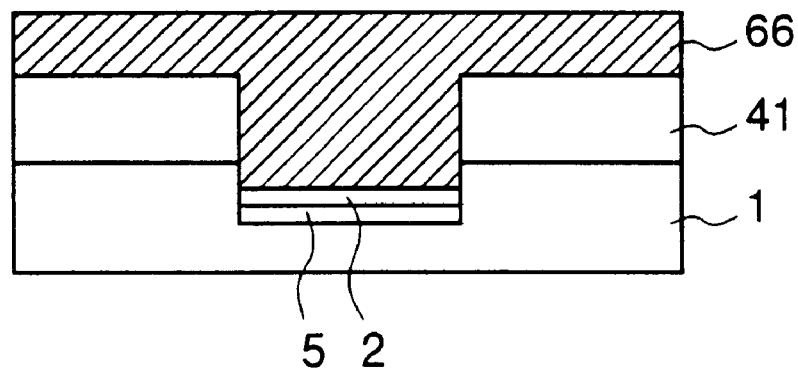
FIGS. 18(a) and 18(b) illustrate formation steps of a gate electrode different from those in the fabrication method of the SAGFET according to the embodiment 5.
Figure 18:
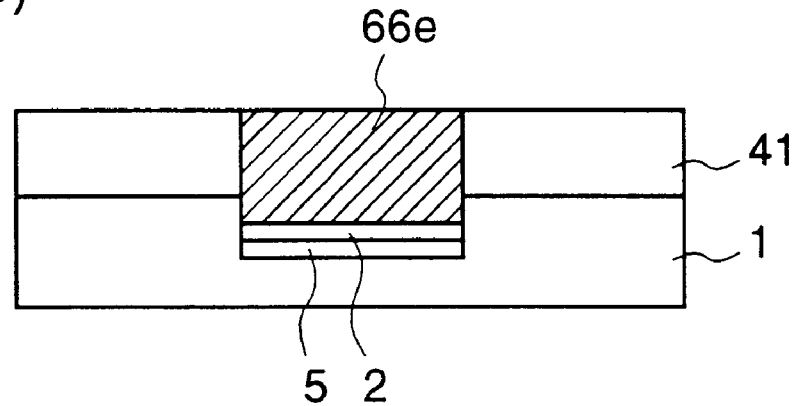

The process step illustrated in FIGS. 15(e)–16(d) according to the embodiment 5 may be replaced by the following steps. As illustrated in FIG. 15(d), ions are selectively implanted into the opening 41a to form the n diffusion region 2 and the p diffusion region 5 at the bottom of the recess 1a. Thereafter, as illustrated in FIG. 18(a), the refractory metal material is deposited over the entire surface to fill the opening 41a with the same using a bias sputter, forming the refractory metal film 66. Thereafter, as illustrated in FIG. 18(b), the refractory metal film 66 is etched back to leave the refractory metal film in the opening 41a as the gate electrode 66e. In this case, the etching of the refractory metal film 66 is stopped when the insulating film 41 is exposed.

In the method of filling the opening 41a with the refractory metal film 66 using biased sputtering, the process steps are reduced but the substrate surface exposed in the recess 1a is more damaged as compared with embodiment 5 using selective CVD, so that embodiment 5 is more preferable from the point of FET properties.

In embodiments 1 to 5, a low-resistance gate electrode is not realized. When using a high frequency, a low-resistance metal is laminated on the gate electrode made of the refractory metal to realize a low-resistance gate electrode, thereby increasing high frequency response. Thus, as conventional, the highest frequency used in a semiconductor device increases with the low-resistance metal laminated on the electrode. In fabrication process, the low-resistance metal is deposited after the electrode is exposed. These fabrication methods are described in detail in Japanese Patent Application Hei. No.6-154717.

[Embodiment 6]

FIGS. 19(a)–19(e) and FIGS. 20(a)–20(e) illustrate a fabrication process of an InP series HEMT mounted in an MMIC for amplifying power for illustrating a semiconductor device according to an embodiment 6 of the present invention and a fabrication method thereof.

Figure 20:
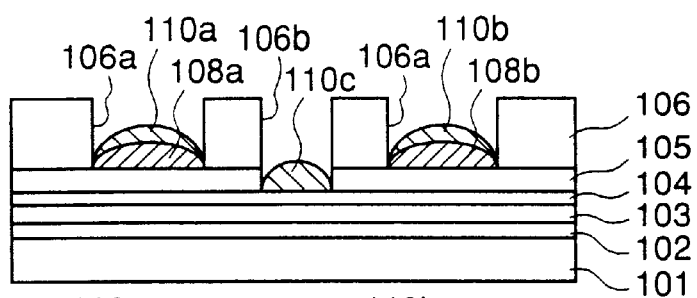
FIG. 20(a) partially illustrates a formation step of the refractory metal gate electrode.
FIGS. 20(b) and 20(c) illustrate side-etching steps of a contact region and FIGS. 20(d) and 20(e) illustrate formation steps of a low-resistance wiring electrode for illustrating the InP series HEMT according to the embodiment 6.
Figure 20:
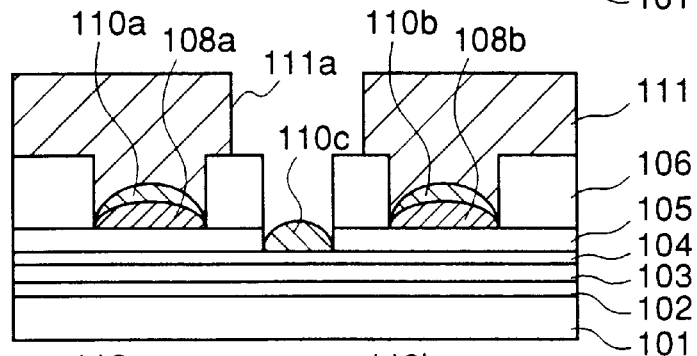
Figure 20:
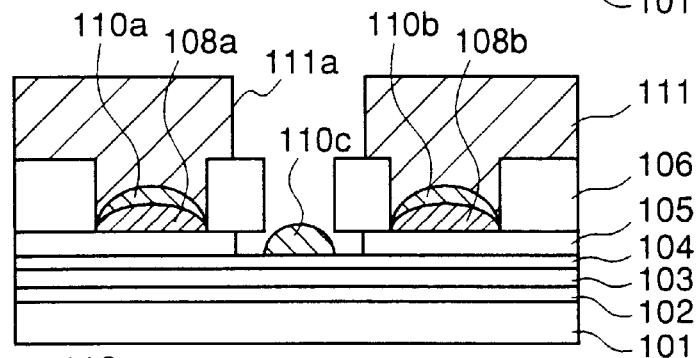
Figure 20:
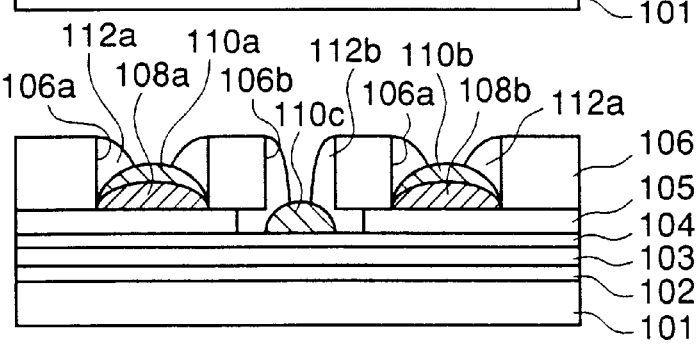
Figure 20:
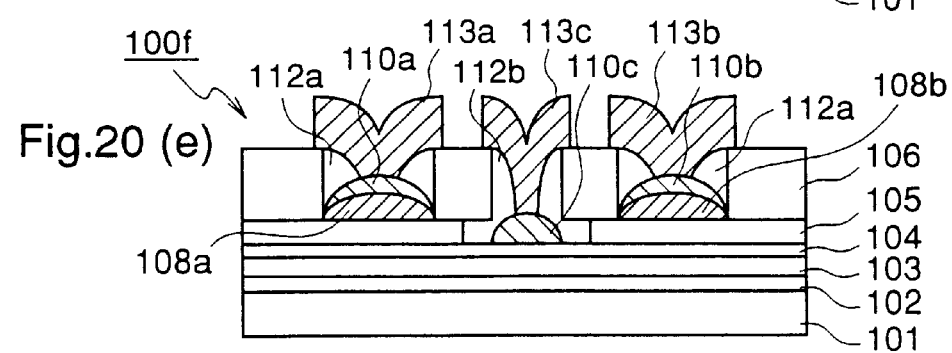

In FIG. 20(e), reference character 100f designates the InP series HEMT mounted in the MMIC for amplifying power. On the InP substrate 101, an InGaAs channel region 103 and an n-AlInAs electron supply region 104 are successively grown on an AlInAs buffer region 102. In a prescribed region on the channel region 103, a Schottky gate electrode 110c made of a refractory metal material is disposed. In a region at both sides of the gate electrode on the channel region 103, ohmic source and drain electrodes 108a, 108b made of the refractory metal are disposed through an n$^+$-InGaAs contact region 105. The electrodes 110c, 108a and 108b are located in openings of the insulating film 106 formed on the contact region 105. The insulating films 112a and 112b are buried in the openings of the insulating film 106.

On the insulating films 106, 112a and 112b, low-resistance wiring electrodes 113c, 113a and 113b with a prescribed pattern are formed, which are electrically connected to the gate electrode 110c, source and drain electrodes 108a, 108b through openings formed in the insulating films 112a, 112b.

In the HEMT 100f, a recess is formed in the contact region 105 where the gate electrode is disposed on the electron supply region 104. The gate electrode 110c is disposed in the center of the recess. The distance between the gate electrode 110c and the contact region 105 is the same on both source and drain sides.

The source and drain electrodes 108a, 108b have the same plane patterns as a region exposed in the opening 106a of the insulating film 106 in the contact region. The source and drain electrodes 108a, 108b and the gate electrode 110c are thinned gradually from central to peripheral portions and have smoothly arched-top surface shapes. In embodiment 6, the source and drain electrodes 108a, 108b and the gate electrode 110c comprise WSix having a different composition ratio X. On the source and drain electrodes 108a, 108b, refractory metal regions 110a, 110b are formed comprising WSiX having the same composition as WSix constituting the gate electrode 110c. The metal regions 110a, 110b have thicknesses reduced gradually from central to peripheral portion and have smoothly arched-top surface shapes.

The material of the source and drain electrodes 108a, 108b and the gate electrode 110c is not limited to WSix. The electrodes may have a single region structure comprising W, WSi, WSiN, WN or TiW or a laminated structure having a combination of these materials.

In the InP series HEMT 100f having such a structure, the gate electrode 110c, ohmic electrodes 108a and 108b comprise the refractory metal thin film, so that at a high temperature a reaction between the gate electrode 110c and the n-AlInAs electron supply region 104 and a reaction between the source and drain electrodes 108a, 108b and the n$^+$-InGaAs contact region 105 are suppressed.

Since the low-resistance wiring electrode 113c is formed on the gate electrode 110c, a gate resistance made higher using the refractory metal as the gate electrode material is reduced. As a result, life under a current-carrying test at a high temperature is prolonged.

The gate electrode 110c disposed in the opening 106b of the insulating film 106 has the same plane pattern as the electron supply region 104 exposed in the opening 106b of the insulating film. The source and drain electrodes 108a, 108b have the same plane patterns as the contact region 105 exposed in the opening 106a. As a result, spacings between the gate electrode 110c and the source and drain electrodes 108a, 108b are controlled by positioning the openings 106b, 106a on the electron supply region 104 and the contact region 105 with precision and with ease.

Since the gate electrode 110c, and the source and drain electrodes 108a, 108b are made of different refractory metal materials, optimal refractory metal materials are selected for the ohmic source and drain electrodes.

The insulating films 106, 112a and 112b are etched back to reduce a parasitic capacitance of the gate electrode, thereby increasing high frequency properties.

Figure 19:
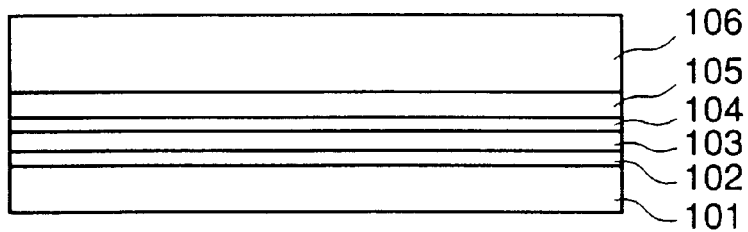
FIG. 19(a) illustrates a formation step of a structure of a semiconductor region in the HEMT.
FIGS. 19(b) and 19(c) illustrate formation steps of a refractory metal ohmic electrode and FIGS. 19(d) and 19(e) partially illustrate formation steps of the refractory metal gate electrode, illustrating the InP series HEMT according to an embodiment 6 of the present invention.
Figure 19:
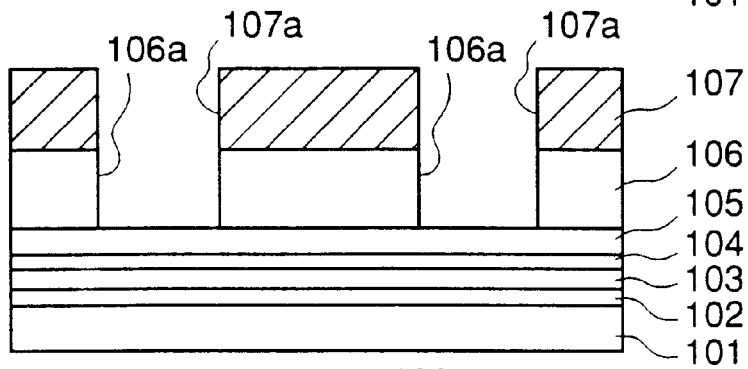
Figure 19:
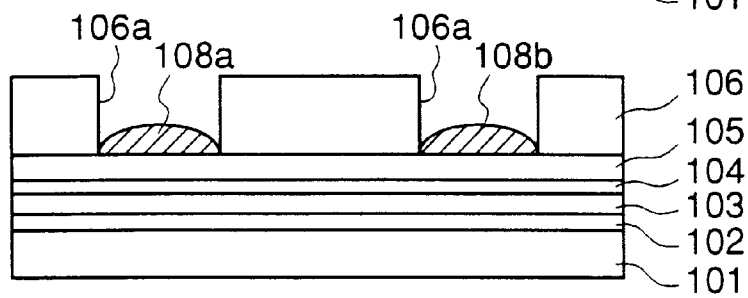
Figure 19:
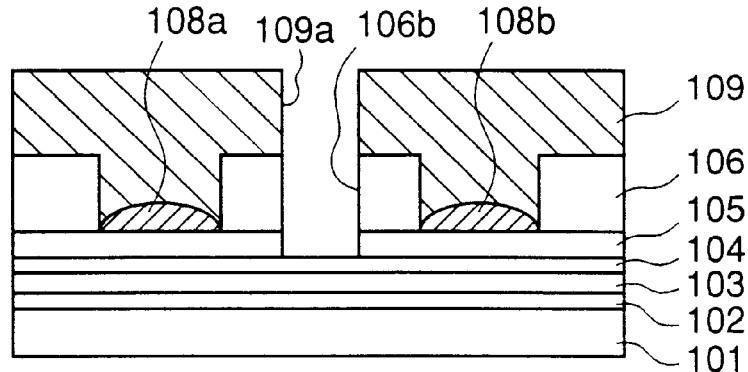
Figure 19:
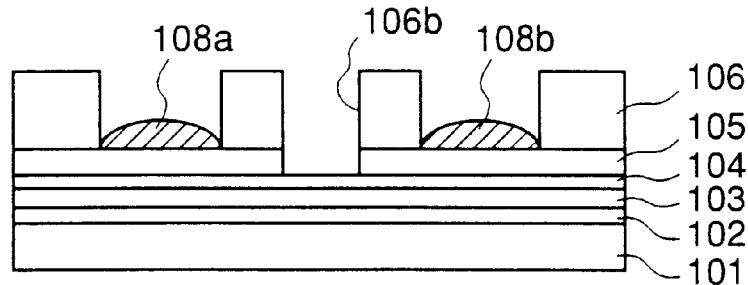

A description will be given of a fabrication method. As illustrated in FIG. 19(a), after successively growing the InGaAs region 103, the n-AlInAs region 104 and the n$^+$-InGaAs region 105 on the InP substrate 101 through the AlInAs region 102, the insulating film 106 is deposited to a thickness of about 6000 Å on the n$^+$-InGaAs region 105.

As illustrated in FIG. 19(b), after formation of a resist 107 having openings 107a corresponding to regions where the source and drain electrodes are to be disposed, using the resist 107 as a mask, the insulating film 106 is etched to form the opening 106a. As the insulating film 106, an SiO$_2$ film is employed. As an etching technique of the insulating film 106, RIE is employed, which easily etches perpendicular to the substrate surface.

After removal of the resist 107, damage and contamination of the n$^+$-InGaAs region 105 exposed in the opening 106a are removed by tartaric acid etching. Thereafter, the refractory metal film is deposited over the entire surface in such a manner that a discontinuity thereof occurs in the opening 106a of the insulating film. The refractory metal thin film has a single region structure comprising W, WSi, WSiN, WN, or TiW or a laminated structure having a combination of these materials as in the refractory metal thin film illustrated in a fabrication method of the FET already described according to the principle of the present invention.

As the deposition method of the refractory metal thin film, sputter deposition is preferable. The sputter deposition makes a smoothly arched-top surface of the refractory metal thin film in the opening 106a.

Thereafter, as in formation steps of the gate electrode of the embodiment 1, application of the resist (FIG. 3(f)), etch-back of the resist by O$_2$ ashing (FIG. 4(a)), and etching of the refractory metal thin film and removal of the resist (FIG. 4(b)) are performed to leave the refractory metal thin film in the opening 106a as the source and drain electrodes (FIG. 19(c)).

After depositing the resist 109 over the entire surface to cover the opening 106a, the opening 109a corresponding to a region where the gate electrode is to be disposed is formed in the resist 109. Thereafter, using the resist 109 as a mask, the insulating film 106 is etched to form the opening 106b. Following that, the n$^+$-InGaAs region 105 exposed in the opening 106b is etched (FIG. 19(d)). At this time, etching perpendicular to the substrate surface is performed and the etching is stopped when the n-AlInAs region 104 is exposed. Specifically, as the etching technique, ECR etching using a Cl$_2$ plus a prescribed additional gas is employed, since the ECR etching is essential to vertical etching.

The prescribed additional gas is added to Cl$_2$ to selectively etch the n$^+$-InGaAs region 105 with respect to the n-AlInAs region 104. In this case, the selectivity ratio is about 3. After the n$^+$-InGaAs region 105 is etched 80 to 100% using ECR etching, wet etching with a high selectivity ratio is performed, whereby both the vertical etching and etching with the high selectivity ratio are realized. Representative wet etching includes etching using a mixture of citric acid and an aqueous solution of a hydrogen peroxide.

After removal of the resist 109 (FIG. 19(e)), as in formation of the ohmic electrodes 108a, 108b, the refractory metal gate electrode 110c is formed on the n-AlInAs region 104 in the opening 106b of the insulating film (FIG. 20(a)). The refractory metal thin films 110a, 110b made of the refractory metal material constituting the gate electrode 110c are formed on the ohmic electrodes 108a, 108b.

As illustrated in FIG. 20(b), application and patterning of a resist is performed to form a resist film 111 having an opening 111a in a portion where the gate electrode is disposed and covering the source and drain electrodes 108a, 108b. As illustrated in FIG. 20(c), selective etching such as selective dry etching or selective wet etching is performed to side-etch the n$^+$-InGaAs region 105, etching away a gate electrode-side end surface thereof. The wet etching is superior to the dry etching in etching selectivity, so that preferably the etching is performed using a mixture of citric acid and an aqueous solution of hydrogen peroxide. Since the etching rate is about several tens of Å/min, the n$^+$-InGaAs region 105 is wet-etched with high controllability.

As illustrated in FIG. 20(d), by formation and etch back of the insulating film, side walls 112a, 112b are formed on the ohmic electrodes 108a, 108b in the opening 106a and on the gate electrode 110c in the opening 106b, respectively.

After deposition of the low-resistance metal over the entire surface, using a prescribed pattern resist as a mask, an unnecessary portion thereof is etched to form the low-resistance wiring electrodes 113a, 113b connecting the source and drain electrodes 108a, 108b and the low-resistance wiring electrode 113c connecting the gate electrode 110c, whereby the InP series HEMT 100f is completed (FIG. 20(e)).

In the fabrication method of the InP series HEMT 100f according to embodiment 6, the process steps are as follows. The refractory metal thin film is formed on the insulating film 106 having the openings 106a, 106b in such a manner that the discontinuity thereof occurs in the openings. Thereafter, the refractory metal thin film on the insulating film with the openings filled with the resist is removed to form the ohmic electrodes 108a, 108b and the gate electrode 110c made of the refractory metal. Therefore, if the refractory metal region in which solid phase reaction between the compound semiconductor region and the same is hardly observed is employed for the source, drain and gate electrodes, the patterning is performed by the discontinuity of the refractory metal region and etching of the refractory metal region is not required in the patterning. As a result, fluorine included in a fluorine based gas, i.e., a process gas of the refractory metal thin film does not diffuse into the compound semiconductor region. That is, damage and contamination of the substrate surface due to the dry etching of the refractory metal thin film are suppressed, whereby high reliability of a high power device is obtained.

[Embodiment 7]

FIGS. 21(a)–21(e) and FIGS. 22(a)–22(d) illustrate a fabrication process of an InP series HEMT mounted in an MMIC for amplifying power, for illustrating a semiconductor device according to an embodiment 7 and a fabrication method thereof.

Figure 22:
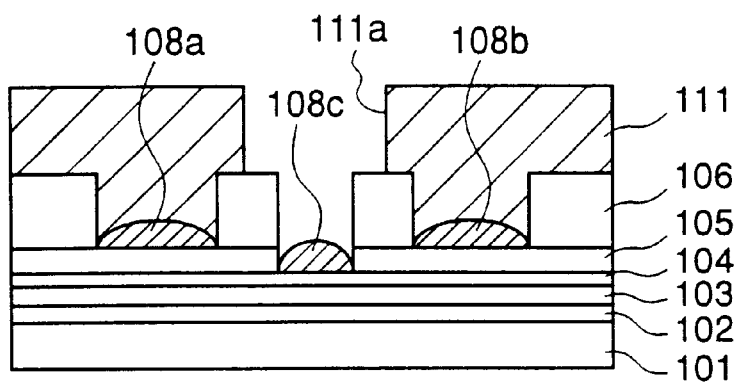
FIGS. 22(a) and 22(b) illustrate side-etching steps of a contact region.
FIGS. 22(c) and 22(d) illustrate formation steps of a low-resistance wiring electrode for illustrating the InP series HEMT according to an embodiment 7 of the present invention.
Figure 22:
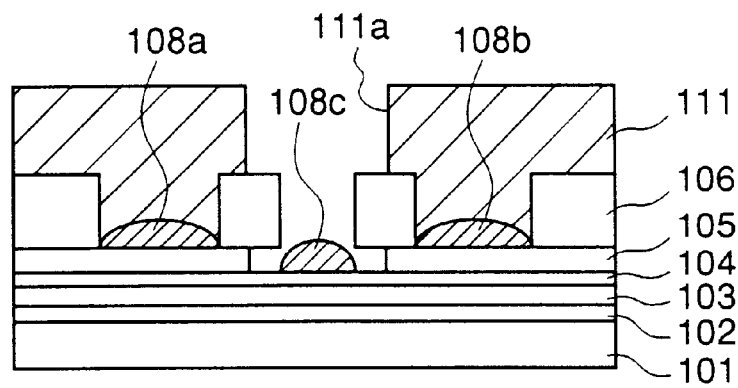
Figure 22:
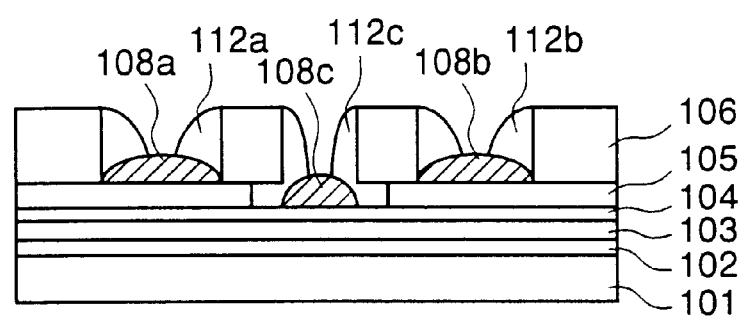
Figure 22:
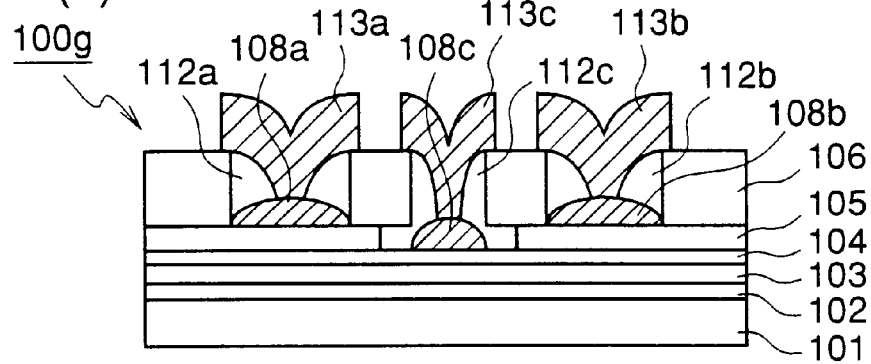

In FIG. 22(d), reference character 100g designates the InP series HEMT mounted in the MMIC for amplifying power according to embodiment 7. In the InP series HEMT 100g, a gate electrode 108c is made of the same refractory metal material as the source and drain electrodes 108a, 108b. In other respects, the InP series HEMT 100g has the same structure as the InP series HEMT 100f according to embodiment 6 illustrated in FIG. 20(e).

The source and drain electrodes may have a single region structure comprising W, WSi, WSiN, WN, or TiW or a laminated structure having a combination of these materials. The combination of these materials is the same as the gate electrode of the FET already described as the principle of the present invention.

As in embodiment 6, in the InP series HEMT 100g having such a structure, the gate electrode 108c and the ohmic electrodes 108a, 108b comprise a refractory metal thin film. Therefore, reactions between the gate electrode 108c and the n-AlInAs electron supply region 104, and the source and drain electrodes 108a and 108b and the n$^+$-InGaAs contact region 105 are suppressed.

A low-resistance wiring electrode 113c is formed on the gate electrode 108c, so that gate resistance made higher by using the refractory metal as the gate electrode material is reduced.

In this embodiment 7, plane patterns of the ohmic electrodes 108a, 108b are the same as a plane pattern of the opening 106b of the insulating film and a plane pattern of the gate electrode 108c is the same as a plane pattern of the opening 106b of the insulating film. Therefore, as in positioning the openings 106a, 106b, these electrodes are positioned with high precision and spacing between these electrodes are reduced. As a result, life under a current-carrying test at a high temperature is prolonged, and fabrication precision and yield is improved.

The gate electrode 108c and the source and drain electrodes 108a, 108b are made of the same material. Therefore, the gate, source and drain electrodes are positioned by one patterning, and spacings between the electrodes are controlled with higher precision, so that the fabrication process of these electrodes is simplified.

A description of a fabrication method follows.

Figure 21:
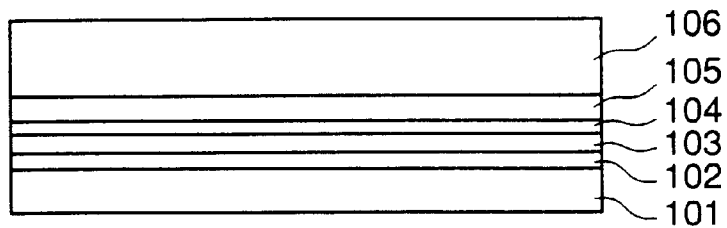
FIG. 21(a) illustrates a formation step of a semiconductor region of the HEMT and FIGS. 21(b)–21(e) illustrate formation steps of the refractory metal ohmic electrode and the refractory metal gate electrode for illustrating the InP series HEMT according to an embodiment 7 of the present invention.
Figure 21:
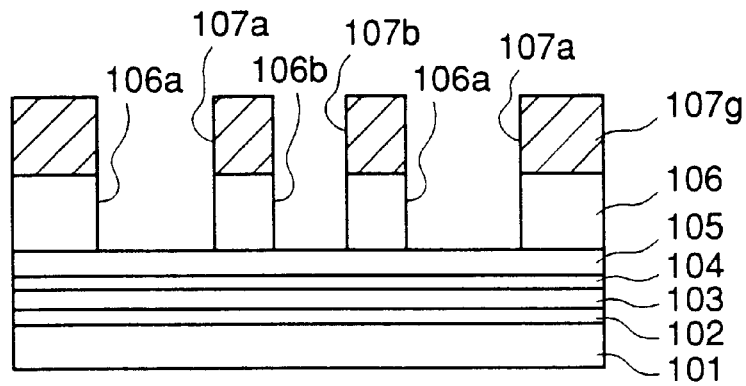
Figure 21:
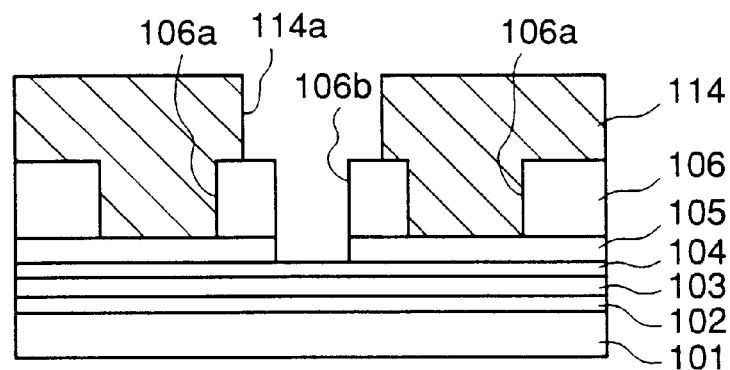
Figure 21:
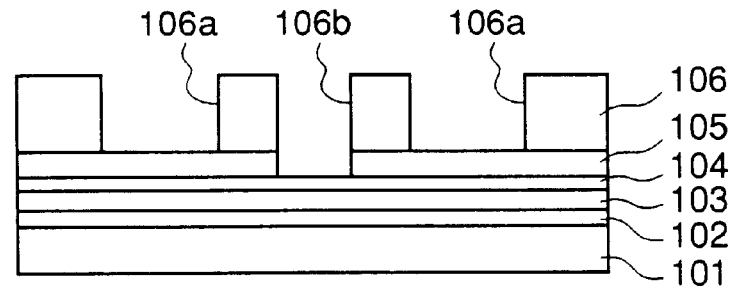
Figure 21:
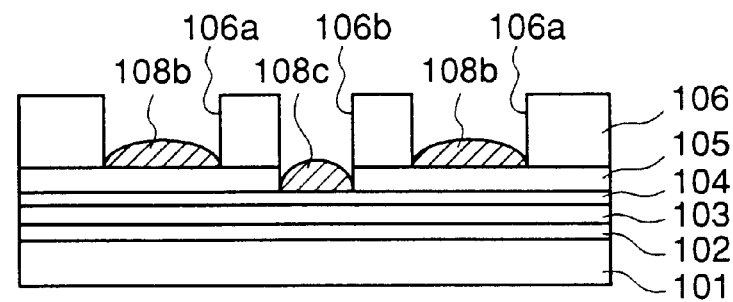

As illustrated in FIG. 21(a), after successively forming the InGaAs channel region 103, the n-AlInAs electron supply region 104 and the n$^+$-InGaAs contact region 105 on the InP substrate through the AlInAs buffer region 102, the insulating film 106 is deposited to a thickness of about 6000_.

As illustrated in FIG. 21(b), after formation of the resist 107g having the openings 107a and 107b corresponding to regions where source, drain and gate electrodes are to be disposed, using the resist 107g as a mask, the insulating film 106 is etched to form the openings 106a, 106b. As the insulating film 106, an SiO$_2$ film is employed. As an etching technique, RIE etching is employed, which easily etches perpendicular to the substrate surface.

After removal of the resist 107g, application and patterning of a resist is performed to form a resist 114 having an opening 114a including the opening 106b but covering the opening 106a corresponding to ohmic electrodes with the resist 114 (FIG. 21(c)).

The n$^+$-InGaAs region 105 exposed in the opening 106b of the insulating film is etched. Etching perpendicular to a substrate surface is performed and the etching is stopped when the n-AlInAs region 104 is exposed. Specifically, ECR etching is employed using Cl$_2$ plus a prescribed additional gas. The ECR etching is essential to vertical etching.

The prescribed additional gas is added to Cl$_2$ to selectively etch the n$^+$-InGaAs region 105 with respect to the n-AlInAs region 104. In this case, the selectivity ratio is about 3. After the n$^+$-InGaAs region 105 is etched about 80 to 100% using the ECR etching, etching with a high selectivity ratio is performed using wet etching, whereby both vertical etching and etching with a high selectivity ratio are realized. As the representative wet etching process, etching using a mixture of citric acid and an aqueous solution of hydrogen peroxide is employed.

As illustrated in FIG. 21(d), after removal of the resist 114, damage and contamination of surfaces of the contact region exposed in the opening of the insulating film and the electron supply region are removed using hydrochloric acid etching. The hydrochloric acid is employed because the n-AlInAs electron supply region 104 is exposed in the gate portion and pinch-off voltage changes when etched using tartaric acid.

The refractory metal thin film is deposited over the entire surface in such a manner that a discontinuity thereof occurs in the openings 106a, 106b. The refractory metal thin film has a single region structure comprising W, WSi, WSiN, WN, or TiW, or a laminated structure having a combination of these materials as in the gate electrode of the FET already described in the principle of the present invention. As the deposition method of the refractory metal thin film, sputter deposition is preferable. Sputter deposition makes smoothly arched-top surfaces of the refractory metal thin film 108c, i.e., the gate electrode, and the refractory metal thin films 108a, 108b, i.e., the ohmic electrodes.

As in embodiment 1, application of the resist (FIG. 3(f)), etch-back of the resist by O$_2$ ashing (FIG. 4(a)) and etching of the refractory metal thin film and removal of the resist (FIGS. 4(b), (c)) are performed to leave the refractory metal thin film in the opening 106a as the source and drain electrodes 108a, 108b, and in the opening 106b as the gate electrode 108c (FIG. 21(e)).

As in the steps illustrated by FIGS. 20(b)–20(e) of the embodiment 6, formation of the resist 111 (FIG. 22(a)), side-etching of the n$^+$-InGaAs region 105 using the resist 111 as a mask (FIG. 22(b)), formation of the side walls 112a, 112b and 112c (FIG. 22(c)), and formation of the low-resistance wiring electrodes 113a, 113b and 113c (FIG. 22(d)) are performed, whereby the InP series HEMT 100g is completed.

In the fabrication method of the InP series HEMT 100g of the embodiment 7, after the refractory metal thin film is formed on the insulating film 106 having prescribed pattern openings 106a, 106b in such a manner that the discontinuity thereof occurs in the opening, the refractory metal thin film on the insulating film is removed with the opening filled with the resist to form the ohmic electrodes 108a, 108b and the gate electrode 108c made of the refractory metal. Therefore, patterning of the refractory metal thin film is not required on the substrate, and damage and contamination of the substrate surface due to dry etching of the refractory metal thin film are avoided.

The opening 106b corresponding to a region where the gate electrode is to be disposed and the openings 106a corresponding to regions where the ohmic electrodes are to be disposed are formed in the insulating film 106 by one patterning. As a result, the openings of the insulating film for formation of these electrodes are positioned with high precision.

[Embodiment 8]

FIGS. 23(a)–23(e) and FIGS. 24(a)–24(d) illustrate a fabrication process of an InP series HEMT mounted in an MMIC for amplifying power, for illustrating a semiconductor device according to an embodiment 8 of the present invention and a fabrication method thereof.

Figure 24:
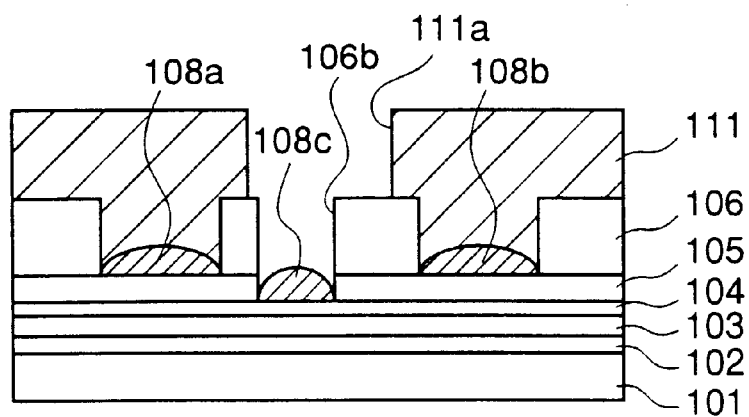
FIGS. 24(a) and 24(b) illustrate side-etching steps of the contact region.
FIGS. 24(c) and 24(d) illustrate formation steps of the low-resistance wiring electrode for illustrating the HEMT according to the embodiment 8.
Figure 24:
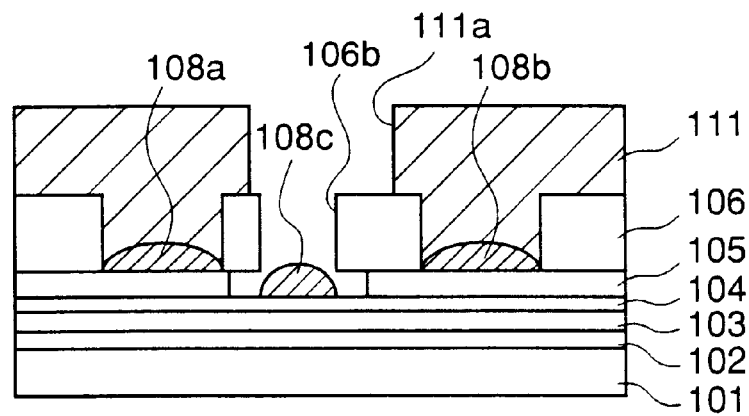
Figure 24:
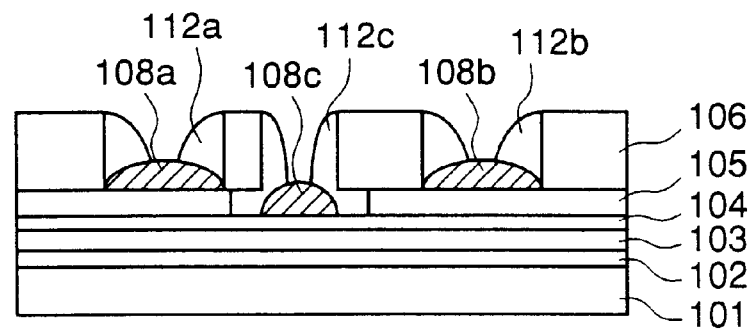
Figure 24:
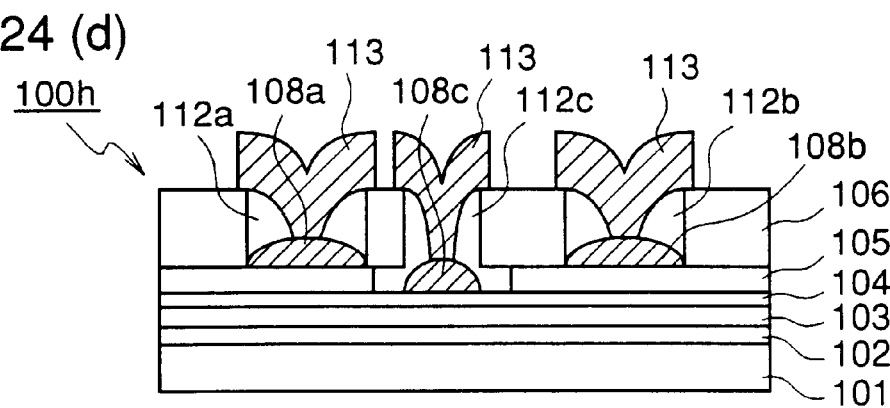

In the FIG. 24(d), reference character 100h designates the InP series HEMT mounted in the MMIC for amplifying power according to embodiment 8. In the InP series HEMT 100h, the distance between a gate electrode 108c and a source electrode 108a is smaller than the distance between the gate electrode 108c and the drain electrode 108b. In other respects, the InP series HEMT 100h has the same structure as the InP series HEMT 100g according to embodiment 7 illustrated in FIG. 22(e).

The InP series HEMT 100h according to embodiment 8 having such a structure has some advantages as follows, as in embodiment 7. First, spacings between the gate electrode 108c and the source and drain electrodes 108a, 108b are controlled with precision and with ease by positioning the openings 106a, 106b on the electron supply region 104 and the contact region 105. Secondly, reactions between the gate electrode 108c and the n-AlInAs channel region 104, and between the ohmic electrodes 108a, 108b and the n$^+$-InGaAs contact region 105 are suppressed. Thirdly, the gate resistance made higher by using the refractory metal is reduced by the low-resistance wiring electrodes 113a, 113b and 113c. In addition, gate and drain breakdown voltages are increased since the distance between the gate and the source is made smaller than the distance between the gate and the drain.

As a result, life under a current-carrying test at a high temperature is prolonged, and improvement of yield and precision in the fabrication process and breakdown voltage on the drain side are attained.

Figure 23:
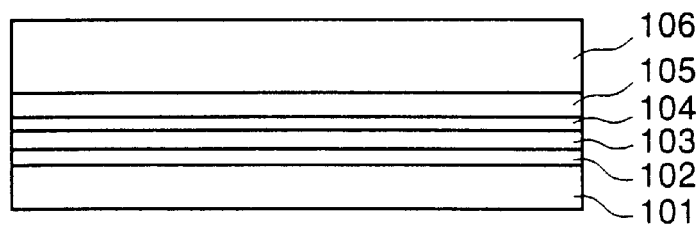
FIG. 23(a) illustrates a formation steps of the semiconductor region in the HEMT and FIGS. 23(b)–23(e) illustrate formation steps of the refractory metal ohmic electrode and the refractory metal gate electrode for illustrating the InP series HEMT according to an embodiment 8 of the present invention.
Figure 23:
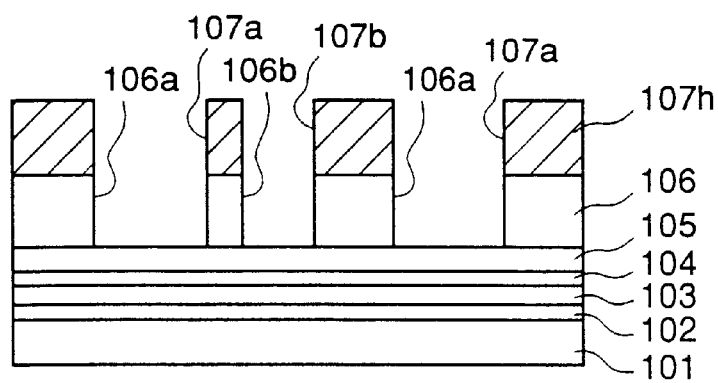
Figure 23:
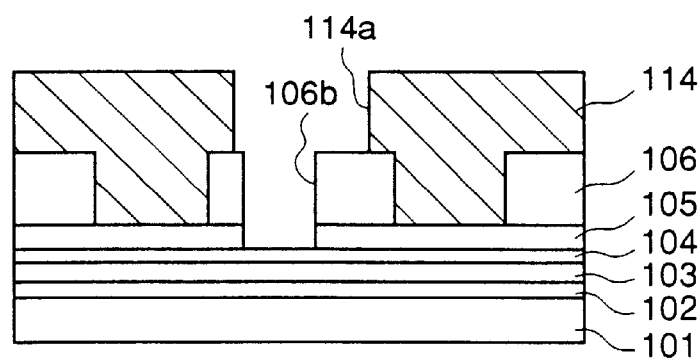
Figure 23:
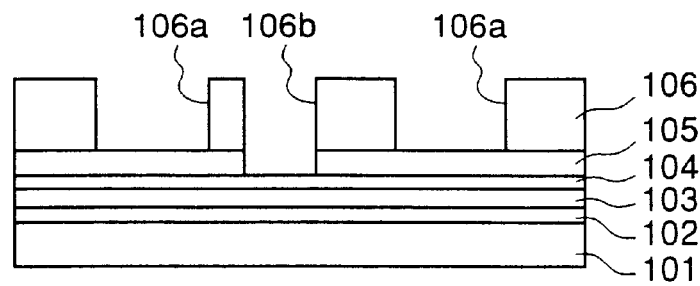
Figure 23:
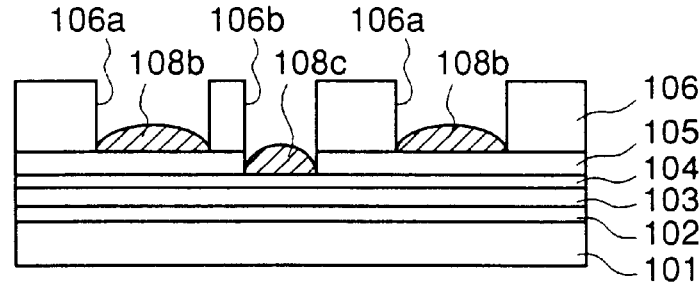

A description will be given of a fabrication method. AS illustrated in FIG. 23(a), after successively forming the InGaAs channel region 103, the n-AlInAs electron supply region 104 and the n$^+$-InGaAs contact region 105 on the InP substrate 101 through the AlInAs buffer region 102, the insulating film 106 is deposited to a thickness of about 6000 Å.

As illustrated in FIG. 23(b), after formation of the resist 107h having the openings 107a and 107b corresponding to regions where the source, drain and gate electrodes are to be disposed, using the resist 107h as a mask, the insulating film 106 is etched to form the openings 106a, 106b. In the resist 107h, the opening 107b corresponding to the gate electrode is shifted to the source side from the center of the openings 107a corresponding to the source and drain electrodes.

As the insulating film 106, an SiO$_2$ film is employed. As an etching technique, RIE is employed, which easily etches perpendicular to the substrate surface.

As in the case of embodiment 7 illustrated in FIGS. 21(c)–(e), formation of the resist 114 filling the opening 106a, etching of the n$^+$-InGaAs region 105 in the opening 106b using the resist 114 as a mask (FIG. 23(c)), removal of the resist 114 (FIG. 23(d)) and deposition of the refractory metal film for formation of the gate electrode 108c and the ohmic electrodes 108a, 108b (FIG. 23(e)) are performed.

As in the case of embodiment 7 illustrated in FIGS. 22(a)–22(d), formation of the resist 111 filling the opening 106a (FIG. 24a), side etching of the contact region 105 (FIG. 24(b)), formation of the side walls 112a, 112b and 112c in the openings 106a, 106b (FIG. 24(d)) and formation of the low-resistance wiring metals 113a, 113b and 113c (FIG. 24(d)) are performed, whereby the InP series HEMT 100h is completed.

In the fabrication method of the InP series HEMT according to embodiment 8, as in embodiment 7, damage and contamination of the substrate surface due to dry etching are suppressed when forming the electrodes.

Positions of the gate electrode 108c and the ohmic electrodes 108a, 108b are determined only by patterning in forming the openings 106a, 106b. Further, the plane patterns of the ohmic electrodes 108a, 108b are the same as the plane pattern of the opening 106a and the plane pattern of the gate electrode 108c is the same as the plane pattern of the opening 106b. Therefore, these electrodes are positioned with high precision and spacings between the gate electrode 108c and the ohmic electrodes 108a, 108b are reduced.

In the fabrication process of the openings 106a, 106b, the opening 106b corresponding to the gate electrode 108c is shifted to the source electrode side from the center of the openings 106a corresponding to the source and drain electrodes 108a, 108b, thereby fabricating a high drain breakdown voltage element.

[Embodiment 9]

FIGS. 25(a)–25(e) and FIGS. 26(a)–26(e) illustrate a fabrication process of an MIM capacitor mounted in an MMIC for amplifying power, for illustrating a semiconductor device according to an embodiment 9 of the present invention and a fabrication method thereof.

Figure 26:
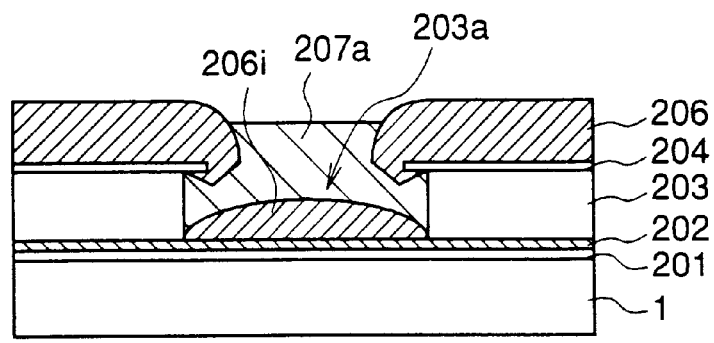
FIG. 26(a) partially illustrates a formation step of a mask for a selective etching of the ferroelectric material.
FIG. 26(b) illustrates a selective etching of ferroelectric material.
FIG. 26(c) illustrates a removal step of a mask for selective etching.
FIG. 26(d) illustrates a removal step of a mask for patterning of the dielectric region.
FIG. 26(e) illustrates a formation step of the upper electrode and FIG. 26(f) is a cross-sectional view illustrating a film bulk acoustic wave resonator according to an embodiment 19 of the present invention.
Figure 26:
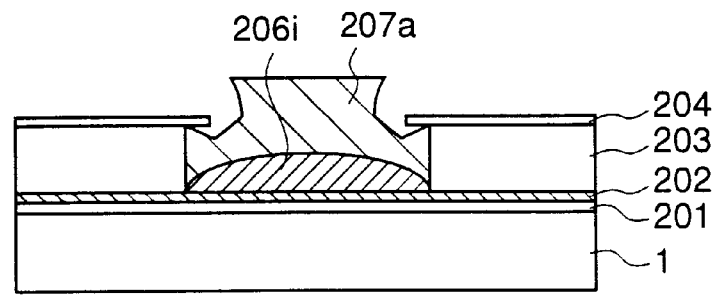
Figure 26:
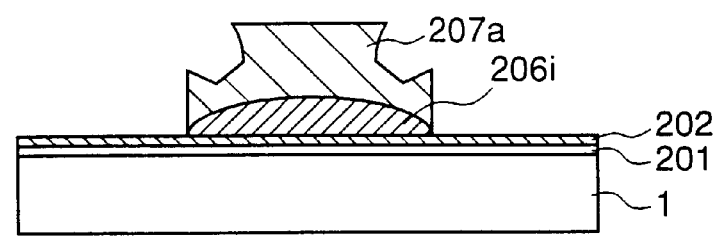
Figure 26:
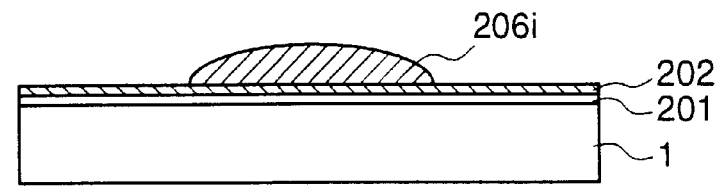
Figure 26:
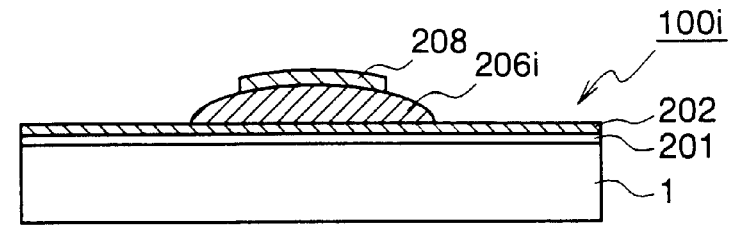
Figure 26:
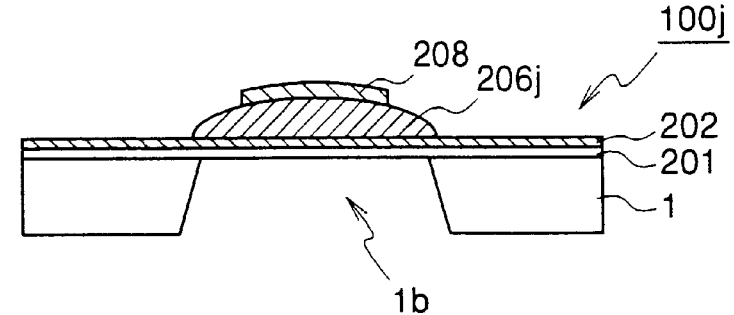
Figure 27:
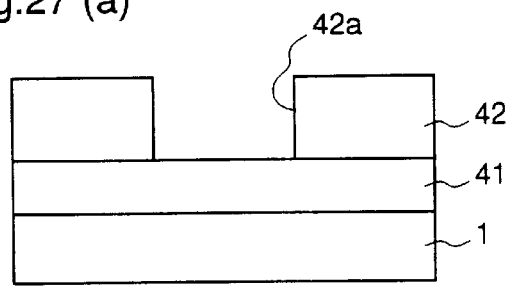
FIGS. 27(a)–27(d) illustrate formation steps of the channel region.
FIGS. 27(e)–27(f) partially illustrate formation steps of the refractory gate electrode for illustrating a SAGFET.
Figure 27:
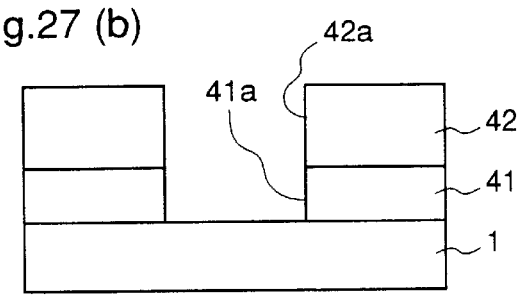
Figure 27:
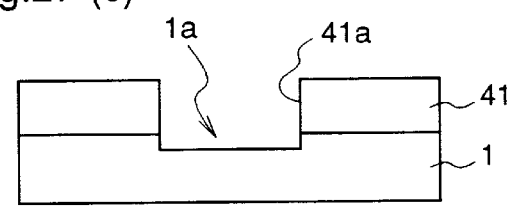
Figure 27:
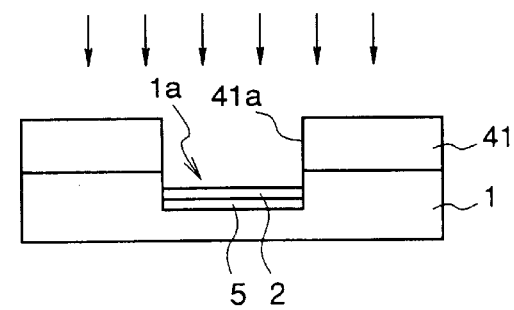
Figure 27:
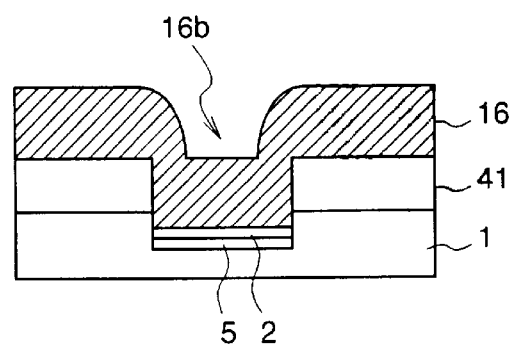
Figure 27:
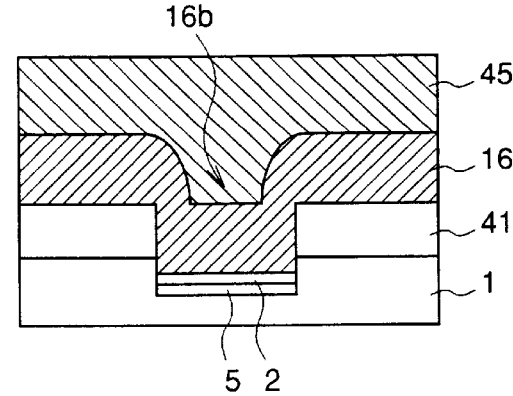
Figure 28:
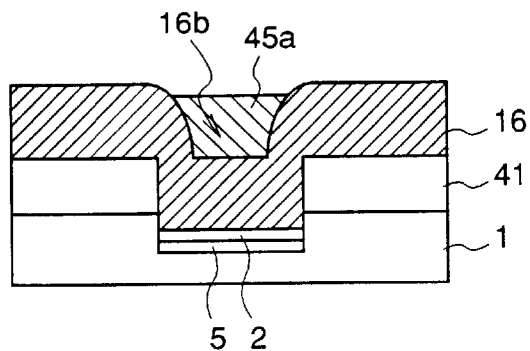
FIGS. 28(a) and 28(b) partially illustrate formation steps of the refractory gate electrode.
FIG. 28(c) illustrates formation steps of the n' source and drain diffusion regions, and FIGS. 28(d) and 28(e) partially illustrate formation steps of the $n^+$ source and drain diffusion regions for illustrating a SAGFET.
Figure 28:
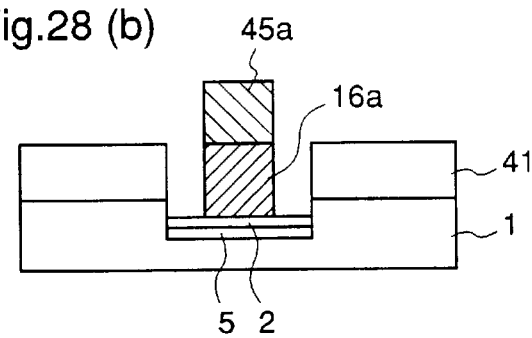
Figure 28:
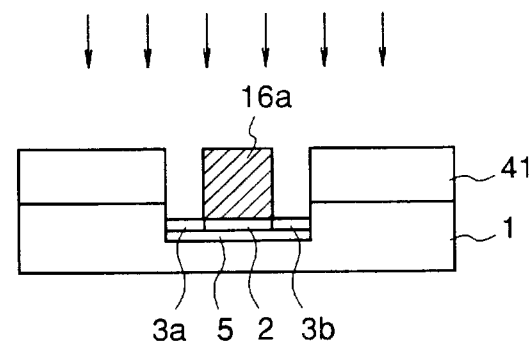
Figure 28:
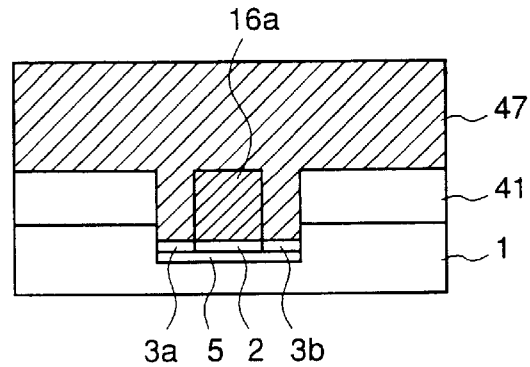
Figure 28:
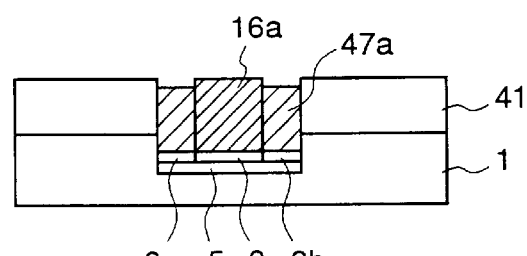
Figure 29:
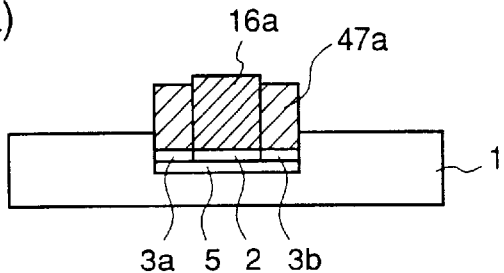
FIGS. 29(a) and 29(b) partially illustrate formation steps of the $n^+$ source and drain diffusion regions and FIGS. 29(c)–29(e) partially illustrate formation steps of source and drain electrodes for illustrating a SAGFET.
Figure 29:
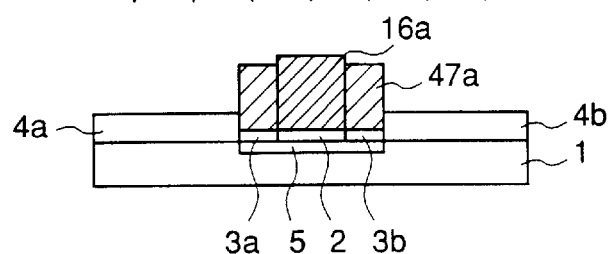
Figure 29:
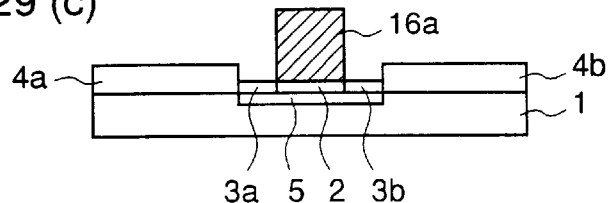
Figure 29:
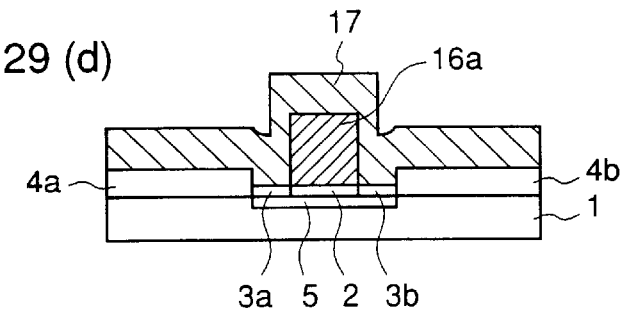
Figure 29:
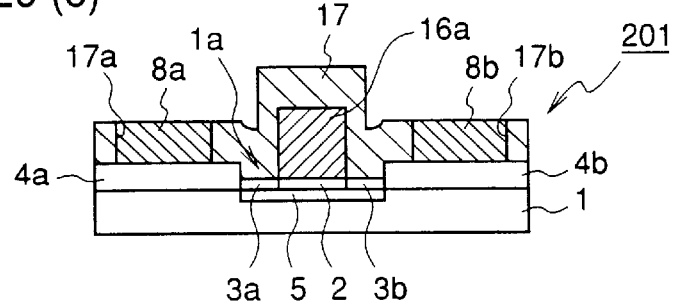
Figure 30:
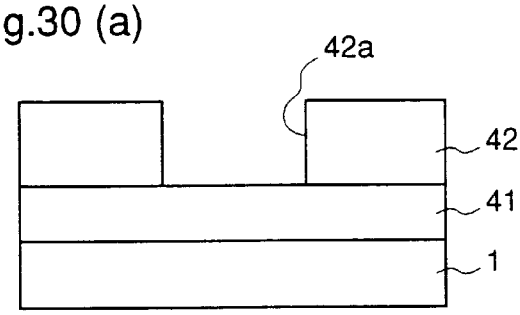
FIGS. 30(a)–30(e) partially illustrate formation of a dummy gate for an improved SAGFET.
Figure 30:
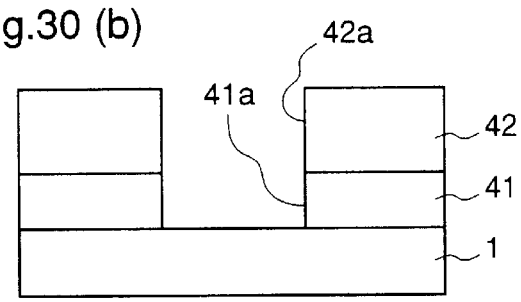
Figure 30:
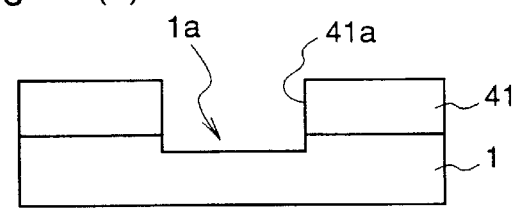
Figure 30:
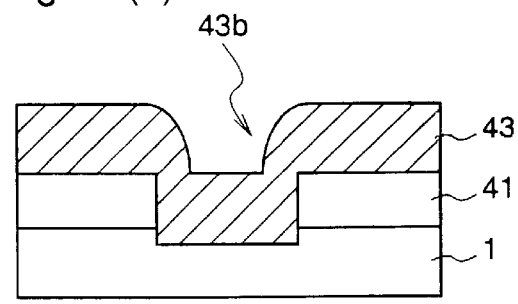
Figure 30:
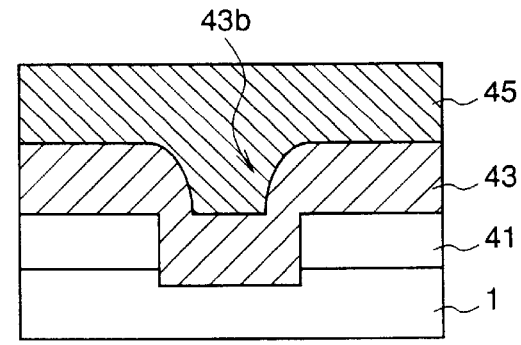
Figure 31:
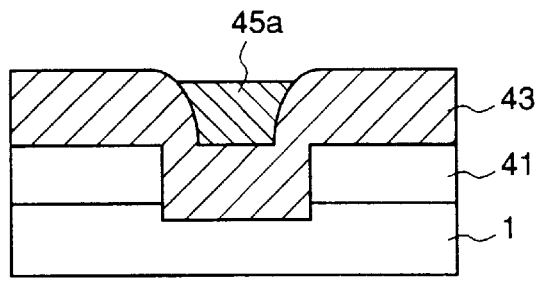
FIGS. 31(a) and 31(b) partially illustrate formation steps of the dummy gate electrode.
FIG. 31(c) illustrates a formation step of the n' source and drain diffusion regions and FIG. 31(d) partially illustrates a formation step of the channel region for illustrating the improved SAGFET.
Figure 31:
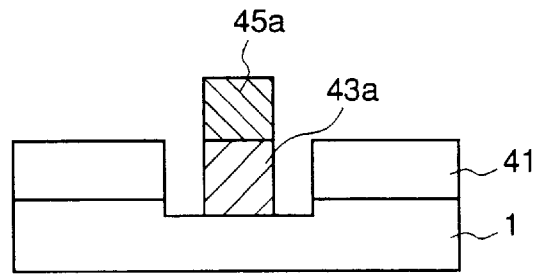
Figure 31:
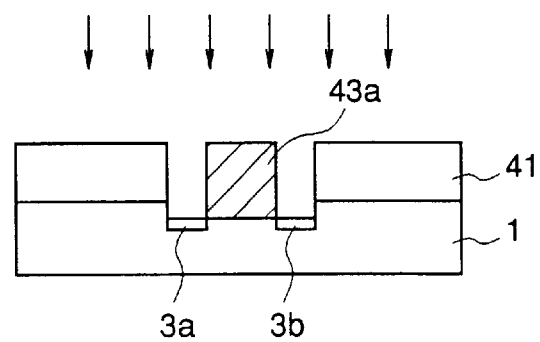
Figure 31:
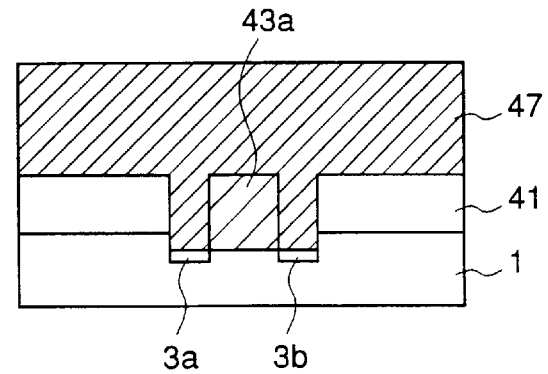
Figure 32:
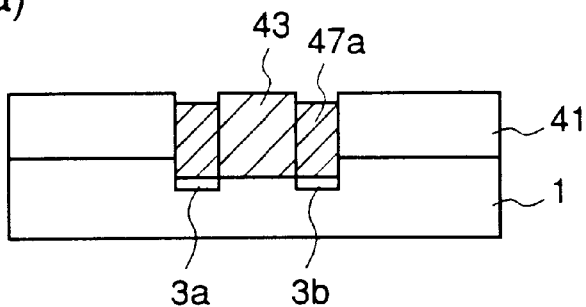
FIGS. 32(a)–32(c) partially illustrate formation steps of the channel region and FIG. 32(d) partially illustrates formation steps of the refractory metal gate electrode for illustrating the improved SAGFET.
Figure 32:
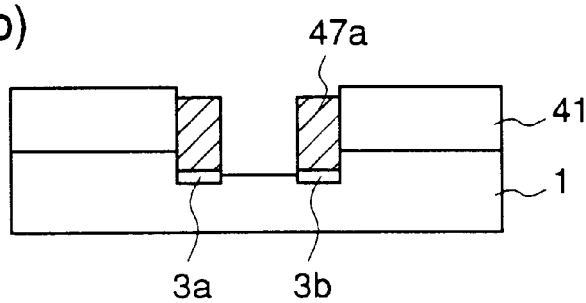
Figure 32:
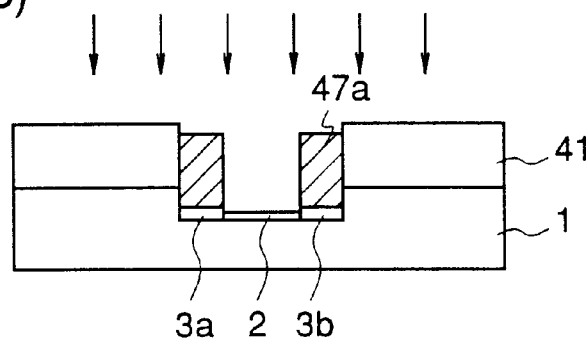
Figure 32:
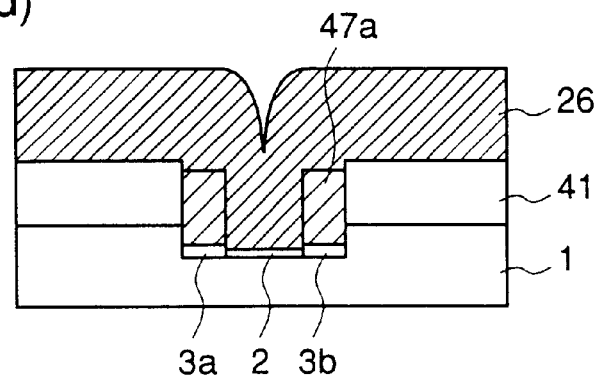
Figure 33:
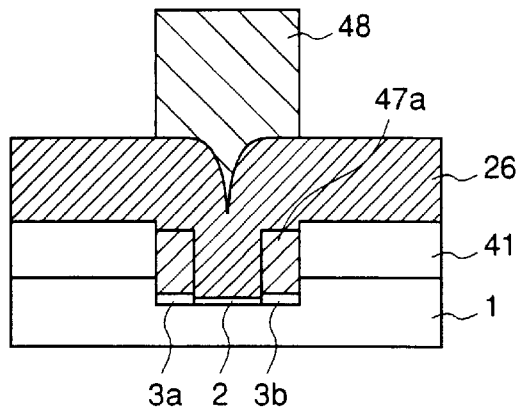
FIG. 33(a) partially illustrates formation steps of the channel region.
FIG. 33(b) illustrates a formation step of the n' source and drain diffusion regions and FIGS. 33(c) and 33(d) illustrate formation steps of the source and drain regions for illustrating the improved SAGFET in the prior art.
Figure 33:
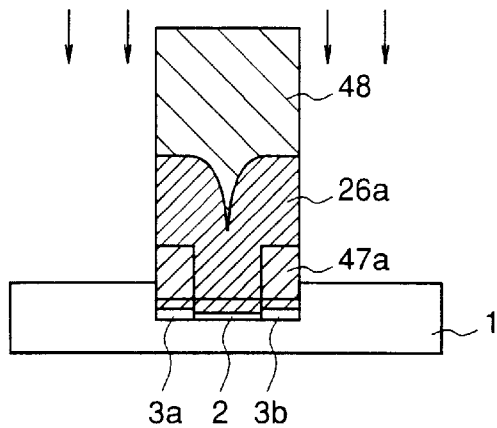
Figure 33:
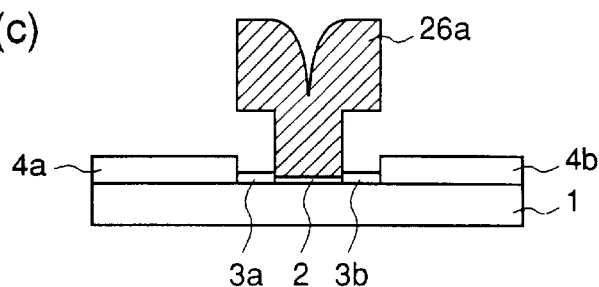
Figure 33:
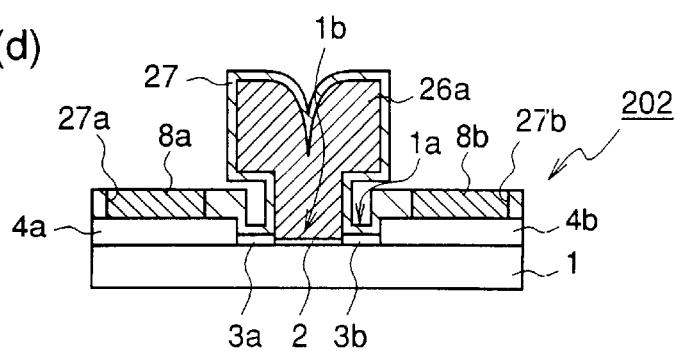

In the FIG. 26(e), reference character 100i designates the MIM capacitor mounted in the MMIC for amplifying power according to embodiment 9, which comprises a lower electrode 202 on a first insulating film 201 on a compound semiconductor substrate 1, a dielectric film 206i comprising a ferroelectric on the lower electrode 202 and an upper electrode 208 on the dielectric film 206i.

Figure 25:
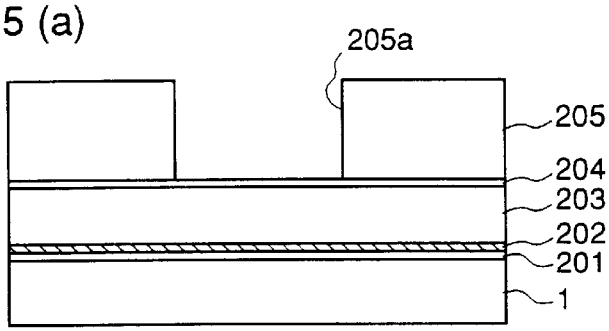
FIG. 25(a) illustrates a formation step of an lower electrode and a resist mask.
FIGS. 25(b) and 25(c) illustrate formation steps of a mask for patterning of a dielectric region.
FIG. 25(d) illustrates a deposition step of a ferroelectric material and FIG. 25(e) partially illustrates a formation step of a mask for a selective etching of the ferroelectric material for illustrating an MIM capacitor according to an embodiment 9 of the present invention.
Figure 25:
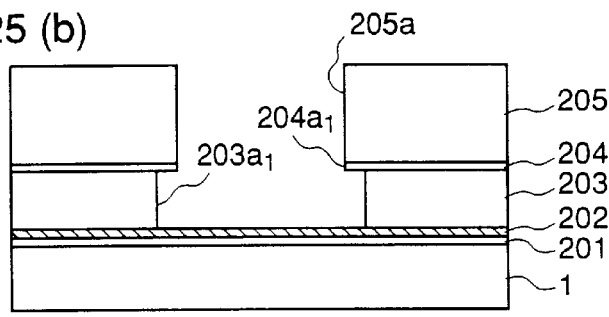
Figure 25:
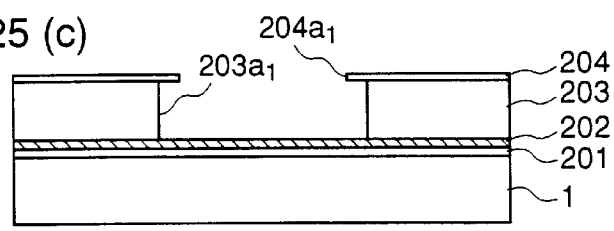
Figure 25:
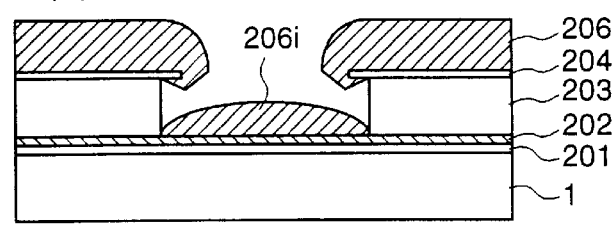
Figure 25:
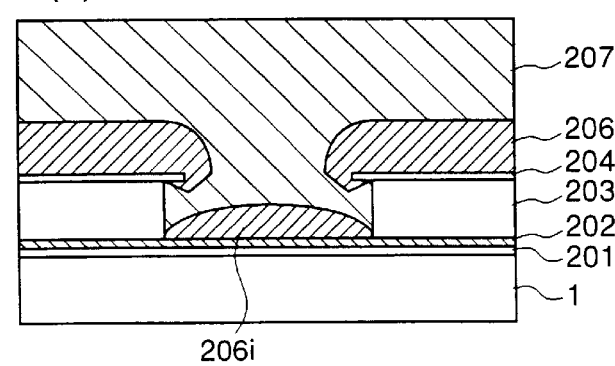

The dielectric film 206i has a smoothly arched-top surface and a peripheral edge. As illustrated in FIG. 25(a), after successively forming the first insulating film 201, the lower electrode 202, the second insulating film 203 and the third insulating film 204 on the compound semiconductor substrate 1, the resist 205 having a prescribed pattern opening 205a is formed. An SiO film as the first insulating film 201, an SiN film as the second insulating film 203 and an SiO film as the third insulating film 204 are employed.

The SiN film and the SiO film are employed as described above, because after formation of the openings in these insulating films, these insulating films are selectively etched to etch away an opening edge of the second insulating film 203 from an opening edge of the insulating film 204.

As illustrated in FIG. 25(b), using the resist 205 as a mask, the second and third insulating films 203 and 204 are etched by ECR etching using CHF$_3$+O$_2$. At this time, a side surface of the opening is vertically etched with respect to the substrate surface. In the ECR etching, the etching gas is switched to $SF_6$ when the lower electrode 202 is exposed, followed by side-etching of only the second insulating film 203 comprising the SiN film.

For example, when the SiO film as the third insulating film 204 is 1000 Å and the SiN film as the second insulating film 203 is 5000 Å, the opening edge 203a1 of the second insulating film 203 is etched 0.3 μm from the opening edge 204a1 of the third insulating film 204. As the lower electrode 202, a thin film such as Pt which is not etched by ECR etching is employed. Sputter deposition is employed for formation of the Pt metal thin film which is crystallized at about 600–700° C. Crystallization is very important to the formation of a ferroelectric film in a subsequent process step.

After removal of the resist 205 (FIG. 25(c)), as illustrated in FIG. 25(d), a ferroelectric material 206 is deposited in such a manner that a discontinuity thereof occurs in the openings 203a, 204a. As the ferroelectric material, $SrTiO_3$, $BaSrTiO_3$ or the like is employed to obtain a dielectric film 206i having a dielectric constant of about 100. The dielectric film 206i having such a high dielectric constant is formed using sputter deposition. At this time, the ferroelectric material is grown on the Pt film as the lower electrode 202 with a crystalline orientation.

After depositing the resist 207 over the entire surface of the wafer (FIG. 25(e)), the entire surface of the resist 207 is etched back to leave a portion 207a in the opening 203a, thereby filling the opening 203a with the resist 207a. The dielectric region 206i of the MIM capacitor under the resist 207a is fully covered with the resist 207a. Thereafter, the ferroelectric region 206 on the insulating film 204 is etched using a hydrofluoric acid based etching solution (FIG. 26(b)). The third insulating film (SiO film) 204 and the second insulating film (SiN film) 203 are removed by etching using hydrofluoric acid or by ECR etching using $CHF_3+O_2$ to leave only the dielectric film 206i on the lower electrode 202 and the resist 207a thereon.

As illustrated in FIG. 26(d), the resist 207a is removed and finally an upper electrode 208 is formed on the dielectric film 206i by evaporation and lift-off technique, whereby the MIM capacitor 100i is completed (FIG. 26(e)).

Thus, in embodiment 9, the dielectric film 206i on the lower electrode 202 has a shape with an edge portion smoothly thinned. Therefore, if the dielectric film 206i is made of a material having a large stress between the lower electrode 202 and the same, a small stress is applied to the lower electrode and the film hardly peels, since the film which tends to peel is thin in its peripheral portion, thereby fabricating the MIM capacitor with stability and large capacity.

The dielectric film 206i is patterned by the discontinuity in the mask opening, so that dry etching using a highly-corrosive gas or wet etching with poor precision is not required in the patterning and the dielectric region 206i is formed with ease and with high precision.

[Embodiment 10]

FIG. 26(f) illustrates a film bulk acoustic wave resonator (FBAR) mounted in an MMIC for amplifying power as a semiconductor device according to an embodiment 10.

In the figure, reference character 100j designates the film bulk acoustic wave resonator. In the FBAR 100j, the dielectric film 206i made of a ferroelectric material in the MIM capacitor 100i according to the embodiment 9 is replaced by a piezoelectric film 206j made of a piezoelectric material such as $PbTiO_3$ or $BaTiO_3$. The substrate 1 has a structure in which a lower portion of the piezoelectric film 206j is removed to form a hole 1c. In other respects, the FBAR 100j has the same structure as the MIM capacitor 100i according to embodiment 9.

The principle and the method of forming the piezoelectric film 206j are the same as the dielectric film 206i made of $SrTiO_3$ or $BaSrTiO_3$. As illustrated in FIG. 26(f), in the film bulk acoustic wave resonator, since a laminated portion comprising the lower electrode 202, the piezoelectric film 206j and the upper electrode 208 is required to float, a portion immediately under the laminated portion is removed to form the hole 1c in the substrate 1. In this case, etching from a rear surface of the substrate or side etching is employed.

As in the MIM capacitor 100i of embodiment 9, in embodiment 10, the piezoelectric film 206j on the lower electrode 202 has a shape with an edge portion smoothly thinned. Therefore, when the piezoelectric film 206j is formed using a material having a large stress between the lower electrode 202 and the same, a small stress is applied to the lower electrode and the film hardly peels, since the film which tends to peel is thin in its peripheral portion, thereby fabricating the film bulk acoustic wave resonator with stability and with improved yield.

The piezoelectric film 206j is patterned by the discontinuity in the mask opening, so that wet etching with poor precision or dry etching using a highly-corrosive gas is not required and the piezoelectric film 206j is fabricated with ease and with high precision.

What is claimed is:

1. A semiconductor device comprising:
   a semiconductor substrate having a surface and a recess at the surface, the recess having a bottom surface and side walls transverse to the bottom surface, the semiconductor substrate further comprising a channel region at the bottom surface of the recess, and source and drain regions located at opposite sides of the recess and in the semiconductor substrate; and
   a refractory metal material gate electrode having a varying thickness including a first thickness at a central location between the side walls of the recess, the thickness gradually decreasing from the first thickness toward the side walls, the gate electrode covering and contacting the bottom surface and the side walls of the recess.

2. A semiconductor device comprising:
   a semiconductor substrate;
   a channel layer in the semiconductor substrate;
   an electron supply layer on the channel layer in the semiconductor substrate;
   a gate electrode on the electron supply layer;
   a contact layer located in each of two regions, the regions being located at opposite sides of and spaced from the gate electrode, on the electron supply layer;
   an insulating film on the contact layer in each of the two regions and having first and second openings located on opposite sides of the gate electrode, exposing the contact layer, and a third opening exposing the gate electrode; and
   refractory metal material source and drain ohmic electrodes respectively disposed on the contact layer in the first and second openings of the insulating film, the source and drain electrodes having respective varying thicknesses including respective first thicknesses centrally located in the first and second openings, the respective thicknesses of the source and drain electrodes decreasing with distance from the respective first thicknesses.

3. The semiconductor device of claim 2, wherein the gate electrode and the source and drain electrodes have different compositions and comprise refractory metal materials.

4. The semiconductor device of claim 2 wherein the gate electrode, and the source and drain electrodes are the same refractory metal material.

5. The semiconductor device of claim 4 wherein the gate electrode is separated from the source electrode by a distance different from a separation of the gate electrode from the drain electrode.

* * * * *

UNITED STATES PATENT AND TRADEMARK OFFICE
CERTIFICATE OF CORRRECTION

PATENT NO. : 6,013,926
DATED : January 11, 2000
INVENTOR(S) : Tomoki Oku, et al.

It is certified that error appears in the above-identified patent and that said Letters Patent is hereby corrected as shown below:

Title page, item [56] should read as following:
FOREIGN PATENT OR PUBLISHED FOREIGN PATENT APPLICATION

|   |   | DOCUMENT NUMBER |   |   |   |   |   | PUBLICATION DATE | COUNTRY OR PATENT OFFICE | CLASS | SUBCLASS | Name |
|---|---|---|---|---|---|---|---|---|---|---|---|---|
|   | 2 | 1 | 8 | 7 | 0 | 3 | 8 A | 7/23/90 | Japan | 257 | 280 | Chichibu et al. |
|   | 6 | 2 | 0 | 4 | 2 | 5 | 4 A | 7/22/94 | Japan | 257 | 280 | Fujii |
|   | 8 | 1 | 4 | 8 | 4 | 4 | 4 A | 6/7/96 | Japan | 257 | 280 | Terada et al. |

Signed and Sealed this

Twenty-seventh Day of June, 2000

*Attest:*

Q. TODD DICKINSON

*Attesting Officer*          *Director of Patents and Trademarks*